United States Patent
Seshita

(10) Patent No.: US 9,685,944 B1
(45) Date of Patent: Jun. 20, 2017

(54) SEMICONDUCTOR INTEGRATED CIRCUIT AND HIGH FREQUENCY ANTENNA SWITCH

(71) Applicant: KABUSHIKI KAISHA TOSHIBA, Tokyo (JP)

(72) Inventor: Toshiki Seshita, Kawasaki Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/233,709

(22) Filed: Aug. 10, 2016

(30) Foreign Application Priority Data

Dec. 18, 2015 (JP) ................. 2015-247844

(51) Int. Cl.
| | |
|---|---|
| H03K 3/00 | (2006.01) |
| H03K 17/22 | (2006.01) |
| H03K 19/21 | (2006.01) |
| H03K 19/00 | (2006.01) |

(52) U.S. Cl.
CPC ....... *H03K 17/223* (2013.01); *H03K 19/0002* (2013.01); *H03K 19/21* (2013.01)

(58) Field of Classification Search
None
See application file for complete search history.

(56) References Cited

U.S. PATENT DOCUMENTS

| | | | | |
|---|---|---|---|---|
| 5,969,555 A | | 10/1999 | Suda | |
| 7,190,188 B2* | | 3/2007 | Otsuka | H04L 25/08 326/30 |
| 7,656,201 B2* | | 2/2010 | Kanzaki | H03K 17/04206 327/108 |
| 7,679,396 B1* | | 3/2010 | Kao | H03K 19/018578 326/27 |
| 7,936,225 B2* | | 5/2011 | Osada | H03K 5/133 331/175 |
| 8,040,143 B2* | | 10/2011 | Nascimento | G01D 5/24 324/658 |
| 8,041,294 B2* | | 10/2011 | Rofougaran | H03B 21/01 327/101 |
| 8,975,956 B2* | | 3/2015 | Sugawara | H03F 3/217 330/10 |

(Continued)

FOREIGN PATENT DOCUMENTS

| | | |
|---|---|---|
| JP | H10303709 A | 11/1998 |
| JP | 2012178629 A | 9/2012 |

*Primary Examiner* — Lincoln Donovan
*Assistant Examiner* — Khareem E Almo
(74) *Attorney, Agent, or Firm* — Patterson & Sheridan, LLP

(57) ABSTRACT

An integrated circuit includes a drive circuit with a first inverter circuit with a first transistor of a first conductivity type and a second transistor of a second conductivity type. The drains of the first and second transistors are connected. An output circuit is provided having a third transistor of the second conductivity with a gate connected to the drains of the first and second transistors. A capacitor is connected between the gate and a drain of the third transistor and has a capacitance greater than 0.5 pF and less than or equal to 3.0 pF. A gate width of the first transistor when divided by a gate width of the third transistor has a value of less than 1/100. The output circuit is configured to output a transmission signal from the drain of the third transistor.

20 Claims, 38 Drawing Sheets

(56) References Cited

U.S. PATENT DOCUMENTS

| | | | | |
|---|---|---|---|---|
| 9,024,700 B2* | 5/2015 | Ranta | ............ | H03M 1/1061 |
| | | | | 327/554 |
| 9,401,799 B2* | 7/2016 | Giovannone | ...... | H03K 5/135 |
| 2007/0285154 A1* | 12/2007 | Darabi | ............ | H03B 21/01 |
| | | | | 327/551 |
| 2014/0340137 A1* | 11/2014 | Keane | ......... | H03K 17/6872 |
| | | | | 327/434 |
| 2015/0061410 A1* | 3/2015 | Tamura | ......... | H03K 19/0019 |
| | | | | 307/126 |

* cited by examiner

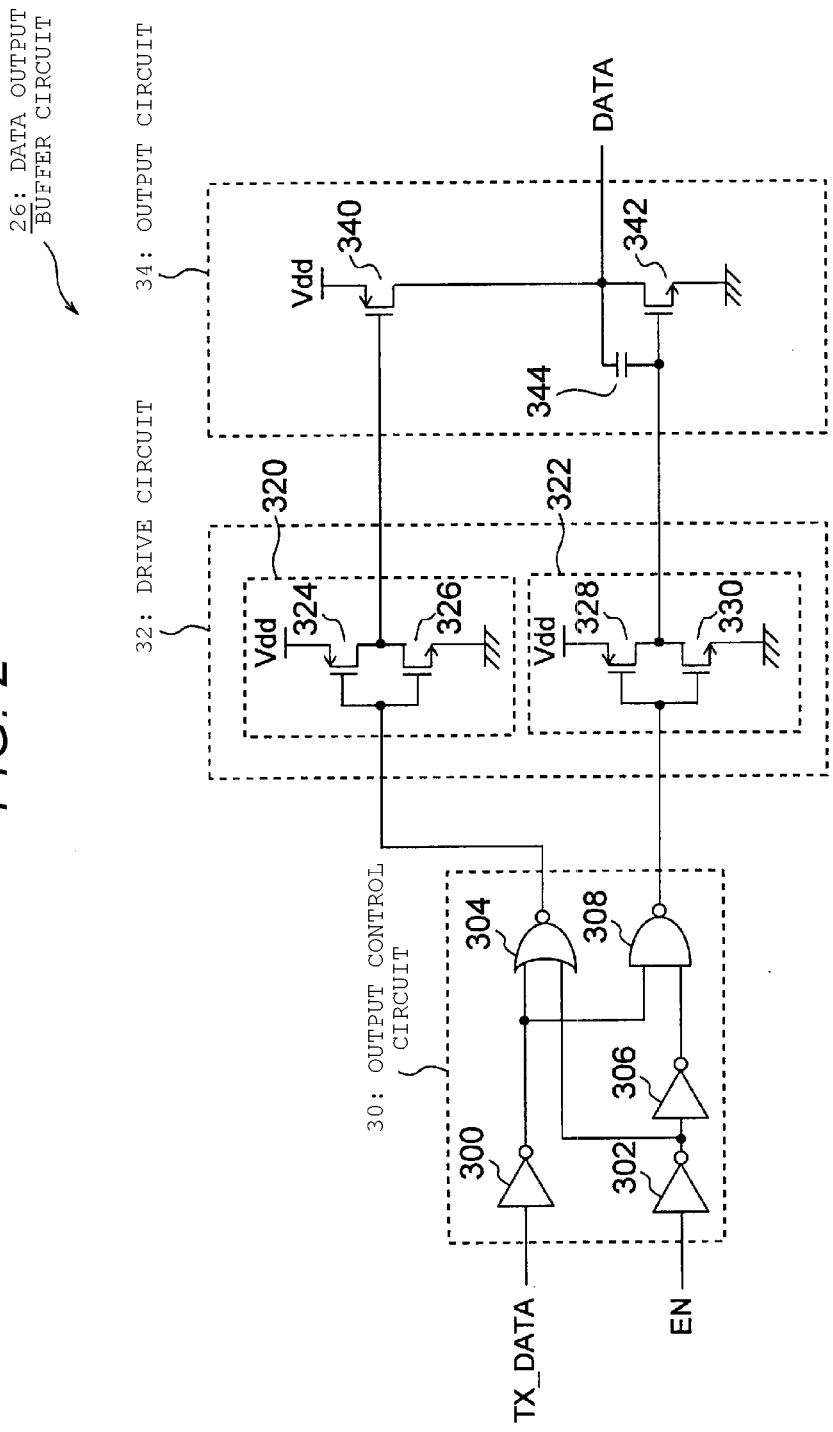

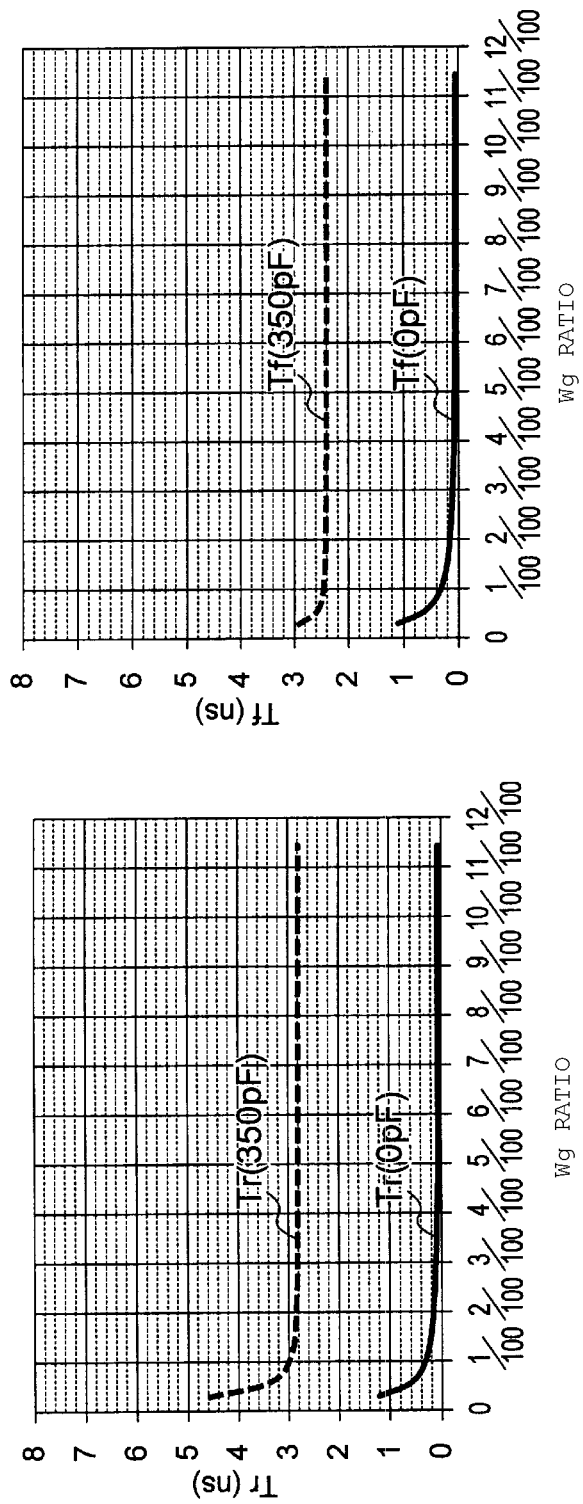

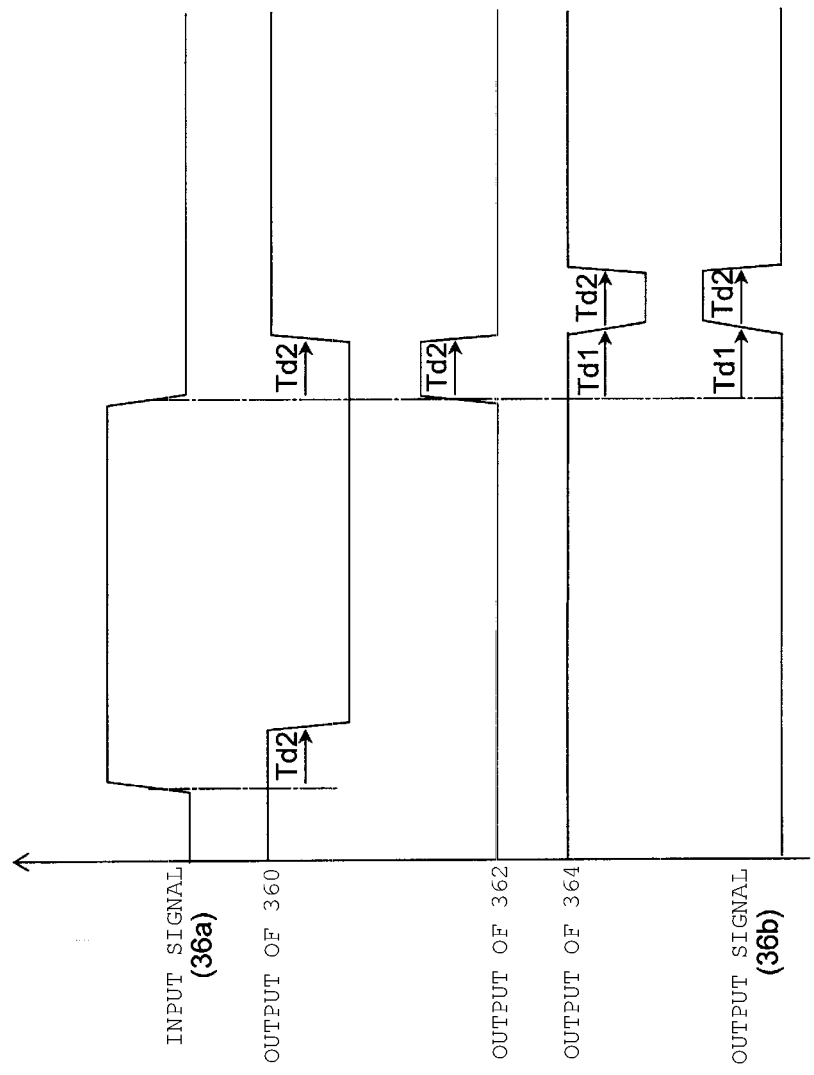

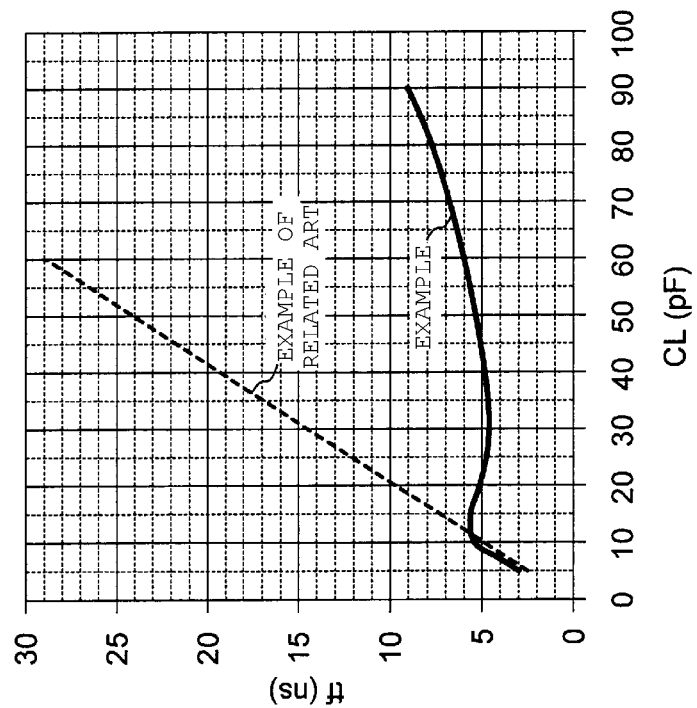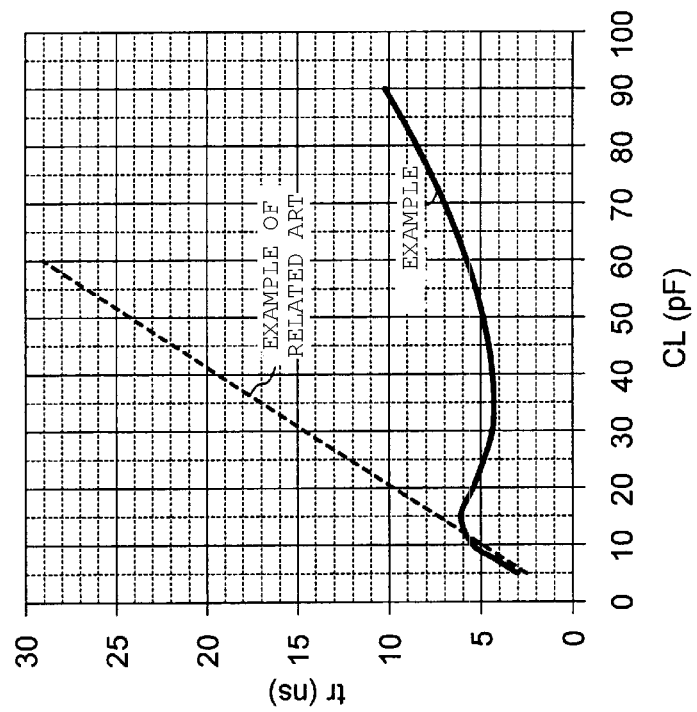

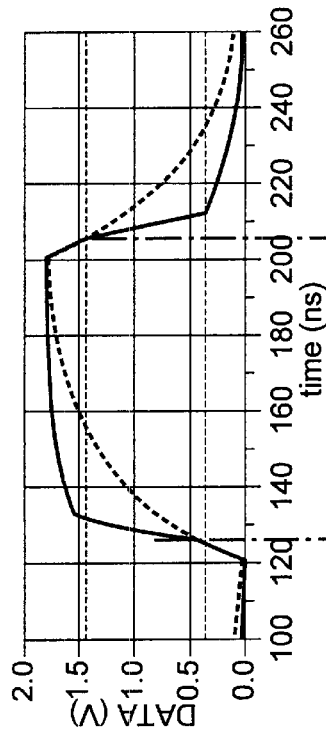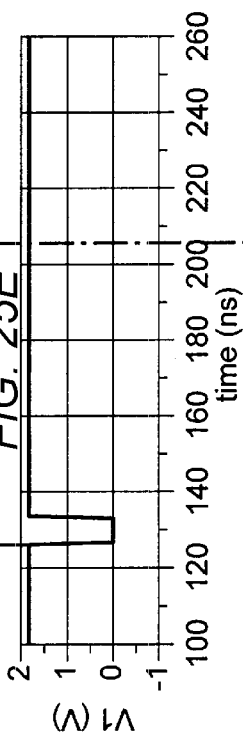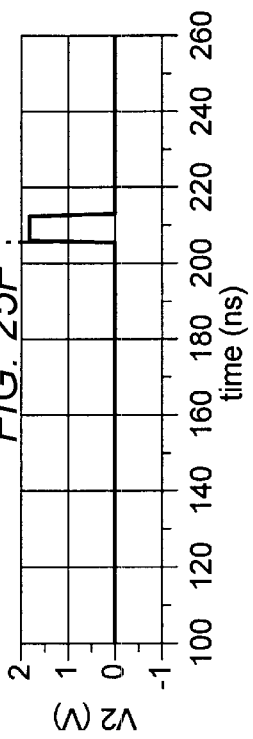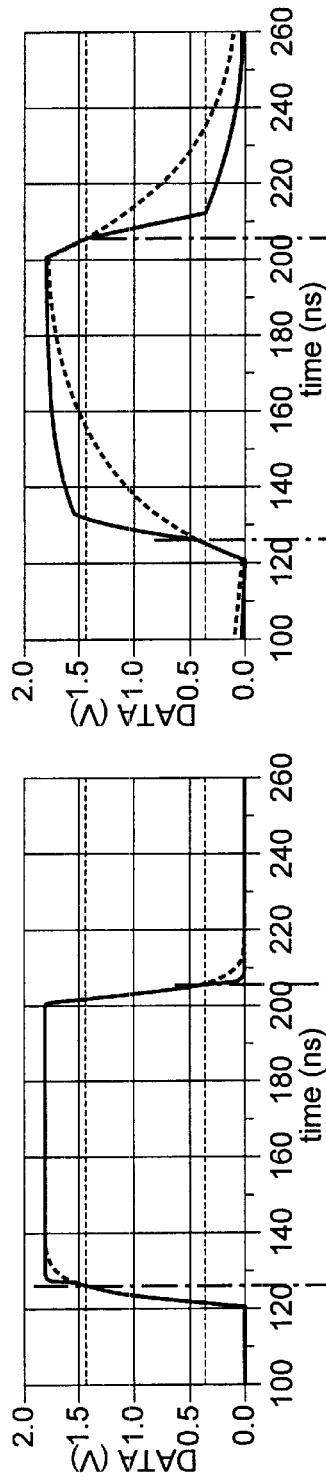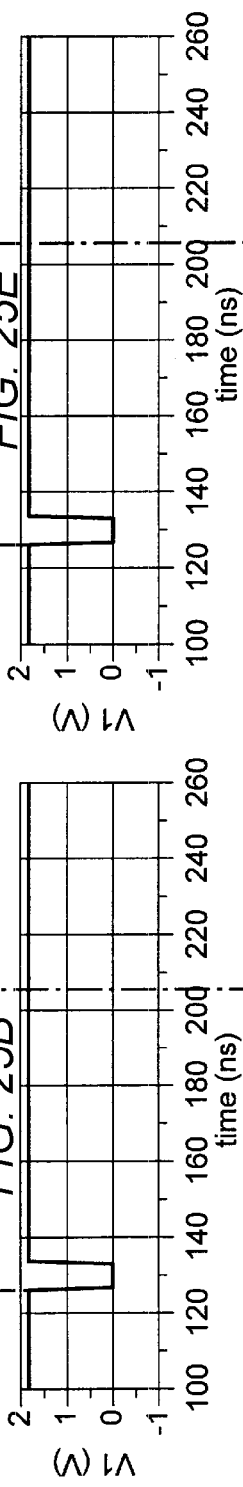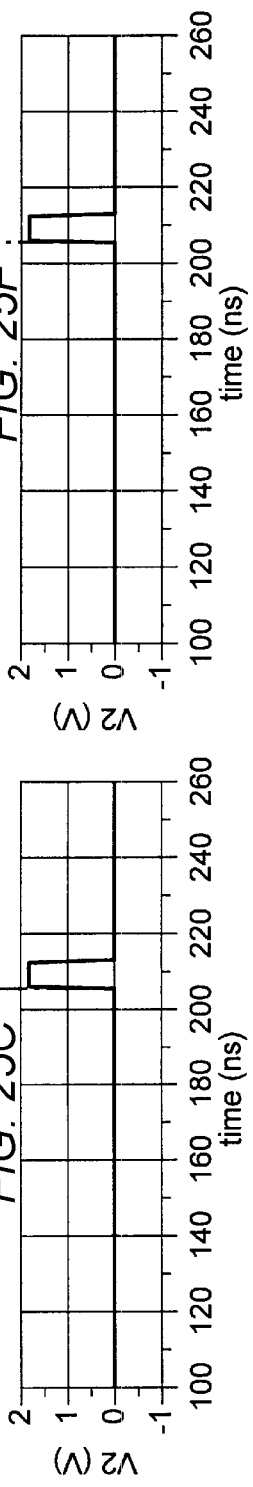

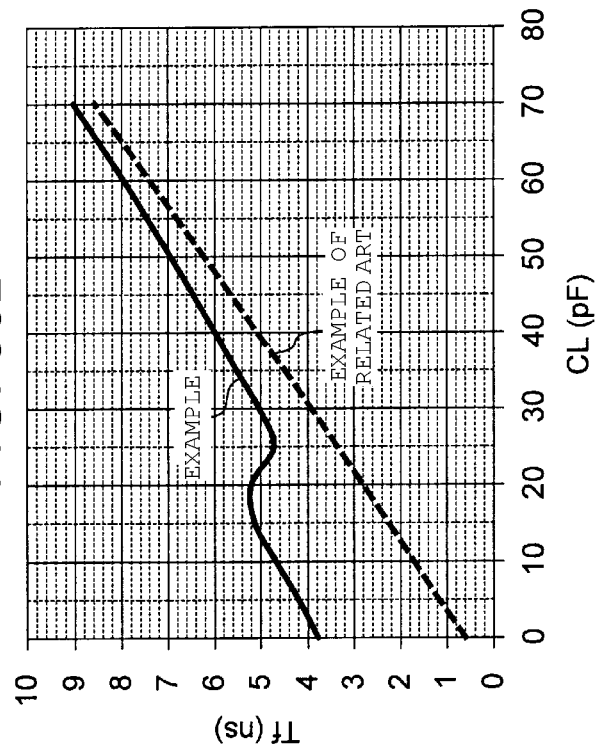
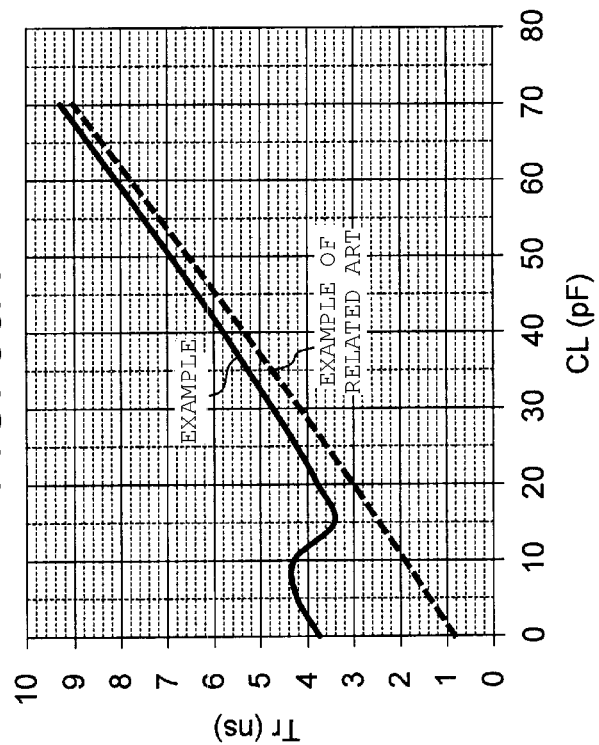
FIG. 35A
FIG. 35B

SEMICONDUCTOR INTEGRATED CIRCUIT AND HIGH FREQUENCY ANTENNA SWITCH

CROSS-REFERENCE TO RELATED APPLICATION

This application is based upon and claims the benefit of priority from Japanese Patent Application No. 2015-247844, filed Dec. 18, 2015, the entire contents of which are incorporated herein by reference.

FIELD

Embodiments described herein relate generally to a semiconductor integrated circuit and a high frequency antenna switch.

BACKGROUND

A transmitter circuit and a receiver circuit in a high frequency circuit unit of a mobile phone are alternatively connected to a common antenna through a high frequency switch circuit. In the related art, a high electron mobility transistor (HEMT) is used as a switch element in such a high frequency switch circuit. The HEMT is made using a compound semiconductor material. In recent years, the HEMT-type devices have been replaced by a metal oxide semiconductor field-effect transistor (MOSFET) formed on a silicon substrate to reduce cost and size of the high frequency switch circuit. However, for a MOSFET formed on a typical silicon substrate there is a large parasitic capacitance between the substrate and a source/drain electrode, thereby causing the problem of significant loss of power of the high frequency signal.

Increasingly, mobile phones are being equipped to operate in multiple modes and multiple bands, and as a consequence, the number of ports required for a high frequency switch circuit has increased. An increase in the number of ports necessitates increasing the number of data bits in the signal that is required for controlling the connection state (i.e., which ports are connected to the antenna) of the high frequency switch circuit. In the case of a parallel input method in which the control signal is input as a parallel signal, the number of input terminals required is increased in consequence of the increase in the number of ports. In a serial input method, a serial signal is input in synchronization with a clock signal which allows only one data input terminal to be used even if the number of ports is increased. Thus, while the high frequency switch circuit of the related art mainly uses the parallel input method, there is an increasing usage of the serial input method in recent years.

A semiconductor integrated circuit that outputs a data signal in synchronization with the clock signal for use in the serial input method includes an output interface circuit that operates in response to operation of the semiconductor integrated circuit. In general, many other semiconductor integrated circuits are connected to a data bus that is connected to a data terminal used for input and output of data. As such, since many semiconductor integrated circuits are connected to the data bus, the load capacitances of these circuits are required to be taken into account when data is input or output as described above.

In addition, since the data is output in synchronization with the clock signal, a rise time and a fall time of the data signal and delays in the rise time and the fall time are required to be taken into account. The values of the rise time and the fall time are significantly changed by a load capacitance CL and output resistance. For example, the rise time and the fall time are increased if the load capacitance CL is increased. In this case, decreasing the output resistance allows the lengths of the rise time and the fall time to be decreased.

However, if the output resistance is decreased, the rise time and the fall time may be too short in a case where the load capacitance is decreased. If the rise time and the fall time become too short, a problem arises in that high frequency noise components are generated.

Therefore, since the rise time and the fall time are significantly changed depending on the load capacitance in a simple method of decreasing only the output resistance as above described, the ranges of the rise time and the fall time may not be set within a predetermined range for external circuits that have various load capacitances.

DESCRIPTION OF THE DRAWINGS

FIG. 2 is a circuit diagram of a semiconductor integrated circuit according to a first embodiment.

FIGS. 3A and 3B are graphs illustrating a rise time and the like when there is no feedback capacitance in the first embodiment.

FIG. 10 is a timing chart illustrating an output state of each constituent of the additional circuit of the semiconductor integrated circuit according to the modification example of the first embodiment.

FIGS. 17A and 17B are graphs illustrating a relationship between a rise time and the like of an output signal and a load capacitance in the second embodiment.

FIGS. 25A to 25F are graphs illustrating a waveform of an output signal and the like in the third embodiment.

FIGS. 35A and 35B are graphs illustrating a relationship between a rise time and the like of an output signal and a load capacitance in the fifth embodiment.

DETAILED DESCRIPTION

In general, according to one embodiment, an integrated circuit includes a drive circuit with a first inverter circuit having a first MOSFET (metal-oxide-semiconductor field effect transistor) of a first conductivity type and a second MOSFET of a second conductivity type. Drains of the first and second MOSFETS are connected to each other. An output circuit includes a third MOSFET of the second conductivity type that has a gate connected to the drains of the first and second MOSFETs and a capacitor connected between the gate of the third MOSFET and a drain of the third MOSFET. The capacitor has a capacitance greater than 0.5 pF (picofarads) and less than or equal to 3.0 pF. A gate width of the first MOSFET when divided by a gate width of the third MOSFET is less than 1/100. The output circuit is configured to output a transmission signal from the drain of the third MOSFET.

Hereinafter, example embodiments will be described with reference to the drawings. The embodiments are examples provided for purposes of explanation and the present disclosure is not limited to the specific examples provided.

First Embodiment

An output buffer circuit that corresponds to a semiconductor integrated circuit according to a first embodiment sets a rise time and a fall time to a constant time for a wide range of load capacitances (from 0 pF to a few hundred pF) of a bidirectional data terminal by setting the gate width ratios of a drive circuit and an output circuit to values less than some predetermined value. Hereinafter, details of the output buffer circuit will be described.

Figure 1:
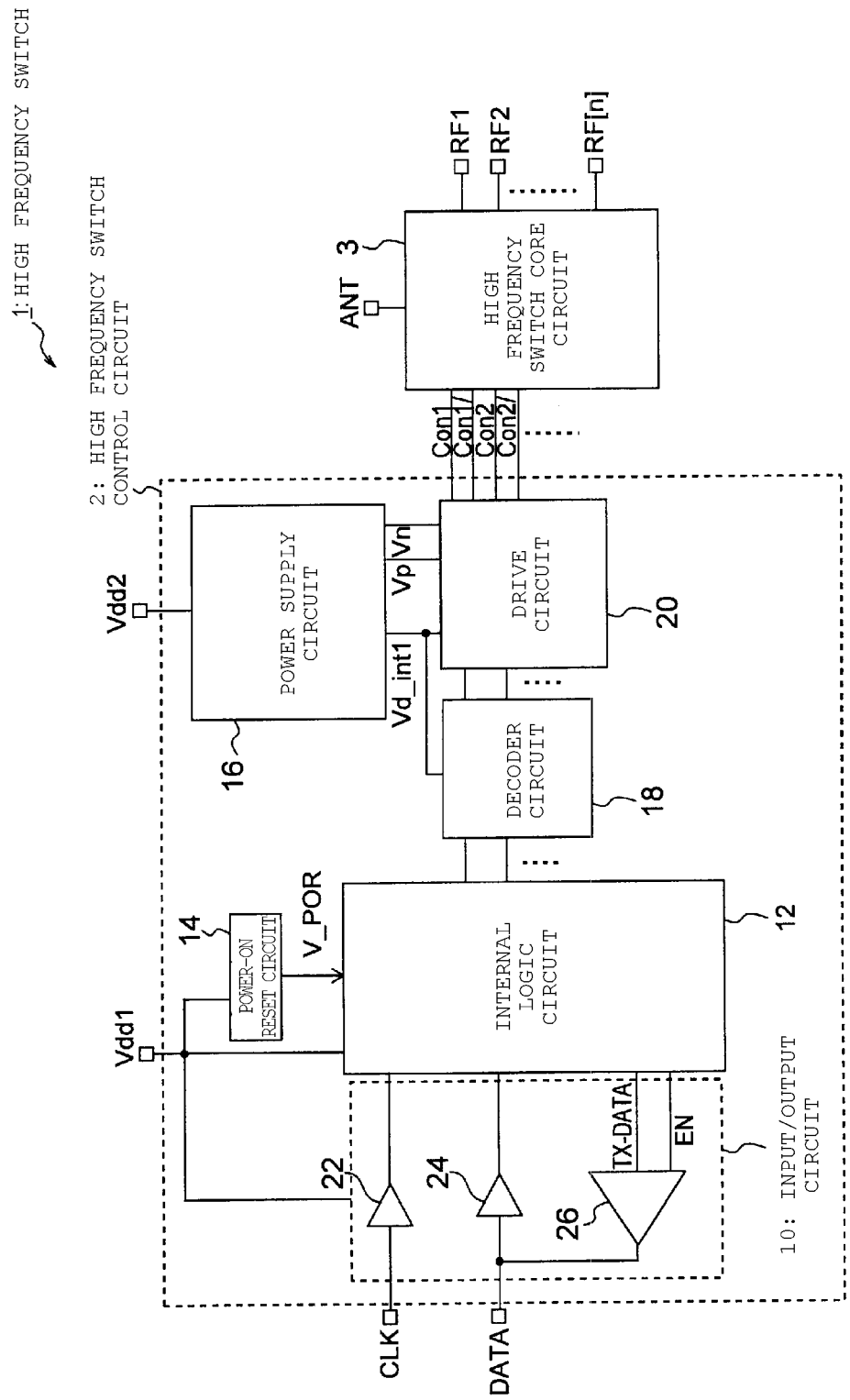
FIG. 1 is a schematic diagram of a high frequency switch circuit in which a semiconductor integrated circuit according to an embodiment is used.

FIG. 1 is a diagram illustrating an example of a high frequency switch in which a semiconductor integrated circuit according to the present embodiment is used. As illustrated in FIG. 1, a high frequency switch 1 includes a high frequency switch control circuit 2 and a high frequency switch core circuit 3. In FIG. 1, the high frequency switch control circuit 2 has a configuration in which a serial data signal DATA is communicated in a bidirectional manner. The high frequency switch control circuit 2 converts the externally supplied serial data signal DATA into a parallel signal and supplies a switching control signal Con to the high frequency switch core circuit 3. The high frequency switch control circuit 2 includes an input/output circuit 10, an internal logic circuit 12, a power-on reset circuit 14, a power supply circuit 16, a decoder circuit 18, and a drive circuit 20.

The high frequency switch core circuit 3 performs switching on the basis of the switching control signal Con supplied from the high frequency switch control circuit 2 and outputs a signal that is input from an antenna terminal ANT to high frequency terminals RF1, RF2, ... RF[n] or outputs signals that are input from RF1, RF2, ... RF[n] to the antenna terminal ANT. The high frequency switch core circuit 3 is configured with a switch circuit that includes, for example, a so-called single pole dual throw (SPDT) switch or a single pole n throw (SPnT; where n is an integer greater than or equal to three) switch. Since the present embodiment is related to the constituents of the high frequency switch control circuit 2, the interior of the high frequency switch core circuit 3 will not be described.

Next, the high frequency switch control circuit 2 will be described. The high frequency switch control circuit 2 provides the switching control signal Con to the high frequency switch core circuit 3 on the basis of a clock signal CLK, the serial data signal DATA, and power supplies Vdd1 and Vdd2 which are each externally supplied.

The input/output circuit 10 outputs the externally supplied clock signal CLK and the serial data signal DATA to the internal logic circuit 12. The input/output circuit 10 also outputs data that is stored in the internal logic circuit 12 to an external unit in response to an external request. The input/output circuit 10 includes a clock input buffer circuit 22, a data input buffer circuit 24, and a data output buffer circuit 26. The clock input buffer circuit 22 provides the clock signal CLK to the internal logic circuit 12. Similarly, the data input buffer circuit 24 provides the externally input serial data signal DATA to the internal logic circuit 12. The clock input buffer circuit 22 and the data input buffer circuit 24 are configured with, for example, Schmitt triggers. The data output buffer circuit 26 is configured with, for example, a tristate buffer and uses bidirectional communication to output to an external unit a transmission serial data signal TX_DATA that is output from the internal logic circuit 12.

The internal logic circuit 12 converts the input serial data signal DATA into a parallel data signal in synchronization with the clock signal CLK and stores the serial data signal DATA in a register that is incorporated into the internal logic circuit 12. The internal logic circuit 12 outputs an enable signal EN and the serial data signal DATA stored in the register to an external unit in response to an external request. The power-on reset circuit 14 sets an initial value of the register incorporated into the internal logic circuit 12.

The power supply circuit 16 supplies internal power-supply potentials Vd_int1, Vp, and Vn that are required for the decoder circuit 18 and the drive circuit 20. The power-supply potential Vd_int1 is an output potential of a high voltage regulator and is, for example, a potential of 1.8 V. The power-supply potential Vp is a voltage that is generated by a charge pump generating a positive potential, and the power-supply potential Vn is a potential that is generated by a charge pump generating a negative potential. For example, the power-supply potential Vp is equal to 3 V, and the power-supply potential Vn is equal to −3 V.

The decoder circuit 18 outputs the parallel data signal output from the internal logic circuit 12 to the drive circuit 20. The drive circuit 20 converts the output of the decoder circuit 18 from a single-phase signal into a differential signal, further converts the level of the converted differential signal, and supplies converted levels as switching control signals Cont, Con1/, Con2, Con2/, etc. the high frequency switch core circuit 3.

Next, operation of the high frequency switch 1 will be described with a main focus on operation of the high frequency switch control circuit 2. At first, an external power supply is turned ON and subsequently supplies the power-supply potentials Vdd1 and Vdd2 to the high frequency switch control circuit 2. The power-on reset circuit 14 supplies a power-on reset potential V_POR to the internal logic circuit 12 after a predetermined time elapses from the initial rise of the internal logic circuit 12 due to the supplying of power-supply potential Vdd1, thereby initializing the state of the internal logic circuit 12.

The serial data signal DATA is input into the data input buffer circuit 24 of the high frequency switch control circuit 2 after the internal logic circuit 12 has been initialized. The data input buffer circuit 24 outputs the inputted serial data signal DATA to the internal logic circuit 12. Similarly, the clock input buffer circuit 22 outputs the inputted clock signal CLK to the internal logic circuit 12. The internal logic circuit 12 converts the serial data signal output from the data input buffer circuit 24 into a parallel data signal in synchronization with the clock signal output from the clock input buffer circuit 22 and outputs the parallel data signal to the decoder circuit 18. At this point, the internal logic circuit 12 stores the input serial data signal DATA in a register in the internal logic circuit 12.

The decoder circuit 18 processes the parallel data signal using the power-supply potential Vd_int1 input from the power supply circuit 16 and outputs the processed signal to the drive circuit 20. The drive circuit 20 converts single-phase parallel data signal output from the decoder circuit 18 into differential signals and adjusts the potential levels of the differential signals on the basis of the power-supply potentials Vp and Vn output from the power supply circuit 16. For example, the conversion is such that the high level of the parallel differential data signals is equal to the power-supply potential Vp and the low level thereof is equal to the power-supply potential Vn. The converted parallel differential data signals are output to the high frequency switch core circuit 3.

If an output instruction is externally supplied, the internal logic circuit 12 outputs the enable signal EN and the serial data signal DATA stored in the register, as the transmission serial data signal TX_DATA, to the data output buffer circuit 26. In this case, the data output circuit 26 causes the transmission serial data signal TX_DATA to be output to an external unit from the high frequency switch control circuit 2 on the basis of the enable signal EN.

Things that may cause a problem when a signal is output from the data output buffer circuit 26 include a rise time Tr of an input signal, a delay time TPD_up in the rise time, a fall time Tf, and a delay time TPD_dn in the fall time. The data output buffer circuit 26 according to the first embodiment is intended to control these times.

Hereinafter, the configuration of the data output buffer circuit 26 will be described in more detail with reference to FIG. 2. FIG. 2 is a circuit diagram of the data output buffer circuit 26 according to the first embodiment. As illustrated in FIG. 2, the data output buffer circuit 26 includes an output control circuit 30, a drive circuit 32, and an output circuit 34.

The output control circuit 30 controls whether to output the transmission serial data signal TX_DATA on the basis of the enable signal EN. The output control circuit 30 includes inverter circuits 300, 302, and 306, a negative logical sum circuit (hereinafter, referred to as a NOR circuit) 304, and a negative logical product circuit (hereinafter, referred to as a NAND circuit) 308.

The respective outputs of the inverter circuits 300 and 302 are connected to the inputs of the NOR circuit 304. Furthermore, the output of the inverter circuit 302 is input into the inverter circuit 306, and the output of the inverter circuit 306 and the output of the inverter circuit 300 are connected to the inputs of the NAND circuit 308. The respective outputs of the NOR circuit 304 and the NAND circuit 308 are connected to the inputs of the drive circuit 32.

The drive circuit 32 outputs a drive signal that is used to output transmission data from the output circuit 34. The drive circuit 32 includes inverter circuits 320 and 322. The inverter circuit 320 includes a p-type MOSFET 324 and an n-type MOSFET 326. Similarly, the inverter circuit 322 includes a p-type MOSFET 328 and an n-type MOSFET 330.

In the example illustrated in FIG. 2, the p-type MOSFET 324 has a source connected to a power supply and a gate connected to the output of the NOR circuit 304. The n-type MOSFET 326 has a grounded source and a gate and a drain which are commonly connected to the p-type MOSFET 324 and outputs from the drain a signal that is logically inverted from an input signal applied to the gate.

The p-type MOSFET 328 has a source connected to a power supply and a gate connected to the output of the NAND circuit 308. The n-type MOSFET 330 has a grounded source and a gate and a drain which are commonly connected to the p-type MOSFET 328 and outputs from the drain a signal that is logically inverted from an input signal applied to the gate.

The output circuit 34 outputs transmission data on the basis of the drive signal output from the drive circuit 32. The output circuit 34 includes a p-type MOSFET 340, an n-type MOSFET 342, and a capacitor 344.

The p-type MOSFET 340 has a source connected to a power supply and a gate connected to the output of the inverter circuit 320. The n-type MOSFET 342 has a grounded source, a gate connected to the output of the inverter circuit 322, and a drain mutually connected to the drain of the p-type MOSFET 340 and outputs a transmission signal from the drain thereof. The capacitor 344 is a so-called feedback capacitor and is connected between the gate and the drain of the n-type MOSFET 342.

As described heretofore, the data output buffer circuit 26, which corresponds to a semiconductor integrated circuit according to the present embodiment, includes the drive circuit 32 and the output circuit 34. The drive circuit 32 includes the first inverter circuit 322 that includes the p-type first MOSFET 328 of a first conductivity type and the n-type second MOSFET 330 of a second conductivity type. Drains of the first MOSFET 328 and second MOSFET 330 are commonly connected to each other. The output circuit 34 outputs a transmission signal on the basis of a signal output from the drive circuit 32. The output circuit 34 includes the n-type third MOSFET 342 and the capacitor 344. The n-type third MOSFET 342 has a gate connected to the output of the first inverter circuit 322. The capacitor 344 is connected between the gate of the third MOSFET 342 and the drain of the third MOSFET 342. The output circuit 34 outputs a transmission signal from the drain of the third MOSFET 342.

The drive circuit 32 includes the second inverter circuit 320, and the output circuit 34 includes the p-type fourth MOSFET 340 that has a gate connected to the output of the second inverter circuit 320 and a drain connected to the drain of the third MOSFET 342. Connecting the output control circuit 30 to the drive circuit 32 allows the output circuit 34 to operate as a tristate buffer as described below.

Next, the operation of the data output buffer circuit 26 according to the first embodiment will be described with reference to FIG. 2. The transmission serial data signal TX_DATA and the enable signal EN that are output from the internal logic circuit 12 illustrated in FIG. 1 are input into the output control circuit 30. The output control circuit 30 performs predetermined calculations on the two input signals and outputs two calculation results to the drive circuit 32. The drive circuit 32 includes the two inverter circuits 320 and 322 and outputs signals that are logically inverted from the two calculation results input from the output control circuit 30. The two signals output by the drive circuit 32 are respectively input into the gate of the p-type MOSFET 340 and the gate of the n-type MOSFET 342 of the output circuit 34.

At first, a case where the enable signal EN is at the low level will be described. When the enable signal EN is at the low level, the output of the inverter circuit 302 is at the high level. Since the output of a NOR circuit is at the low level at all times if one of the two inputs thereof is at the high level, the NOR circuit 304 outputs a low level signal. The high level signal that is output from the inverter circuit 302 turns into a low level signal through operation of the inverter circuit 306, and the low level signal is input into the NAND circuit 308. Since the output of a NAND circuit is at the high level at all times if one of the two inputs thereof is at the low level, the NAND circuit 308 outputs a high level signal. That is, if the enable signal EN is at the low level, the output control circuit 30 outputs a low level signal from the NOR circuit 304 and outputs a high level signal from the NAND circuit 308.

These signals are logically inverted by the inverter circuits 320 and 322 respectively, and a high level signal is input into the gate of the p-type MOSFET 340 while a low level signal is input into the gate of the n-type MOSFET 342. The p-type MOSFET 340 of which the gate receives input of the high level signal is in a state that prevents flow of a drain current. Similarly, the n-type MOSFET 342 of which the gate receives input of the low level signal is in a state that prevents flow of a drain current. That is, in this case, the p-type MOSFET 340 and the n-type MOSFET 342 are in a so-called high impedance state, and the output terminals thereof are disconnected from the input terminals thereof. Thus, the transmission serial data signal TX_DATA is not output to the output terminals.

Next, a case where the enable signal EN is at the high level will be described. In this case, the NOR circuit 304 of the output control circuit 30 outputs a high level signal if the transmission serial data signal TX_DATA is at the high level or outputs a low level signal if the transmission serial data signal TX_DATA is at the low level. The NAND circuit 308 of the output control circuit 30 also outputs a high level signal if the transmission serial data signal TX_DATA is at the high level or outputs a low level signal if the transmission serial data signal TX_DATA is at the low level. That is, the NOR circuit 304 and the NAND circuit 308 output high level signals when the transmission serial data signal TX_DATA is at the high level, and the NOR circuit 304 and the NAND circuit 308 output low level signals when the transmission serial data signal TX_DATA is at the low level.

These signals are logically inverted by the inverter circuits 320 and 322 respectively and are respectively input into the gate of the p-type MOSFET 340 and the gate of the n-type MOSFET 342. When the transmission serial data signal TX_DATA is at the high level, low level signals are input into both of the gates of the p-type MOSFET 340 and the n-type MOSFET 342. In this case, since the p-type MOSFET 340 is turned ON and the n-type MOSFET 342 is turned OFF, the output circuit 34 outputs a high level signal. Meanwhile, when the transmission serial data signal TX_DATA is at the low level, high level signals are input into both of the gates of the p-type MOSFET 340 and the n-type MOSFET 342. In this case, since the p-type MOSFET 340 is turned OFF and the n-type MOSFET 342 is turned ON, the output circuit 34 outputs a low level signal.

In conclusion of the description heretofore provided, the data output buffer circuit 26 combines signals output from the drain of the n-type MOSFET 342 and the drain of the p-type MOSFET 340 and outputs the combined signal. More specifically, the data output buffer circuit 26 operates as a tristate buffer that is in a so-called high impedance state if the enable signal EN is at the low level and that outputs the transmission serial data signal TX_DATA as is if the enable signal EN is at the high level. However, the above description is with respect to an ideal case where a delay time or the like does not exist. In actuality, elements, gates, and the like of circuits may cause a delay or the like, and the level of the input transmission serial data signal TX_DATA may not be output as is. In addition, a load capacitance CL in a previous circuit that outputs the transmission serial data signal TX_DATA is likely to affect the signal and also significantly affects a rise or a fall of the output signal.

As above described, output resistance may be decreased to decrease the rise time and the fall time of the output signal. That is, the gate widths of the p-type MOSFET 340 and the n-type MOSFET 342 may be set to be greater than the gate widths of the p-type MOSFET 324, the n-type MOSFET 326, the p-type MOSFET 328, and the n-type MOSFET 330. In this case, a problem arises in that the rise time and the fall time become too short according to the load capacitance CL. Therefore, the capacitor 344 is provided in the present embodiment, and a limit is imposed on the ratio of the gate width of the p-type MOSFET 328 and the gate width of the n-type MOSFET 342 to prevent occurrence of a delay or noise. Hereinafter, a feedback capacitance that is the electrostatic capacitance of the capacitor 344 will be denoted by Cfb1.

FIG. 3A and FIG. 3B are diagrams illustrating the rise time Tr and the fall time Tf of the output signal of the data output buffer circuit 26 in the absence of the capacitor 344. Hereinafter, in the specification and drawings, the term Tr (350 pF), will indicate a result that represents the rise time Tr in a case of load capacitance CL=350 pF. Likewise, Tr(0 pF) represents the rise time Tr in a case of load capacitance CL=0 pF. Corresponding notation is used for indicating particular fall times Tf at different load capacitance CL values. The rise time Tr that is referred to here represents a time it takes for the output waveform to changes from 0.2×Vdd to 0.8×Vdd, given that Vdd is a power supply voltage or the like, and the fall time Tf represents a time in which the output waveform changes from 0.8×Vdd to 0.2× Vdd.

FIG. 3A is a graph illustrating a relationship between the rise time Tr of the output signal of the data output buffer circuit 26 and the ratio of the gate width of the p-type MOSFET 328 and the gate width of the n-type MOSFET 342. The horizontal axis represents Wg ratio (gate width ratio)=(gate width of p-type MOSFET 328)+(gate width of n-type MOSFET 342), and the vertical axis represents time in nanoseconds [ns]. Similarly, FIG. 3B is a graph illustrating a relationship between the Wg ratio and the fall time Tf of the output signal of the data output buffer circuit 26.

It is understood from the graph of Tr(0 pF) in FIG. 3A that the Wg ratio is preferably smaller than 1/100 in a case of, for example, desiring to secure a certain length of the rise time Tr. The Wg ratio is more preferably smaller than 0.8/100, and a still more preferable range thereof can be appropriately chosen from the graph to an extent capable of securing a necessary length of the rise time Tr. Since the Wg ratio is a gate width ratio, the Wg ratio is greater than zero at all times. The same applies to Tr(350 pF), and when the Wg ratio is greater than or equal to 1/100, the rise time Tr may be considered excessively decreased (too short). The same applies to the fall time Tf as illustrated in FIG. 3B. If the Wg ratio is greater than or equal to 1/100, a sufficient length for the fall time Tf may not be secured.

Providing the feedback capacitance Cfb1 by installation of the capacitor 344 allows for control of the rise time Tr and the fall time Tf. That is, an excessive decrease in the rise time Tr can be suppressed by flow of the drain current of the p-type MOSFET 340 into the electrodes of the capacitor 344 when the p-type MOSFET 340 is turned ON and the n-type MOSFET 342 is turned OFF. Conversely, when the n-type MOSFET 342 is turned ON and the p-type MOSFET 340 is turned OFF, the fall time Tf can be controlled by flow of a current from the electrodes of the capacitor 344 into the drain of the n-type MOSFET 342.

Hereinafter, descriptions will be provided assuming that, for example, a p-type MOSFET has a gate width of 4 um, an n-type MOSFET has a gate width of 2 um, a p-type MOSFET has a gate width of 4 um, and an n-type MOSFET has a gate width of 4 um in FIG. 4A, FIG. 5A, and FIG. 5B. In addition, output resistance is decreased by setting the gate widths of the p-type MOSFETs to 1000 um and the gate widths of the n-type MOSFETs to 700 um.

Figure 4B:
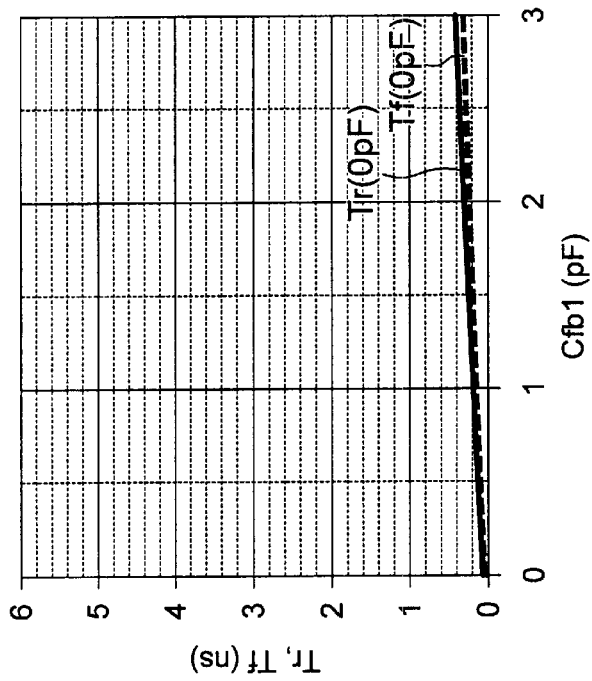
FIGS. 4A and 4B are graphs illustrating a relationship between a rise time and the like of an output signal and a feedback capacitance in the first embodiment.
Figure 4A:
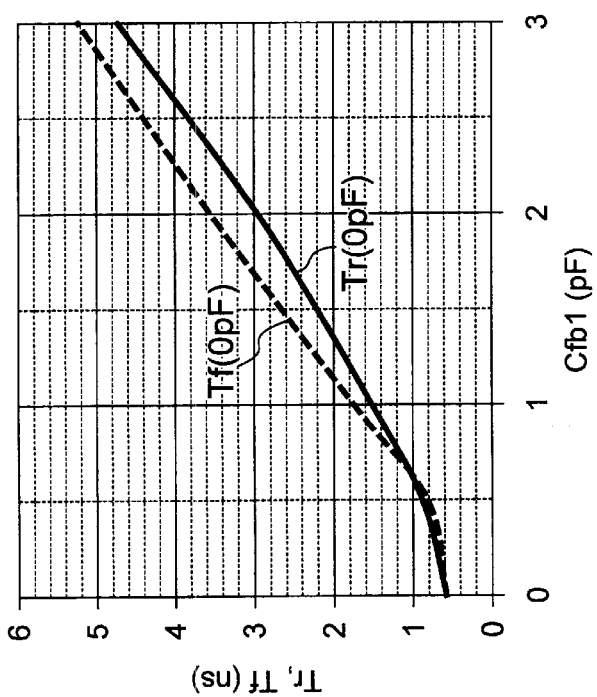

FIG. 4A and FIG. 4B are graphs illustrating a relationship among the feedback capacitance Cfb1, the rise time Tr, and the fall time Tf in a case of a constant Wg ratio. FIG. 4A is a graph in a case of Wg ratio=0.571/100 (that is, the Wg Ratio is less than 1/100 ("<1/100")). As illustrated in FIG. 4A, the rise time Tr and the fall time Tf are each increased as the feedback capacitance Cfb1 is increased. Particularly, when the electrostatic capacitance of the feedback capacitance Cfb1 is greater than 0.5 pF, more so, when the electrostatic capacitance of the feedback capacitance Cfb1 is greater than or equal to 1.0 pF, sufficient lengths of the rise time Tr and the fall time Tf can be secured. Conversely, if the electrostatic capacitance of the feedback capacitance Cfb1 is significantly greater than 5.0 pF, then by linear extrapolation of values of the graph illustrated in FIG. 4A, a length of less than 10 ns may not be secured for the rise time Tr and the like in a case where the load capacitance CL is large. Thus, the feedback capacitance Cfb1 is set to be greater than 0.5 pF and less than or equal to 5.0 pF, more preferably less than or equal to 3.0 pF. Methods for measuring an electrostatic capacitance include integration that uses transients of an RC serial circuit, an auto-balancing bridge method that uses an LCR meter, and the like.

FIG. 4B is a graph in a case of Wg ratio=11.429/100 (that is, the Wg ratio is greater than 1/100 (">1/100")). As illustrated in FIG. 4B, in this case, even if the feedback capacitance Cfb1 is increased, there is no significant difference between the rise time Tr and the fall time Tf, and sufficient lengths for the rise time Tr and the fall time Tf cannot be secured.

Next, a relationship among the load capacitance CL, the rise time Tr, and the fall time Tf will be described. FIG. 5A is a graph illustrating a relationship among the load capacitance CL, the rise time Tr, and the fall time Tf in a case of Wg ratio=0.571/100 (<1/100) and feedback capacitance Cfb1=3 pF (>0.5 pF). As illustrated in FIG. 5A, even if the value of the load capacitance CL changes in the wide range of 0 pF to 350 pF, the rise time Tr and the fall time Tf can be sufficiently secured while still being sufficiently small.

Figure 5B:
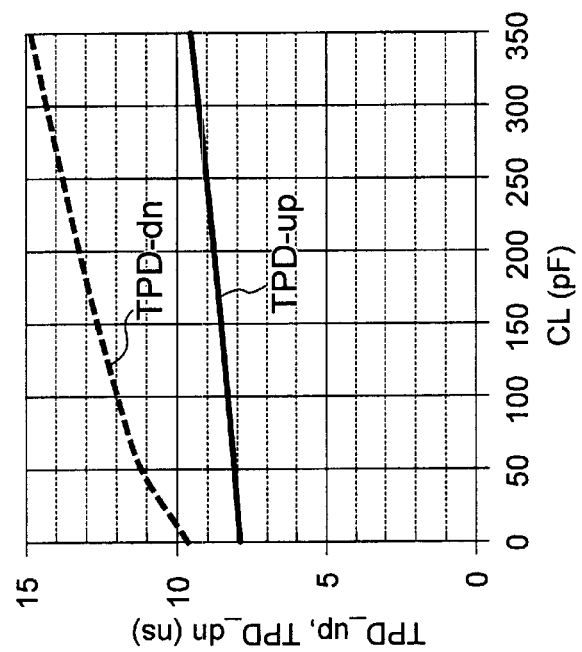
FIGS. 5A and 5B are graphs illustrating a relationship between a rise time and the like of an output signal and a load capacitance in the first embodiment.
Figure 5A:
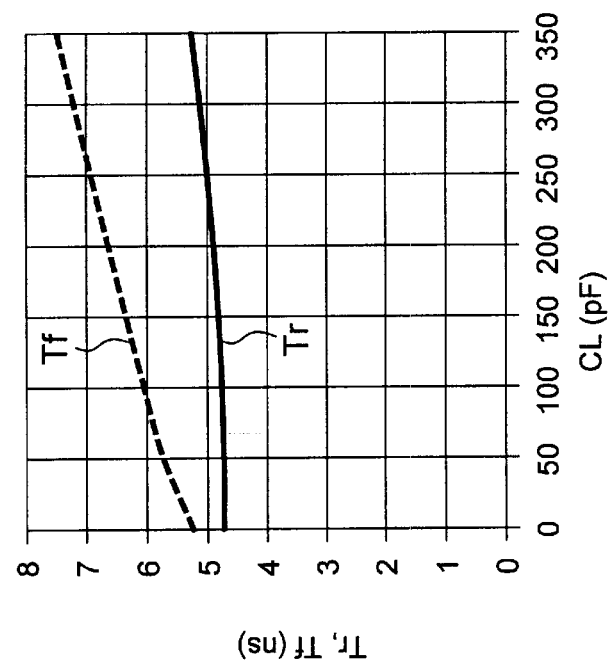

FIG. 5B is a graph illustrating a relationship among the load capacitance CL, a rise delay time TPD_up, and a fall delay time TPD_dn with the same Wg ratio and the feedback capacitance Cfb1 as in FIG. 5A. The rise delay time TPD_up is a period of time from a rising edge of an input signal (time at which a rising input signal reaches 0.5×Vdd) until the output waveform reaches 0.8×Vdd, given that, for example, Vdd is a power supply voltage. The fall delay time TPD_dn is a period of time from a falling edge of an input signal (time at which a falling input signal reaches 0.5×Vdd) until the output waveform reaches 0.2×Vdd.

Sufficiently small delay times can be secured as illustrated in FIG. 5B even if the load capacitance CL changes in the wide range of 0 pF to 350 pF. For example, when the delay times are required to be less than or equal to 20 ns, the delay times can be set to sufficiently small times. That is, in the data output buffer circuit 26 according to the first embodiment, the effect heretofore described is achieved by setting the ratio of the gate width of the p-type MOSFET 328 and the gate width of the n-type MOSFET 342 to be less than 1/100 and setting the electrostatic capacitance of the capacitor 344 to be greater than 0.5 pF and less than or equal to 3.0 pF.

According to the present embodiment heretofore described, sufficiently small but not excessively small rise times Tr and the fall times Tf can be secured by setting the ratio of the gate width of the p-type MOSFET 328 and the gate width of the n-type MOSFET 342 to be less than 1/100 and setting the feedback capacitance Cfb1 of the capacitor 344 to be greater than or equal to 0.5 pF. In addition, sufficiently small rise delay times TPD_up and fall delay times TPD_dn can be secured.

If the high frequency switch 1 is used as, for example, a switch of an antenna of a mobile phone, emission of high frequency noise is desired to be avoided in the antenna switch (high frequency antenna switch circuit) that is present near electromagnetic waves received by the antenna of the mobile phone because the electromagnetic waves have a high frequency. The rise time Tr and the fall time Tf are preferably small. However, if a rise and a fall of the output signal are generated in response to a high frequency clock signal, the rise and the fall form a shape similar to a rectangular wave. A rectangular wave signal includes a large number of high frequency component signals as understood from the Fourier transform of the signal, and the high frequency components may generate noise. To avoid the high frequency noise, the rise time Tr and the fall time Tf of the output signal are likely to be more acceptable if high frequency components of the signal are removed to a certain extent. According to the present embodiment, the rise time Tr and the fall time Tf of the output signal can be decreased, without being excessively decreased, and generation of high frequency noise around the antenna can be suppressed.

Figure 6:
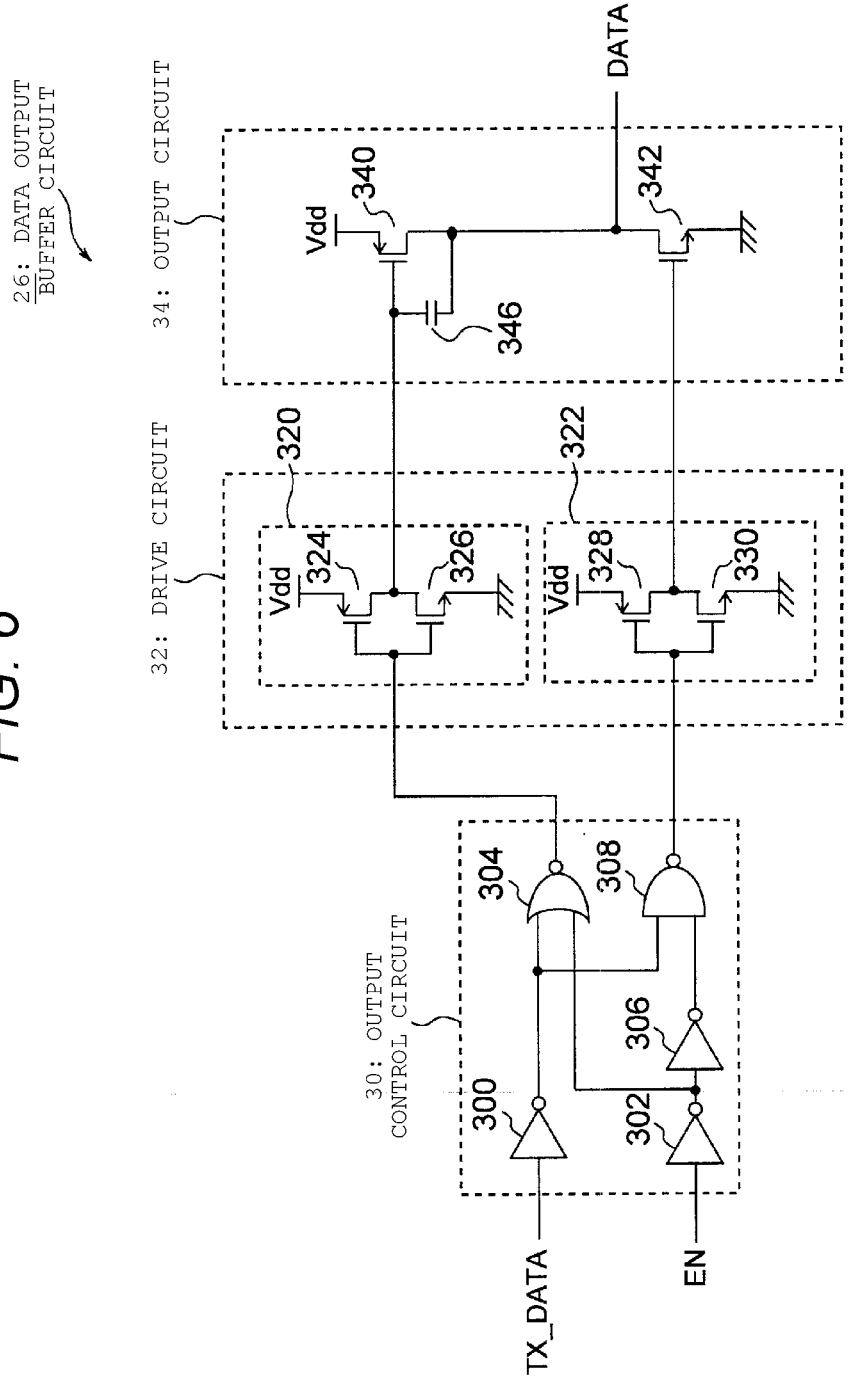
FIG. 6 is a circuit diagram of a semiconductor integrated circuit according to another example of the first embodiment.

While the feedback capacitance Cfb1 is disposed in such a manner to couple the drain and the gate of the n-type MOSFET 342 in the present embodiment, alternatively a capacitor 346 that corresponds to the feedback capacitance Cfb1 may be disposed between the drain and the gate of the p-type MOSFET 340 as illustrated in FIG. 6. At this point, the gate widths of other MOSFETs may be determined on the basis of the gate width of the p-type MOSFET 340 and the gate width of the p-type MOSFET 324. In some embodiments, a feedback capacitance may also be disposed in both of the n-type MOSFET 342 and the p-type MOSFET 340. That is, both a capacitor 342 and a capacitor 346 can be incorporated.

Modification Example of First Embodiment

While the rise time Tr and the like of the output signal are controlled by optimizing the feedback capacitance of the output circuit 34 and the gate widths of the MOSFETs of the drive circuit 32 and the output circuit 34 in the first embodiment above described, an additional circuit (a supplemental circuit) that provides a stabilized rise time Tr and the like is further disposed in the present modification example. Hereinafter, differences from the above embodiment will be described.

Figure 7:
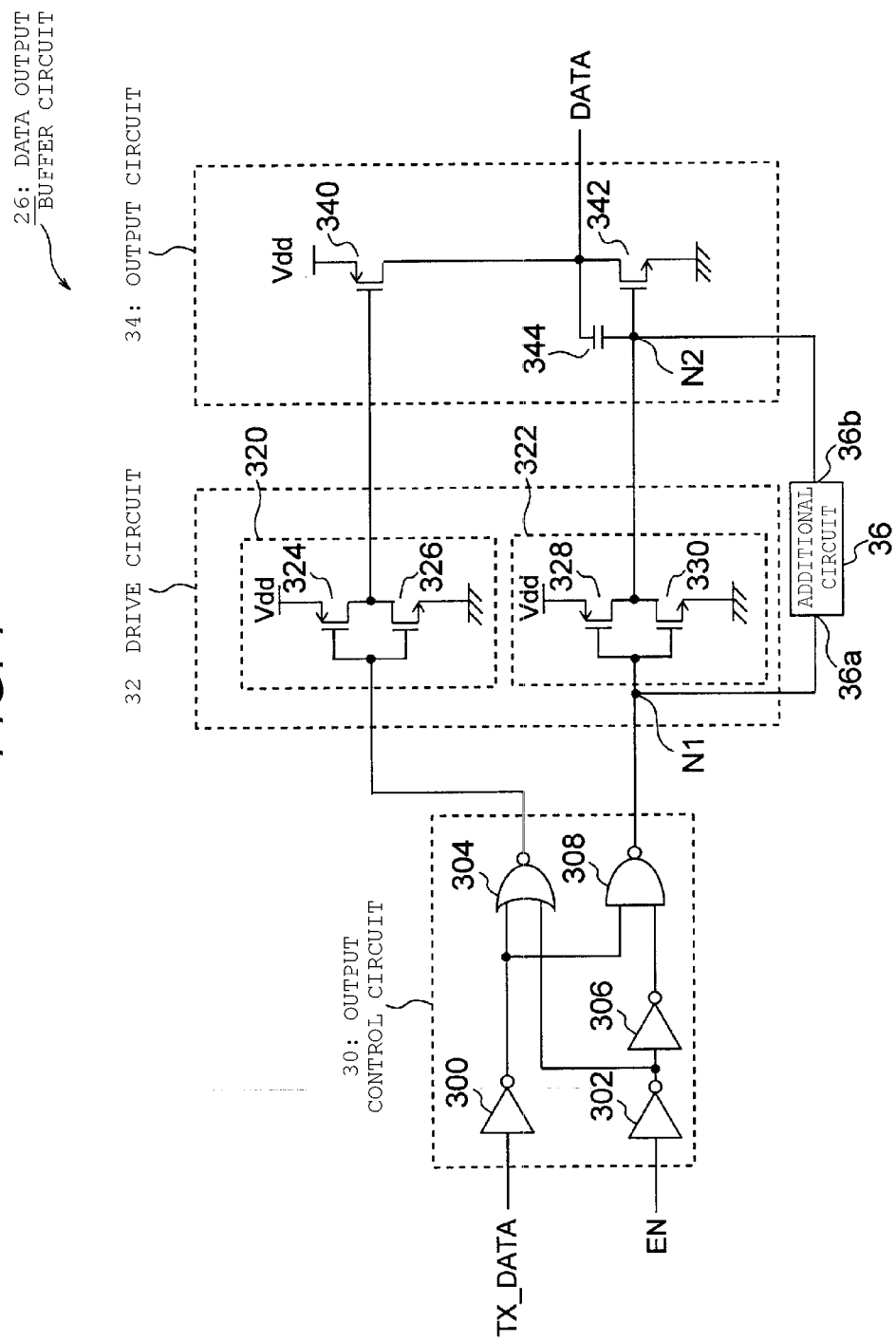
FIG. 7 is a circuit diagram of a semiconductor integrated circuit according to a modification example of the first embodiment.

FIG. 7 is a circuit diagram illustrating the data output buffer circuit 26 that corresponds to a semiconductor integrated circuit according to the present modification example. The same reference signs as in the above embodiment will designate the same configurations and elements. In FIG. 7, in addition to the configuration of the data output buffer circuit 26 in the above embodiment, the data output buffer circuit 26 further includes an additional circuit (supplemental circuit) 36 that is connected in parallel with the inverter circuit 322 between a node N1, a node on the input side of the inverter circuit 322, and a node N2, a node on the output side of the inverter circuit 322. That is, the additional circuit 36 has a terminal 36a connected to the input of the inverter circuit and a terminal 36b connected to the output of the inverter circuit, performs a predetermined process on a signal that is input into the inverter circuit 322 at node N1, and outputs the processed signal at node N2.

Figure 8:
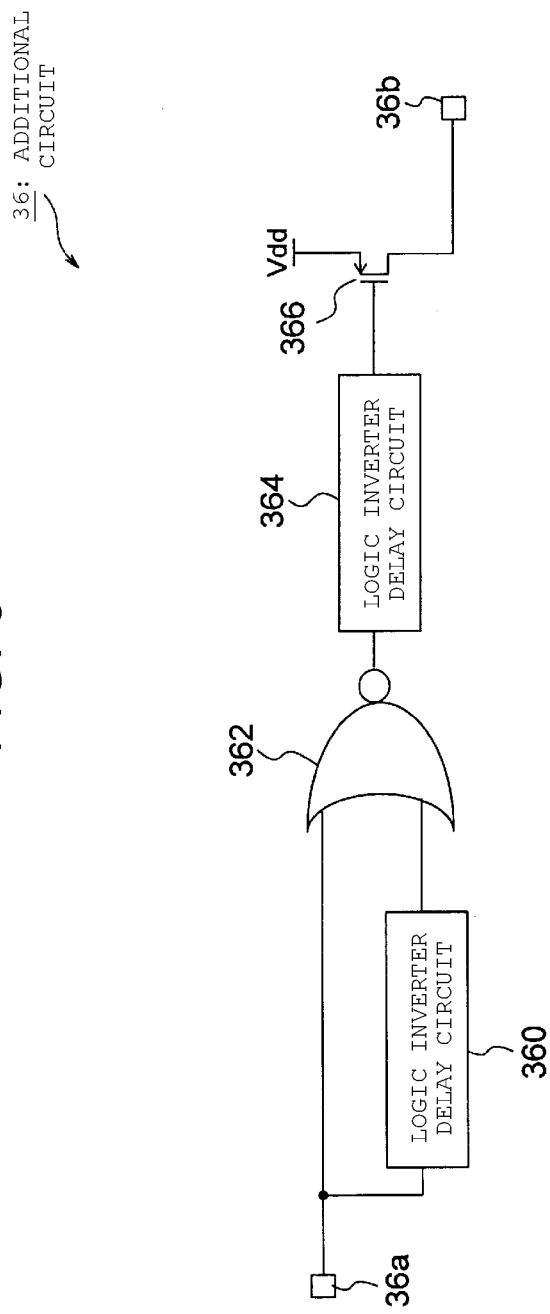
FIG. 8 is a circuit diagram of an additional circuit (supplemental circuit) of the semiconductor integrated circuit according to the modification example of the first embodiment.

FIG. 8 is a schematic diagram illustrating a configuration of the additional circuit 36 in this example. The additional circuit 36 includes a first logic inverter delay circuit 360, a NOR circuit 362, a second logic inverter delay circuit 364, and a p-type MOSFET 366. If the input signal of the inverter circuit 322 transitions from the high level to the low level, the additional circuit applies a voltage to the gate of the n-type MOSFET 344 at a timing that is delayed by a predetermined time from the time of the change.

The first logic inverter delay circuit 360 delays the input signal by a predetermined time, logically inverts the delayed signal, and outputs the inverted signal. The first logic inverter delay circuit 360 is connected to the terminal 36a on the input side thereof. The NOR circuit 362 has two inputs connected to the terminal 36a and the output of the logic inverter delay circuit 360 and outputs an inverted logical sum. The second logic inverter delay circuit 364 is connected to the output of the NOR circuit 362 on the input side thereof. The second logic inverter delay circuit 364 delays the input signal by a predetermined time, logically inverts the delayed signal, and outputs the inverted signal in a similar manner as the first logic inverter delay circuit 360.

The p-type MOSFET 366 has a source connected to the power supply Vdd, a gate connected to the second logic inverter delay circuit 364, and a drain connected to the terminal 36b and outputs a signal from the drain thereof to the terminal 36b. That is, the drain of the p-type MOSFET 366 is connected to the gate of the n-type MOSFET 342 via node N2.

Figure 9:
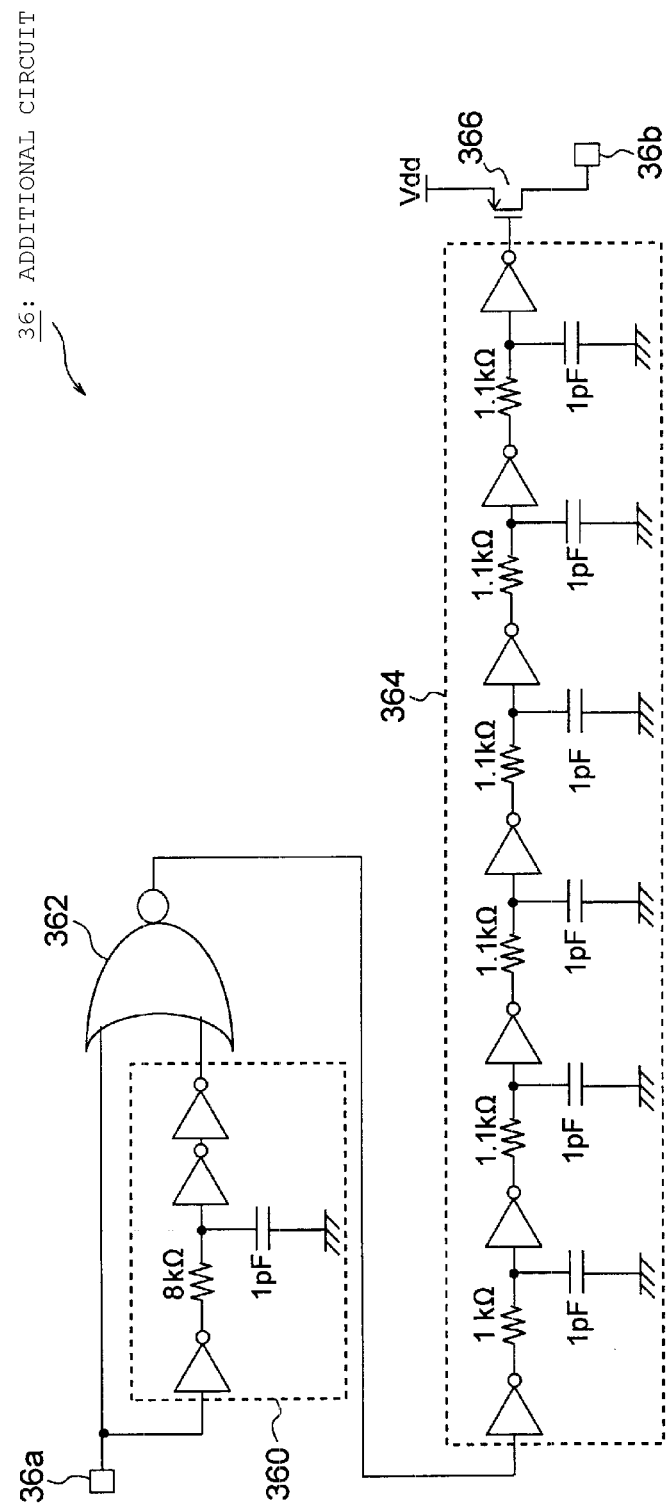
FIG. 9 is a circuit diagram illustrating an example of the additional circuit in FIG. 8.

FIG. 9 is a diagram illustrating examples of the first logic inverter circuit 360 and the second logic inverter circuit 364. According to the example of FIG. 9, the first logic inverter circuit 360 has a configuration in which an inverter circuit, a resistor, and two inverter circuits are connected in series and a grounded capacitor is connected between the resistor and the second inverter circuit.

With these connections, when the signal transitions either from the low level to the high level or from the high level to the low level, a current flows into the capacitor, thereby removing high frequency components from the input signal, and the potential between the resistor and the second inverter circuit transitions slowly. By adjusting a threshold for logical inversion of the signal in the second inverter circuit, the slowly changing signal can be converted into a signal that has a rise or a fall delayed by a predetermined time from a rise or a fall of the input signal. Each inverter circuit is inserted in the first logic inverter circuit 360 in order to output such a delayed signal and to stabilize the output level. Arranging these inverter circuits linearly in odd numbers allows a delayed, logically inverted signal to be output. The same applies to the second logic inverter circuit 364. Incorporating an inverter circuit between a resistor and a capacitor that, as a set, operate as a low-pass filter delays a signal by a desired time, and arranging the inverter circuit in odd numbers allows the delayed signal to be output as a logically inverted signal.

FIG. 10 is a timing chart illustrating transitions in an input signal in the terminal 36a illustrated in FIG. 8, the output of the first logic inverter delay circuit 360, the output of the NOR circuit 362, the output of the second logic inverter delay circuit 364, and the output signal in the terminal 36b when the input signal changes from the low level to the high level and from the high level to the low level. As illustrated in the uppermost part (input signal) and the lowermost part (output signal) of FIG. 10, the additional circuit 36 outputs a high level signal during a second predetermined time Td2 after elapsing of a first predetermined time Td1 from transition of the input signal of the inverter circuit 322 from the high level to the low level. Hereinafter, operation of the additional circuit 36 will be described.

At first, the output of the first logic inverter delay circuit 360 is at the high level if the input signal is at the low level. The NOR circuit 362 that receives input of the low level input signal and the high level signal output by the first logic inverter delay circuit 360 outputs a low level signal. The second logic inverter delay circuit 364 that receives input of the low level signal logically inverts the signal and outputs a high level signal. The p-type MOSFET 366 in which the high level signal is applied to the gate of the p-type MOSFET 366 is turned OFF and outputs a low level signal.

Next, if the input signal transitions from the low level to the high level, the first logic inverter delay circuit 360 continues to output a high level signal until the second predetermined time Td2 elapses. If the second predetermined time Td2 elapses from the transition of the input signal from the low level to the high level, the first logic inverter delay circuit 360 causes the output thereof to transition from the high level to the low level. In this case, since the signal input from the terminal 36a is at the high level, the NOR circuit 362 outputs a low level signal. Since the NOR circuit 362 outputs a low level signal, the output of the second logic inverter delay circuit 364 and the output of the p-type MOSFET 366 do not change from the state above described, and the second logic inverter delay circuit 364 and the p-type MOSFET 366 respectively output a high level signal and a low level signal.

Next, if the input signal transitions from the high level to the low level, the first logic inverter delay circuit 360 continues to output a low level signal until the second predetermined time Td2 elapses. If the second predetermined time Td2 elapses from the transition of the input signal from the high level to the low level, the first logic inverter delay circuit 360 causes the output thereof to transition from the low level to the high level. In this case, since the signal input from the terminal 36a is at the low level, low level signals are input into both of the inputs of the NOR circuit 362 until the second predetermined time Td2 elapses from the transition of the input signal from the high level to the low level, and the NOR circuit 362 outputs a high level signal. After the elapsing of the second predetermined time Td2, the first logic inverter delay circuit 360 outputs a high level signal. Thus, the NOR circuit 362 outputs a low level signal.

In this case, the second logic inverter delay circuit 364 delays the signal output from the NOR circuit 362 by the amount of the first predetermined time Td1, logically inverts the delayed signal, and outputs the inverted signal. That is, the second logic inverter delay circuit 364 outputs a low level signal only during the second predetermined time Td2 after elapsing of the first predetermined time Td1 from the transition of the input signal of the terminal 36a from the high level to the low level and then outputs a high level signal again. The p-type MOSFET 366 in which this signal is applied to the gate of the p-type MOSFET 366 outputs a low level signal until elapsing of the first predetermined time Td1 from the transition of the input signal from the high level to the low level, then outputs a high level signal until the second predetermined time Td2 elapses, and outputs a low level signal after the elapsing of the second predetermined time Td2 as illustrated in the lowermost part of FIG. 10.

That is, the additional circuit 36 outputs a high level signal only during the second predetermined time Td2. The additional circuit 36 outputs a high level signal only during the second predetermined time Td2 after elapsing of the first time Td1 from the transition of the input signal of the inverter circuit 322 from the high level to the low level. A delayed signal that is output from the additional circuit 36 is applied to the n-type MOSFET 342. Outputting a signal that is delayed in time from the output of the inverter circuit 322 to the gate of the n-type MOSFET 342 can assist a fall of the output signal of the n-type MOSFET 342.

The output of the output circuit 34 may be delayed depending on other constituents of the data output buffer circuit 26. For example, the p-type MOSFET 340 and the n-type MOSFET 342 may be turned OFF or ON at the same timing even if the enable signal is at the high level. In such a case, a rise and a fall of the p-type MOSFET 340 are indirectly controlled by controlling a fall of the n-type MOSFET 342. As a consequence, a rise of the output signal of the data output buffer circuit 26 can also be assisted.

Figure 11A:
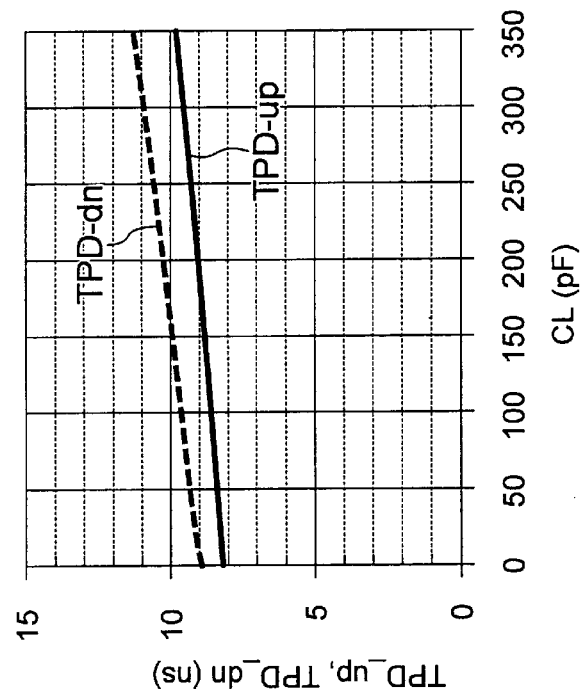
FIGS. 11A and 11B are graphs illustrating a relationship between a rise time and the like of an output signal and a load capacitance in the modification example of the first embodiment.
Figure 11B:
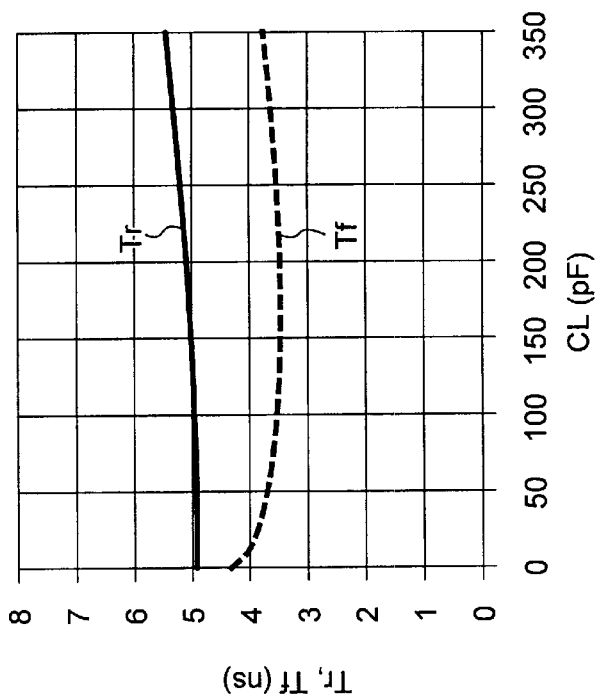

FIGS. 11A and 11B are graphs illustrating the rise time Tr and the like in a case where the additional circuit 36 is installed. It is understood from comparing FIG. 11A with FIG. 5A that the stability of the rise time Tr and the fall time Tf of the output of the data output buffer circuit 26 is further increased. In addition, by comparing FIG. 11B with FIG. 5B, the rise delay time TPD_up and the fall delay time TPD_dn are also understood to be more stabilized than when the additional circuit is not installed.

According to the present modification example heretofore described, sufficiently small but not excessively small lengths for the rise time Tr and the fall time Tf can be secured by setting the ratio of the gate width of the p-type MOSFET 328 and the gate width of the n-type MOSFET 348 to be less than 1/100 and setting the feedback capacitance Cfb1 of the capacitor 344 to be greater than or equal to 0.5 pF. In addition, inclusion of the additional circuit 36 allows the rise time Tr and the fall time Tf to be secured more stably independently of the load capacitance CL and also allows sufficiently small lengths of the rise delay time TPD_up and the fall delay time TPD_dn to be secured.

Figure 12:
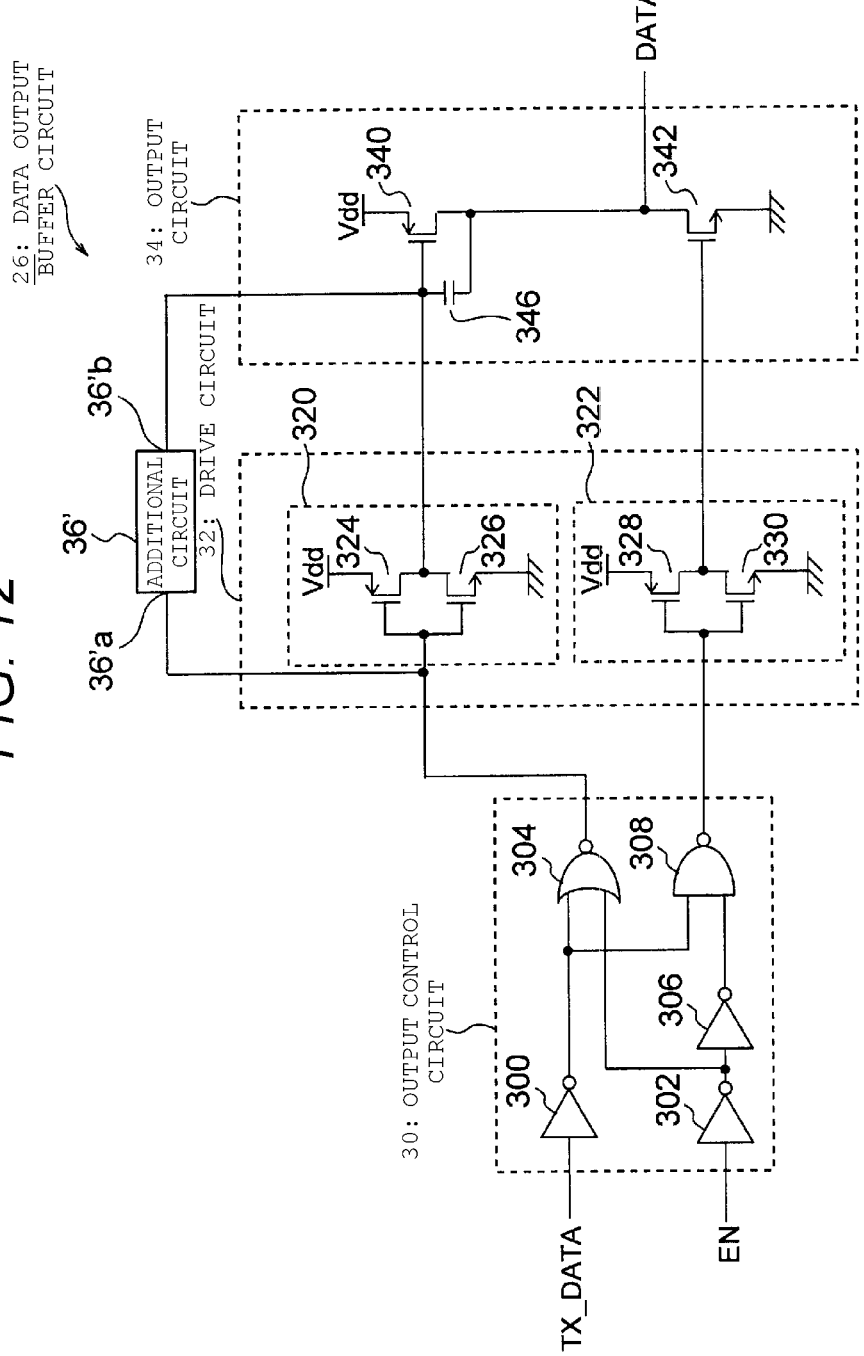
FIG. 12 is a circuit diagram of a semiconductor integrated circuit according to another example of the modification example of the first embodiment.

As another modification example, as illustrated in FIG. 12, an additional circuit (supplemental circuit) 36' that delays the output of the inverter circuit 320 is provided, and the capacitor 346 that serves as a feedback capacitance is connected to the gate and the drain of the p-type MOSFET 340. In this case, as in the above modification example, the rise time Tr and the fall time Tf can be stabilized over a wide load capacitance range.

Figure 13:
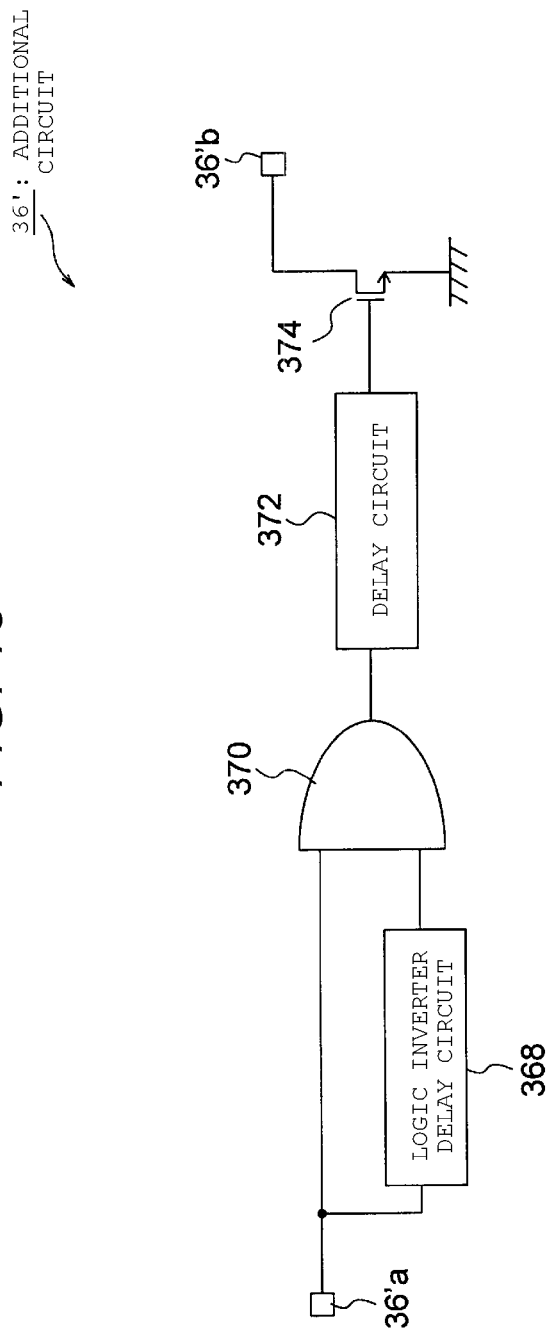
FIG. 13 is a circuit diagram of an additional circuit of the semiconductor integrated circuit according to the other example of the modification example of the first embodiment.

FIG. 13 is a circuit diagram illustrating the additional circuit 36'. As illustrated in FIG. 13, the additional circuit 36' includes an inverter delay circuit 368 that is a first delay circuit having an input connected to an input terminal 36'a, an AND circuit 370 that has two inputs connected to the input terminal 36'a and the output of the inverter delay circuit 368, a delay circuit 372 that is a second delay circuit having an input connected to the output of the AND circuit 370, and an n-type MOSFET 374 that has a gate connected to the output of the delay circuit 372, a grounded source, and a drain connected to an output terminal 36'b.

The inverter delay circuit 368 delays the input signal by the amount of the second predetermined time Td2, inverts the delayed signal, and outputs the inverted signal. The AND circuit 370 outputs a logical product of the input signal of the additional circuit 36' and the output signal of the inverter delay circuit 368. The logical product output is input into the gate of the n-type MOSFET 374 to control a drain current of the n-type MOSFET 374.

Figure 14:
FIG. 14 is a timing chart illustrating an output state of each constituent of the additional circuit of the semiconductor integrated circuit according to the other example of the modification example of the first embodiment.

FIG. 14 is a timing chart illustrating the state of the output signals of the input terminal 36'a, the output terminal 36'b, and each constituent of the additional circuit 36' in FIG. 13. Since FIG. 14 is many respects approximately the same conceptually as FIG. 10, FIG. 14 will not be described in detail. From comparison of the uppermost part of FIG. 14 illustrating the input signal with the lowermost part thereof illustrating the output signal, if the input signal of the inverter circuit 320 rises, a pulse-shaped falling signal that is delayed by the first predetermined time Td1 from the timing of the rise of the input signal and has a width corresponding to the second predetermined time Td2 is output unlike the case illustrated in FIG. 10.

As such, if a signal applied to the gate of the p-type MOSFET 340 falls, the additional circuit 36' can assist the fall of the signal applied to the gate of the p-type MOSFET 340. That is, the additional circuit 36' can assist a rise of the output signal of the p-type MOSFET 340.

Second Embodiment

While the semiconductor integrated circuit described in the first embodiment can control a rise time and the like by setting the gate width ratios of the drive circuit 32 and the output circuit 34 to values within a predetermined range, an additional circuit (supplemental circuit) is disposed between a tristate buffer and a data output terminal to control the rise time and the like in the present embodiment. Hereinafter, differences from the above embodiment will be described.

Figure 15:
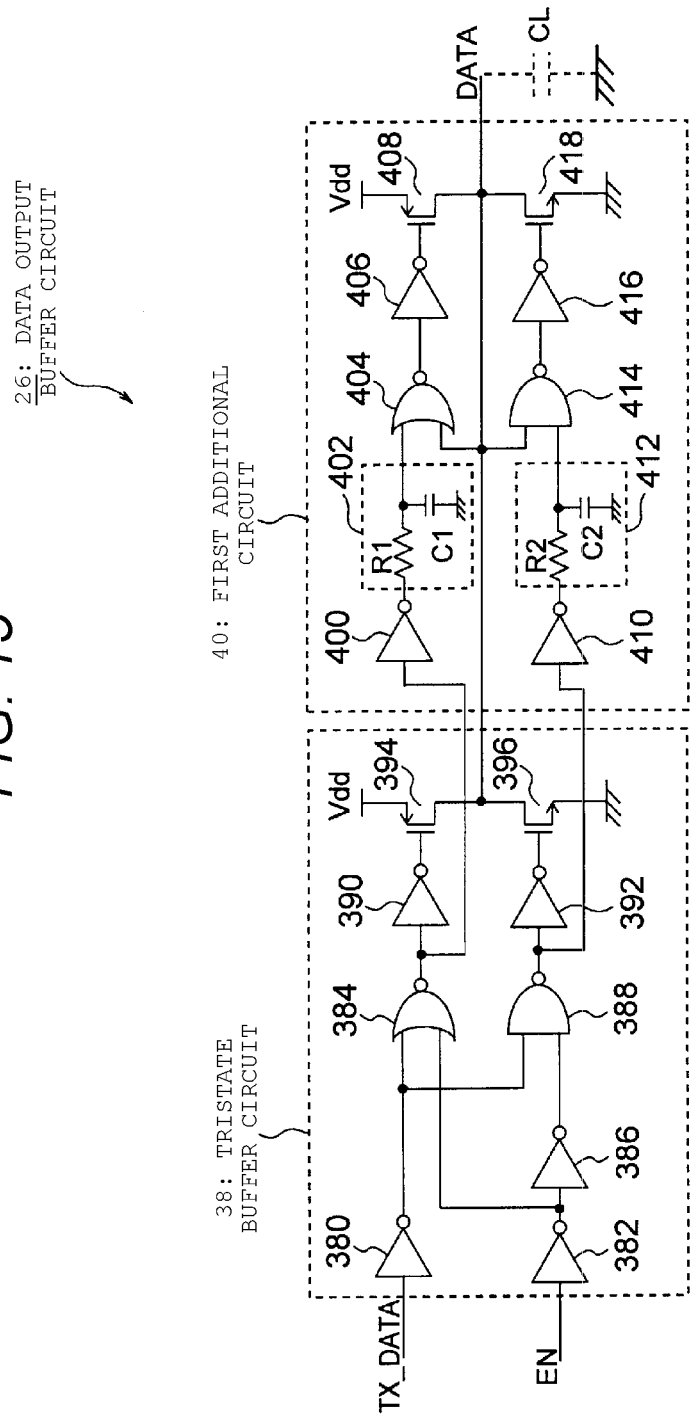
FIG. 15 is a circuit diagram of a semiconductor integrated circuit according to a second embodiment.

FIG. 15 is a circuit diagram illustrating a configuration of the data output buffer circuit 26 according to the second embodiment. As illustrated in FIG. 15, the data output buffer circuit 26 according to the second embodiment includes a tristate buffer circuit 38 and a first additional circuit (first supplemental circuit) 40.

The tristate buffer circuit 38 includes, for example, inverter circuits 380, 382, and 386, a NOR circuit 384, a NAND circuit 388, inverter circuits 390 and 392, a p-type MOSFET 394, and an n-type MOSFET 396 as illustrated in FIG. 15. Each constituent and operation thereof are the same as those in a case where the capacitor 344 is not present as in the first embodiment and thus will not be described in detail.

The tristate buffer circuit 38 is in a high impedance state if the enable signal EN is at the low level, and the input thereof is disconnected from the output thereof. Meanwhile, if the enable signal EN is at the high level, the tristate buffer circuit 38 outputs a signal that results from controlling the potential level of the transmission serial data signal TX_DATA, an input signal with the power supply Vdd.

The first additional circuit 40 receives input of the output signals of the NOR circuit 384 and the NAND circuit 388 in the tristate buffer circuit 38 and the output signal of the tristate buffer circuit 38 and outputs a signal that results from controlling a rise and a fall of the output signal of the tristate buffer circuit 38. The first additional circuit 40 includes inverter circuits 400, 406, 410, and 416, a first delay circuit 402, a NOR circuit 404, a p-type MOSFET 408, a second delay circuit 412, a NAND circuit 414, and an n-type MOSFET 418.

The inverter circuit 400 logically inverts the input signal and outputs the inverted signal, and the input thereof is connected to the output of the NOR circuit 384 of the tristate buffer circuit 38. That is, the inverter circuit 400 receives input of a logical product input signal that is a logical product of the enable signal EN and the transmission serial data signal TX_DATA which is an input data signal.

The first delay circuit 402 delays the input signal by a predetermined time and outputs the delayed signal, and the input thereof is connected to the output of the inverter circuit 400. The first delay circuit 402 includes a first resistor R1 and a first capacitor C1. The first resistor R1 is connected to the output of the inverter circuit 400. The first capacitor C1 has one electrode connected to the first resistor R1 and another electrode grounded.

The NOR circuit 404 calculates a logical sum of two input signals, and the inputs thereof are connected to the output of the resistor R1 and the output of the tristate buffer circuit 38. The inverter circuit 406 has an input connected to the output of the NOR circuit 404. The p-type MOSFET 408 is a circuit element that outputs a signal from a drain thereof. The p-type MOSFET 408 has a source connected to the first power supply Vdd, a gate connected to the output of a logical sum circuit that is configured with the NOR circuit 404 combined with the inverter circuit 406, and a drain connected to the output of the tristate buffer circuit 38.

The inverter circuit 410 has an input connected to the output of the NAND circuit 388 of the tristate buffer circuit 38. That is, the inverter circuit 410 receives input of a logical sum input signal that is a logical sum of the negated enable signal and the transmission serial data signal TX_DATA which is an input data signal.

The second delay circuit 412 includes a second resistor R2 and a second capacitor C2. The configuration and operation thereof are the same as the configuration and operation of the first delay circuit 402 and thus will not be described in detail. The NAND circuit 414 calculates a logical product of two input signals, and the inputs thereof are connected to the output of the second resistor R2 and the output of the tristate buffer circuit 38. The inverter circuit 416 has an input connected to the output of the NAND circuit 414.

The n-type MOSFET 418 has a source connected to a second power supply, in this case, a ground, that has a smaller power supply voltage than the first power supply, a gate connected to the output of a logical product circuit that is configured with the NAND circuit 414 combined with the inverter circuit 416, and a drain connected to the output of the tristate buffer circuit 38 and the drain of the p-type MOSFET 408. The n-type MOSFET 418 outputs a signal from the drain thereof.

The following parameter settings are important in order to adjust a rise delay time and a fall delay time of the tristate buffer circuit 38 and a delay time and the like of the first delay circuit 402 and the second delay circuit 412. Regarding the delay circuits, the delay times of the first delay circuit 402 and the second delay circuit 412 are important parameters, and assuming that each of the inverter circuits 406 and 416 is configured with a typical CMOS (complementary metal oxide semiconductor) inverter circuit configured with an n-type MOSFET and a p-type MOSFET, the gate width of each MOSFET, the gate widths of the p-type MOSFETs 394 and 408, and the gate widths of the n-type MOSFETs 396 and 418 are important parameters. Particularly, important parameters are the relationship of gate width of p-type MOSFET 394 being less than gate width of p-type MOSFET 408 and the relationship of gate width of n-type MOSFET 396<being less than gate width of n-type MOSFET 418. More specifically, in a simulation result described below, the gate widths of the MOSFETs constituting each gate of the tristate buffer circuit 38 and the first additional circuit 40, excluding the p-type MOSFETs 394 and 408 and the n-type MOSFETs 396 and 418, are approximately 1 um to 10 um, while the gate widths of the p-type MOSFET 394 and the n-type MOSFET 396 are 30 um to 40 um and the gate widths of the p-type MOSFET 408 and the n-type MOSFET 418 are 200 um to 450 um.

Next, operation of the data output buffer circuit 26 will be described with reference to FIG. 15. The tristate buffer circuit 38 is described above and thus will not be described again in detail. Again the tristate buffer circuit 38 is in a high impedance state if the enable signal EN is a low level signal and outputs the voltage level of the input transmission serial data signal TX_DATA as is if the enable signal EN is a high level signal.

Figure 16A:
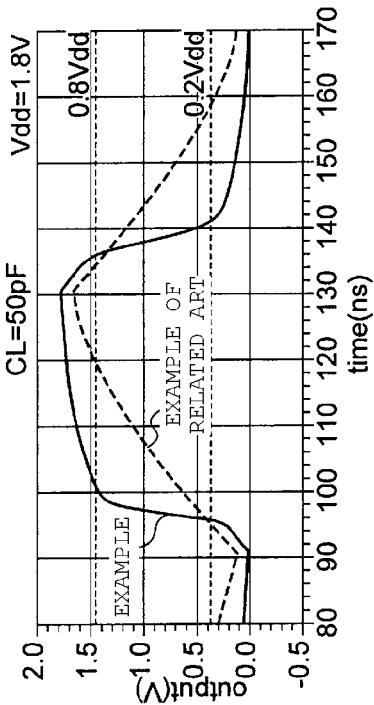
FIGS. 16A to 16D are graphs illustrating a waveform of an output signal and the like in the second embodiment.
Figure 16C:
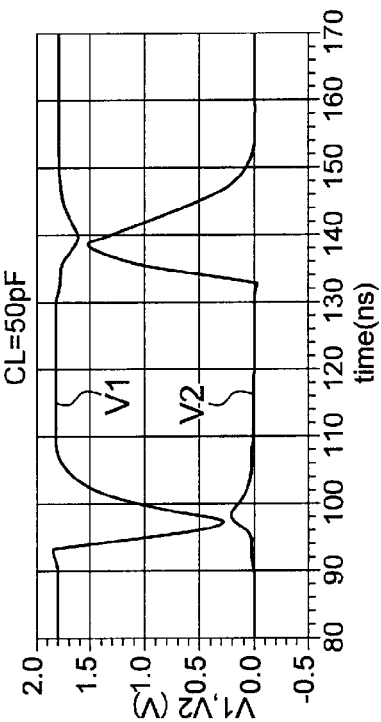
Figure 16B:
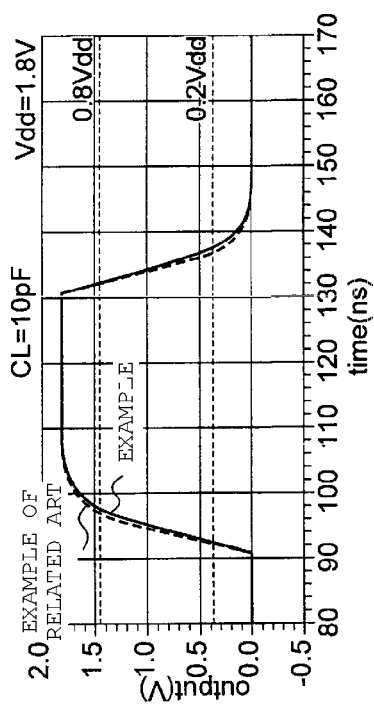
Figure 16D:
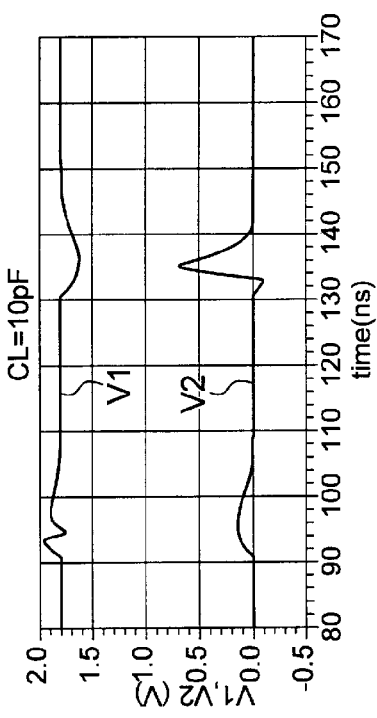

FIGS. 16A to 16D are diagrams illustrating one cycle of the output signal from the data output buffer circuit 26 and one cycle of the output signal from each of the inverter circuits 406 and 416 in a case where the transmission serial data signal TX_DATA is a rectangular signal having a pulse width of 40 ns. FIG. 16A and FIG. 16B are diagrams illustrating a case of load capacitance CL=10 pF, and FIG. 16C and FIG. 16D are diagrams illustrating a case of load capacitance CL=50 pF. Solid lines indicate the output of the data output buffer circuit 26 according to the second embodiment, and broken lines illustrate the output of a tristate buffer circuit from related art. FIG. 16A and FIG. 16C are diagrams illustrating the output signal of the data output buffer circuit 26, and FIG. 16B and FIG. 16D are diagrams illustrating the output signals of the inverter circuits 406 (V1) and 416 (V2).

First, a case where the enable signal EN is a low level signal will be described. In this case, the inverter circuit 400 receives input of a low level signal, and the inverter circuit 410 receives input of a high level signal.

The inverter circuit 400 into which a low level signal is input outputs a high level signal. Since the output of a NOR circuit is at the low level if one of the two input signals thereof is at the high level, the NOR circuit 404 outputs a low level signal. This low level signal output turns into a high level signal through the inverter circuit 406, and the high level signal is input into the gate of the p-type MOSFET 408. The p-type MOSFET 408 of which the gate receives input of the high level signal is turned OFF and is in a state that prevents flow of a drain current.

The inverter circuit 410 into which a high level signal is input outputs a low level signal. Since the output of a NAND circuit is at the high level if one of the two input signals thereof is at the low level, the NAND circuit 414 outputs a high level signal. This high level signal output turns into a low level signal through the inverter circuit 416, and the low level signal is input into the gate of the n-type MOSFET 418. The n-type MOSFET 418 of which the gate receives input of the low level signal is turned OFF and is in a state that prevents flow of a drain current.

In this case, as above described, the input of the first additional circuit 40 is disconnected from the output thereof since both of the p-type MOSFET 408 and the n-type MOSFET 418 are turned OFF. That is, the data output buffer circuit 26 as a whole is in a so-called high impedance state if the enable signal EN is a low level signal and does not output the transmission serial data signal TX_DATA which is an input signal.

Next, a case where the enable signal EN is a high level signal will be described. If the enable signal EN is at the high level and, furthermore, the transmission serial data signal TX_DATA is at the low level, a low level signal is output to both of the inverter circuit 400 and the inverter circuit 410. If a low level signal is input into the inverter circuit 400, the p-type MOSFET 408 is turned OFF as above described. This state is illustrated by V1 between, for example, 80 ns and 90 ns in FIG. 16B and FIG. 16D.

The inverter circuit 410 into which a low level signal is input outputs a high level signal. The NAND circuit 414 receives input of the high level signal and a low level signal output from the tristate buffer circuit 38 and outputs a high level signal. This high level signal is converted into a low level signal through the inverter circuit 416, and the low level signal is input into the gate of the n-type MOSFET 418. The n-type MOSFET of which the gate receives input of the low level signal is turned OFF. This state is illustrated by V2 between, for example, 80 ns and 90 ns in FIG. 16B and FIG. 16D.

That is, a current does not flow in both of the drain of the p-type MOSFET 408 and the drain of the n-type MOSFET 418. In this case, the output signal is a low level signal that corresponds to the output signal of the tristate buffer circuit 38. This state is illustrated by the solid lines between, for example, 80 ns and 90 ns in FIG. 16A and FIG. 16C.

Next, a case where the transmission serial data signal TX_DATA transitions from the low level to the high level when the enable signal EN is a high level signal will be described. If the transmission serial data signal TX_DATA transitions from the low level to the high level, both of the inverter circuit 400 and the inverter circuit 410 receive input of a high level signal. The tristate buffer circuit 38 outputs a high level signal.

In this case, a rise time of a signal that is output from the p-type MOSFET 394 and the n-type MOSFET 396 of the tristate buffer circuit 38 is delayed according to the size of the load capacitance CL. A relationship between this delay time due to the MOSFETs of the tristate buffer and the delay time of each of the first delay circuit 402 and the second delay circuit 412 changes the effect of the data output buffer circuit 26.

A case where the load capacitance CL is small and a rise delay time of the output of the tristate buffer circuit 38 is smaller than the delay time of the first delay circuit 402 will be described. In this case, before the transmission serial data signal TX_DATA rises, the output signal of the first delay circuit 402 is at the high level, and one of the inputs of the NOR circuit 404 receives input of a high level signal as in the case above described. That is, the output signal of the NOR circuit 404 is a low level signal. This output signal turns into a high level signal through the inverter circuit 406, and the high level signal is output to the gate of the p-type MOSFET 408. The inverter circuit 400 of which the input signal is at the high level after a rise of the transmission serial data signal TX_DATA outputs a low level signal to the first delay circuit 402. In this state, the output signal of the tristate buffer circuit 38 transitions to the high level, and the other input of the NOR circuit 404 receives input of a high level signal. Then, a signal that is output from the first delay circuit 402 transitions to the low level.

In this case, as above described, at least one of the two input signals of the NOR circuit 404 is a high level signal until the transmission serial data signal TX_DATA transitions from a low level signal to a high level signal. That is, a high level signal is continuously input into the gate of the p-type MOSFET 408.

The same effect is achieved in a case where the delay time of the first delay circuit 402 and the rise delay time of the output signal of the tristate buffer circuit 38 are approximately the same. That is, if the rise delay time of the output signal of the tristate buffer circuit 38 is a little larger than the delay time of the first delay circuit 402, such as in a case of load capacitance CL=10 pF, the output signal of the inverter circuit 406 tends to transition to the low level, but the voltage thereof does not fall and returns to the original state as illustrated by V1 in FIG. 16B since the time in which both inputs of the NOR circuit 404 receive input of low level signals is short.

This state of changing also applies to the delay time of the second delay circuit 412 and the rise delay time of the output signal of the tristate buffer circuit 38. Even if high level signals are input into both of the two inputs of the NAND circuit 414, a rise time until which the signal exceeds a threshold voltage of the n-type MOSFET 418 cannot be secured. That is, in this case, the gate of the n-type MOSFET 418 does not receive input of a signal that exceeds the gate threshold voltage as illustrated by V2 in FIG. 16B.

From these results, the rise time in the example of the related art and the rise time of the output signal of the data output buffer circuit 26 according to the present embodiment are approximately the same as illustrated by the graphs of FIG. 16A between 90 ns and 100 ns.

Next, a case where the load capacitance CL is large and the rise delay time of the output of the tristate buffer circuit 38 is sufficiently larger than the delay time of the first delay circuit 402 will be described. A sufficiently large delay time referred hereto means a delay time in which V1 is decreased to a voltage below the gate threshold voltage of the p-type MOSFET 408 as illustrated in FIG. 16D.

In this case, since the tristate buffer circuit 38 outputs a low level signal before the transmission serial data signal TX_DATA transitions to the high level, one of the two inputs of the NOR circuit 404 receives input of a low level signal. The other input receives input of a high level signal that is logically inverted from a low level signal through the inverter circuit 400. Since one of the two inputs of the NOR circuit 404 receives input of a high level signal, a high level signal is input into the gate of the p-type MOSFET 408.

In this state, if the transmission serial data signal TX_DATA transitions to the high level and a low level signal from the inverter circuit 400 is delayed by a predetermined time by the first delay circuit 402 and output, low level signals are input into both of the two inputs of the NOR circuit 404. In this case, since the time in which the output signal of the tristate buffer circuit 38 is at the low level is sufficiently long, the NOR circuit 404 outputs a high level signal. This high level output signal is logically inverted into a low level signal by the inverter circuit 406, and the low level signal is output to the gate of the p-type MOSFET 408.

If a low level signal is input into the gate of the p-type MOSFET 408, the p-type MOSFET 408 is turned ON. Thus, a current flows from the source thereof into the drain thereof. If the current flows, the potential of the signal output by the tristate buffer circuit 38 is increased by the load capacitance CL. As such, the drain current of the p-type MOSFET 408 assists a rise of the signal of the tristate buffer circuit 38. A low level signal is input into the gate of the p-type MOSFET 408. Thus, the rise time of the output signal in the present embodiment is smaller than the rise time of the output signal in the example of the related art as illustrated in FIG. 16C and FIG. 16D. In this case, since one of the two inputs of the NAND circuit 414 is at the low level, a low level signal is output to the gate of the n-type MOSFET 418.

Next, a case where the transmission serial data signal TX_DATA is output as a high level signal will be described. In this case, since the NOR circuit 404 receives input of a high level signal that is the output signal of the tristate buffer circuit 38, the output signal of the NOR circuit 404 is a low level signal. This low level output signal is logically inverted through the inverter circuit 406, and a high level signal is output to the gate of the p-type MOSFET 408. The NAND circuit 414 receives input of a low level signal. Thus, the output signal of the NAND circuit 414 is a high level signal, and a low level signal is input into the gate of the n-type MOSFET 418 through the inverter circuit 416. This state is illustrated in FIG. 16A to FIG. 16D between 120 ns and 130 ns.

Next, a case where the transmission serial data signal TX_DATA transitions from a high level signal to a low level signal will be described. In this case, the opposite effect to the above case where the transmission serial data signal TX_DATA changes from a low level signal to a high level signal is produced. That is, since one of the two inputs of the NOR circuit 404 receives input of a high level signal in a case where a fall delay time of the output of the tristate buffer circuit 38 is not smaller than the delay time of the first delay circuit, a high level signal is input into the gate of the p-type MOSFET 408. Even if the fall delay time of the output of the tristate buffer circuit 38 is smaller than the delay time of the first delay circuit, there is not sufficient time until the output of the NOR circuit 404 falls to the low level. Thus, a high level signal is continuously input into the gate of the p-type MOSFET 408 (as illustrated by V1 in FIG. 16B and FIG. 16D).

Meanwhile, when the fall delay time of the output of the tristate buffer circuit 38 is smaller than or approximately the same as the delay time of the second delay circuit 412, a high level signal is not input into the gate of the n-type MOSFET 418 (as illustrated by V2 in FIG. 16B).

However, if the fall delay time of the output of the tristate buffer circuit 38 is sufficiently larger than the delay time of the second delay circuit 412, a high level signal is input into the gate of the n-type MOSFET 418 (as illustrated by V2 in FIG. 16D). The n-type MOSFET 418 that receives input of a high level signal greater than the gate threshold voltage is turned ON, and a drain current flows from the output of the tristate buffer circuit 38 into the grounded source of the n-type MOSFET 418. Accordingly, the n-type MOSFET 418 assists a fall of the output signal of the tristate buffer circuit 38, and a fall of the output signal of the data output buffer circuit 26 occurs for a time shorter than that in the example of the related art as illustrated in FIG. 16C.

FIG. 17A and FIG. 17B are diagrams illustrating a relationship among the rise time Tr, the fall time Tf, and the load capacitance CL. Solid lines in FIG. 17A and FIG. 17B illustrate the rise time Tr and the fall time Tf of the output signal of the data output buffer circuit 26 according to the present embodiment, and broken lines illustrate the rise time Tr and the fall time Tf of the output signal of the tristate buffer in the related art. As illustrated in FIG. 17A and FIG. 17B, the rise time Tr and the fall time Tf of the output signal of the data output buffer circuit 26 according to the present embodiment are more stabilized than the rise time Tr and the fall time Tf of the output signal in the example of the related art.

The rise time Tr and the fall time Tf in the example of the related art are linearly increased as the load capacitance CL is increased. Meanwhile, the rise time Tr and the fall time Tf of the output signal of the data output buffer circuit 26 according to the second embodiment are stabilized approximately between 3 ns and 10 ns in FIG. 17A and FIG. 17B.

According to the second embodiment, adding the first additional circuit 40 to the tristate buffer of the related art allows an increase in the stability of the rise time Tr and the fall time Tf of the output signal from the data output buffer circuit 26. For example, as illustrated in FIG. 16C, while the rise time Tr and the fall time Tf are approximately 25 ns in the example of the related art, the rise time Tr and the fall time Tf of the second embodiment are approximately 5 ns.

If the load capacitance CL is small and the rise time Tr and the fall time Tf are small as illustrated in FIG. 16A, the rise time Tr and the fall time Tf of the output of the data output buffer circuit 26 according to the second embodiment are decreased compared with the example of the related art.

If, for example, allowable lengths of the rise time Tr and the fall time Tf are set between 3.5 ns and 10 ns, an allowable range of the load capacitance CL is approximately from 7.5 pF to 20 pF in the example of the related art (as illustrated in FIG. 17A and FIG. 17B). However, according to the second embodiment, the allowable range of the load capacitance CL is approximately from 7.5 pF to 88 pF for the same time length range as in the related art, and thus the load capacitance range can be significantly increased. That is, stabilized rise time Tr and the fall time Tf can be secured over a substantially wider range of the load capacitance CL.

First Modification Example of Second Embodiment

While the stabilized rise time Tr and the fall time Tf of the output signal can be secured in a wide range of the load capacitance CL in the second embodiment above described, the rise time Tr and the fall time Tf may still vary according to a change in temperature. Thus, the data output buffer circuit 26 according to the present modification example is intended to secure a further stabilized rise time Tr and a fall time Tf by controlling temperature characteristics of the resistors thereof. Hereinafter, differences from the second embodiment will be described.

The data output buffer circuit 26 according to the present modification example has the same configuration as the data output buffer circuit 26 of the second embodiment illustrated in FIG. 15. However, temperature characteristics of the first resistor R1 in the first delay circuit and the second resistor R2 in the second delay circuit in the first additional circuit 40 are controlled in the present modification example. Hereinafter, in a simulation performed in the present modification example, parameters other than the first resistor R1, the second resistor R2, the p-type MOSFET 394, and the n-type MOSFET 396 are assumed to be the same as the parameters of the second embodiment. More specifically, the gate widths of the p-type MOSFET 394 and the n-type MOSFET 396 are set to 180 um to 380 um.

Figure 18A:
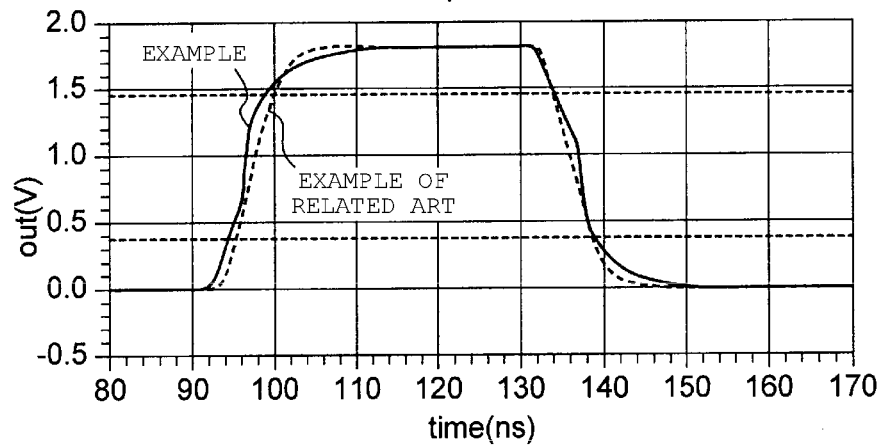
FIGS. 18A and 18B are graphs illustrating a waveform of an output signal and the like in a first modification example of the second embodiment.
Figure 18B:
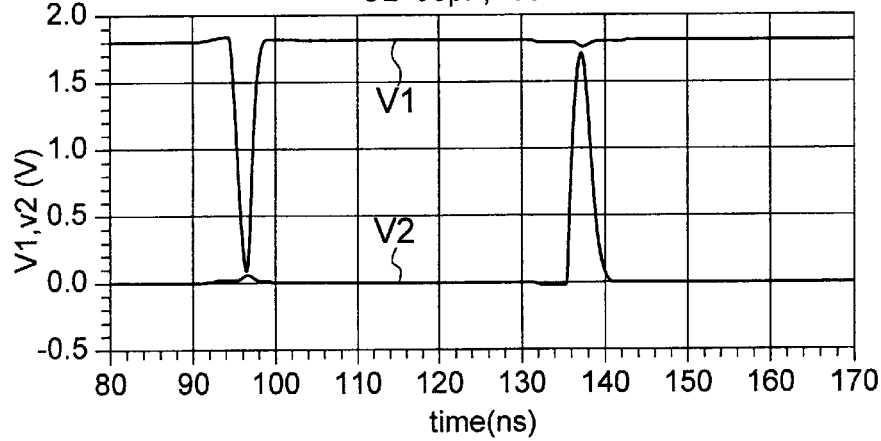

FIG. 18A and FIG. 18B are diagrams illustrating a rise and a fall of the output signal, a signal (V1) that is input into the gate of the p-type MOSFET 408, and a signal (V2) that is input into the gate of the n-type MOSFET 418 in a case where temperature coefficients of resistance of the first resistor R1 and the second resistor R2 are set to negative values. A resistor having a negative temperature coefficient means a resistor having a resistance value that decreases as a temperature increases.

A solid line in FIG. 18A illustrates the output signal of the data output buffer circuit 26 at load capacitance CL=50 pF in the present modification example, and a broken line illustrates the output signal of the tristate buffer at load capacitance CL=50 pF in the related art. The example of the related art in FIG. 18A and the example of the related art in FIG. 16C have different circuit constants. While the example of the related art in FIG. 16C is designed assuming that the load capacitance CL is small, the example of the related art in FIG. 18A is designed assuming that the load capacitance CL is large. Thus, from comparison of FIG. 18B with FIG. 16D, peaks appear more clearly in the signals in the present modification example.

The difference between the signals output in the present modification example and in the example of the related art is small as illustrated in FIG. 18A. That is, a small difference exists between the rise time Tr and the fall time Tf in the present modification example and the rise time Tr and the fall time Tf in the example of the related art at load capacitance CL=50 pF. However, as in the second embodiment, the output buffer circuit 26 according to the present modification example has little dependency on the load capacitance as compared with the example of the related art.

The pulse widths of the signals illustrated by the voltages V1 and V2 are controlled by the first delay circuit 402 and the second delay circuit 412. The pulse widths are increased as the resistance values of the first resistor R1 and the second resistor R2 are decreased, and the time in which the p-type MOSFET 408 and the n-type MOSFET 418 are turned ON is increased. Since the first resistor R1 and the second resistor R2 have negative temperature coefficients in the present modification example, if a temperature increases, the delay times of the first delay circuit 402 and the second delay circuit 412 are decreased, and the pulse widths are increased.

In general, if a temperature increases, the carrier mobility of a MOSFET is decreased, and the rise time Tr and the fall time Tf of the output signal are increased. However, according to the present modification example, if a temperature increases, the resistance values of the first resistor R1 and the second resistor R2 are decreased, and as a consequence, the delay times of the first delay circuit 402 and the second delay circuit 412 are decreased. That is, since an increase in temperature increases the time in which the p-type MOSFET 408 and the n-type MOSFET 418 are turned ON, increases in the rise time Tr and the fall time Tf can be suppressed.

Figure 19A:
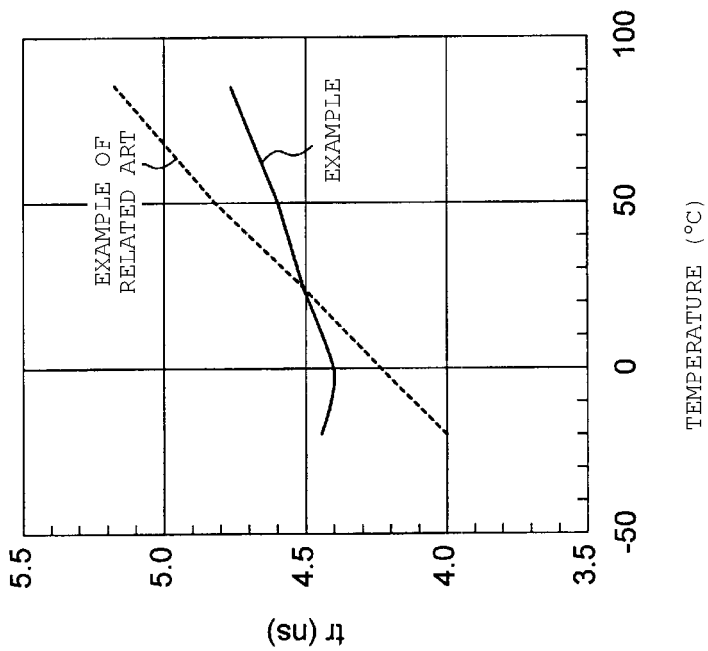
FIGS. 19A and 19B are graphs illustrating a relationship between a rise time and the like of an output signal and a temperature in the first modification example of the second embodiment.
Figure 19B:
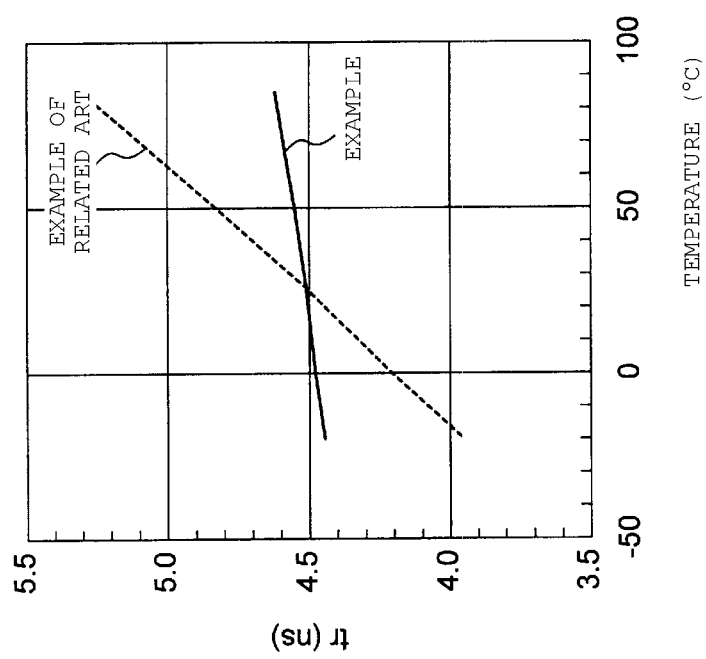

FIG. 19A and FIG. 19B are diagrams illustrating a relationship among the rise time Tr, the fall time Tf, and the temperature of the resistors at load capacitance CL=50 pF. Broken lines illustrate the output of the tristate buffer in the related art, and solid lines illustrate the output in the present modification example. It is understood from FIG. 19A and FIG. 19B that as the temperature increases, the rise time Tr and the fall time Tf change at a quite steep inclination in the example of the related art. In comparison, the rise time Tr and the fall time Tf of the output signal of the data output buffer circuit 26 according to the present modification example have a more gradual relationship between the temperature and the time. That is, the rise time Tr and the fall time Tf of the output signal are more stable with changes in the temperature.

According to the present modification example, adding the first additional circuit 40 to the tristate buffer of the related art allows an increase in the stability of the rise time Tr and the fall time Tf of the output signal of the data output buffer circuit 26. Furthermore, according to the present modification example, using resistors having a negative temperature characteristic value as the first resistor R1 and the second resistor R2 allows a more stabilized signal to be output while suppressing variations in the rise time Tr and the fall time Tf of the output signal due to a temperature.

Second Modification Example of Second Embodiment

While more stabilized rise time Tr and the fall time Tf can be secured by controlling temperature characteristics of the resistors constituting the delay circuits in the modification example above described, a further stabilization in rise time Tr and a fall time Tf can be secured by including a second additional circuit (second supplemental circuit) and an output resistor having negative temperature characteristics as in the present modification example.

Figure 20:
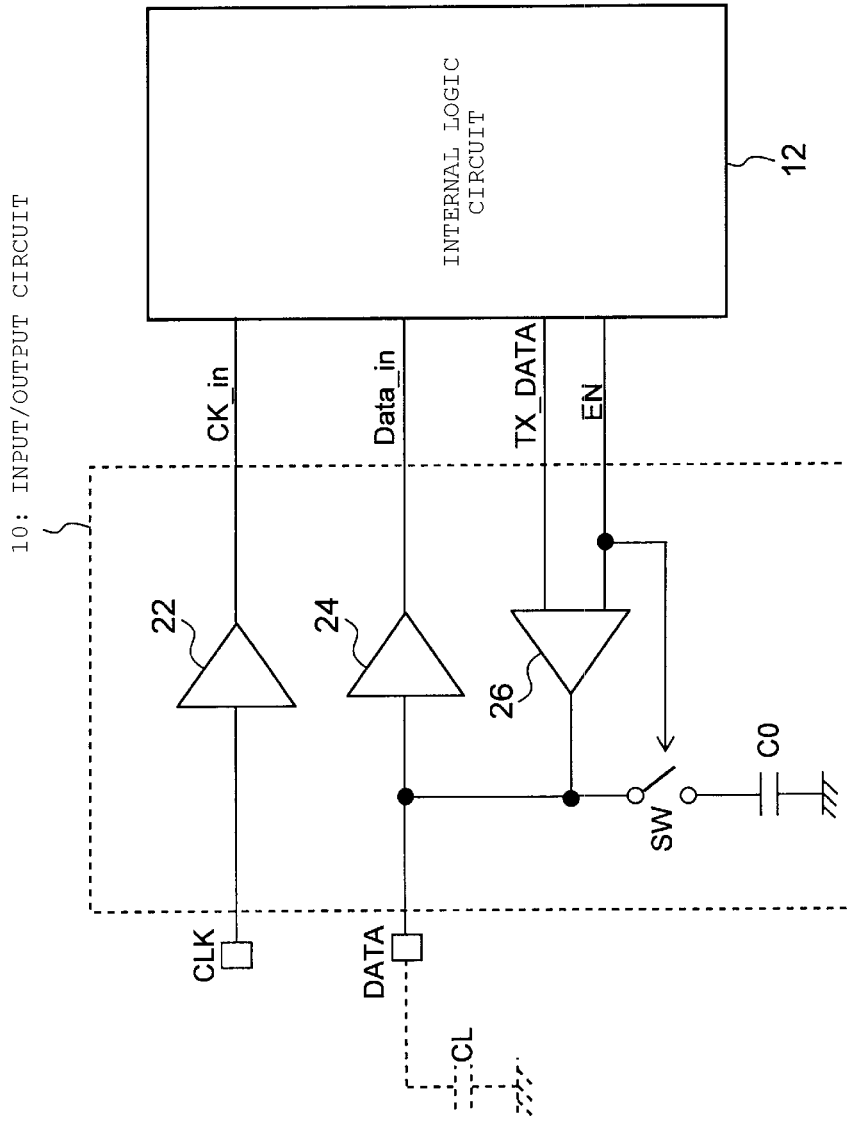
FIG. 20 is a schematic diagram of a part of a high frequency switch circuit in which a semiconductor integrated circuit according to a second modification example of the second embodiment is used.

FIG. 20 is a circuit diagram illustrating the input/output circuit 10 of a semiconductor integrated circuit according to the present modification example. The difference from the above embodiments resides in the inclusion of a switch SW and a capacitor C0.

The switch SW is provided between the output of the data output buffer circuit 26 and the capacitor C0. The switch SW is switched ON and OFF according to the enable signal EN. More specifically, the switch SW is turned ON (closed) if the enable signal EN is at the high level or is turned OFF (opened) if the enable signal EN is at the low level.

The capacitor C0 has one electrode connected to the switch SW and another electrode grounded. The capacitor C0 functions as a load capacitance of the data output buffer circuit 26 in a case where the enable signal EN is at the high level. In this case, the load capacitance as a whole is the total capacitance of load capacitor CL+capacitor C0.

Figure 21:
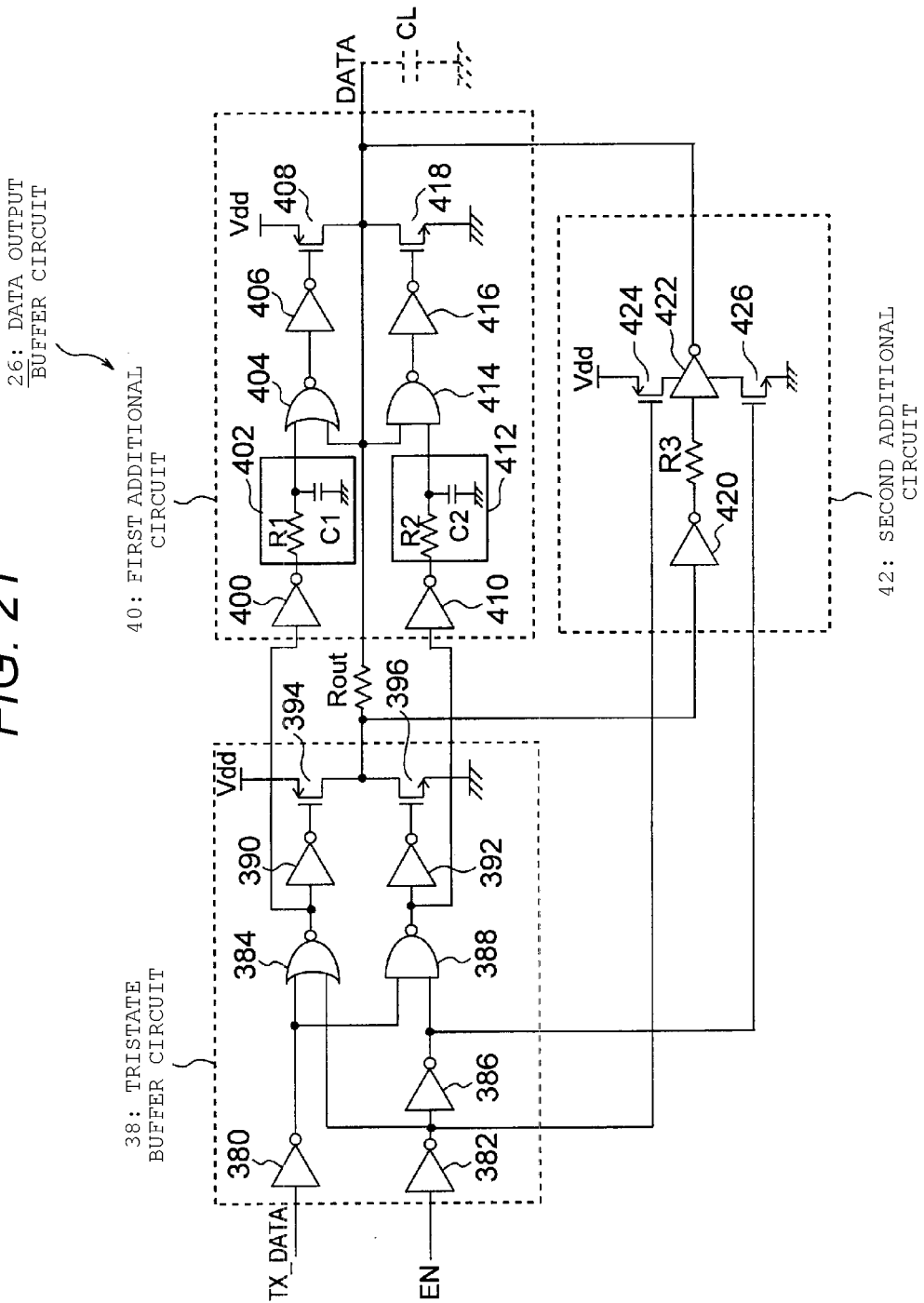
FIG. 21 is a circuit diagram of a semiconductor integrated circuit according to the second modification example of the second embodiment.

FIG. 21 is a circuit diagram illustrating a configuration of the data output buffer circuit 26 that corresponds to the semiconductor integrated circuit according to the present modification example. An output resistor Rout and a second additional circuit (second supplemental circuit) 42 are further provided in the configuration of the data output buffer circuit 26 that corresponds to the semiconductor integrated circuit according to the above embodiments. The output resistor Rout has negative temperature characteristics and is provided between the output of the tristate buffer circuit 38 and the data output buffer circuit 26.

The second additional circuit 42 is disposed in parallel with a circuit including the output resistor Rout and the first additional circuit 40 and is intended to increase the stability of the rise time Tr and the fall time Tf. The second additional circuit 42 includes inverter circuits 420 and 422, a p-type MOSFET 424, an n-type MOSFET 426, and a third resistor R3.

The inverter circuit 420 has an input connected to the drains of the p-type MOSFET 394 and the n-type MOSFET 396 and logically inverts a signal output by the tristate buffer circuit 38. The third resistor R3 is intended to control the strength of the output signal of the inverter circuit 420 and is connected to the inverter circuits 420 and 422. The inverter circuit 422 is configured with a tristate buffer. The inverter circuit 422 logically inverts a signal output from the third resistor R3 and outputs the inverted signal on the basis of an input control signal. The inverter circuit 422 has an input connected to the third resistor R3 and an output connected to the drain of the p-type MOSFET 408 and the drain of the n-type MOSFET 418. The inverter circuit 422 is connected to the p-type MOSFET 424 and the n-type MOSFET 426 from which the control signal is input.

The p-type MOSFET 424 and the n-type MOSFET 426 control the inverter circuit 422. The p-type MOSFET 424 has a gate connected to the inverter circuit 382, a source connected to the power supply Vdd, and a drain connected to the inverter circuit 422. The n-type MOSFET 426 has a gate connected to the inverter circuit 386, a grounded source, and a drain connected to the inverter circuit 422.

Next, the operation of the data output buffer circuit 26 according to the present modification example will be described. The tristate buffer circuit 38 and the first additional circuit 40 have the same operation as the tristate buffer circuit 38 and the first additional circuit 40 in the second embodiment. The output signal of the tristate buffer circuit 38 is input into the first additional circuit 40 through the output resistor Rout. In general, a resistance value of a MOSFET has positive temperature characteristics. The output resistor Rout has negative temperature characteristics and compensates for the positive temperature characteristics of the resistance values of other circuit elements, particularly, the p-type MOSFET 408 and the n-type MOSFET 418 of the MOSFETs provided in the data output buffer circuit 26 when the temperature of the circuit increases.

If the enable signal EN is at the low level, a high level signal is input into the gate of the p-type MOSFET 424 of the second additional circuit 42, and a low level signal is input into the gate of the n-type MOSFET 426. That is, in this case, the inverter circuit 422 that is configured with a tristate buffer is in a high impedance state, and the input thereof is disconnected from the output thereof. Conversely, if the enable signal EN is at the high level, both of the p-type MOSFET 424 and the n-type MOSFET 426 are turned ON.

In this state, the inverter circuit 420 logically inverts the output signal of the tristate buffer circuit 38 and outputs the inverted signal. The output signal of the inverter circuit 420 is input into the inverter circuit 422 after the voltage of the output signal is decreased by the third resistor R3. Since the enable signal EN is turned ON, the inverter circuit 422 outputs the input signal, that is, a signal corresponding to the output signal of the tristate buffer circuit 38 after passing through the third resistor R3.

The output of the inverter circuit 422 is connected to the output of the tristate buffer circuit 38 through the output resistor Rout and to the drains of the p-type MOSFET 408 and the n-type MOSFET 418. As a consequence, a signal in which the output signal of the inverter circuit 422, the output signal from the output resistor Rout, and the output signals from the drains of the p-type MOSFET 408 and the n-type MOSFET 418 are combined is output as the output signal of the data output buffer circuit 26.

Next, the rise time Tr and the fall time Tf of the output signal of the data output buffer circuit 26 will be described. Hereinafter, as in the above embodiments, the gate widths of the MOSFETs constituting the gate elements in the tristate buffer circuit 38, the gate widths of the MOSFETs constituting the gate elements in the first additional circuit 40, and the gate widths of the MOSFETs constituting the inverter circuit 420, excluding the p-type MOSFETs 394 and 408 and the n-type MOSFETs 396 and 418, are set to 1 um to 10 um in a simulation. The gate widths of the p-type MOSFETs 394 and 408 and the gate widths of the n-type MOSFETs 396 and 418 are set to 200 um to 550 um, and the gate widths of the MOSFETs constituting the inverter circuit 422 are set to 30 um to 40 um. The resistance value of the output resistor Rout is set to 80Ω, and the resistance values of the other resistors R1, R2, and R3 are set to 10 kΩ to 15 kΩ.

Figure 22A:
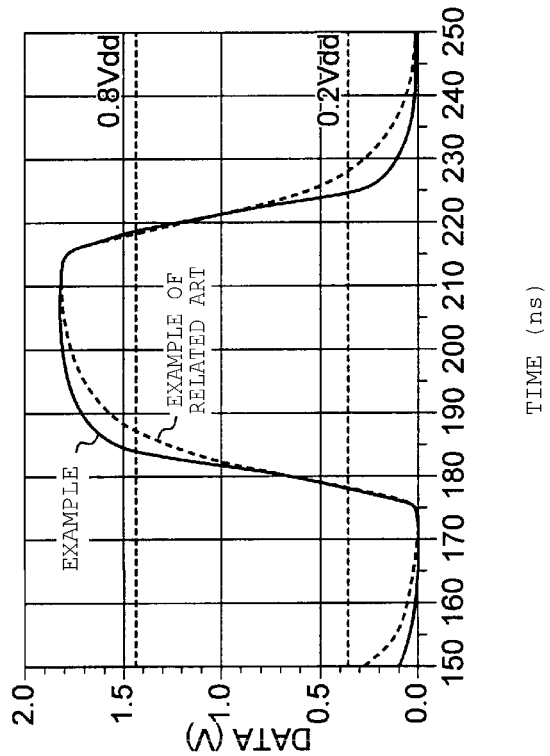
FIGS. 22A and 22B are graphs illustrating a waveform of an output signal in the second modification example of the second embodiment.
Figure 22B:
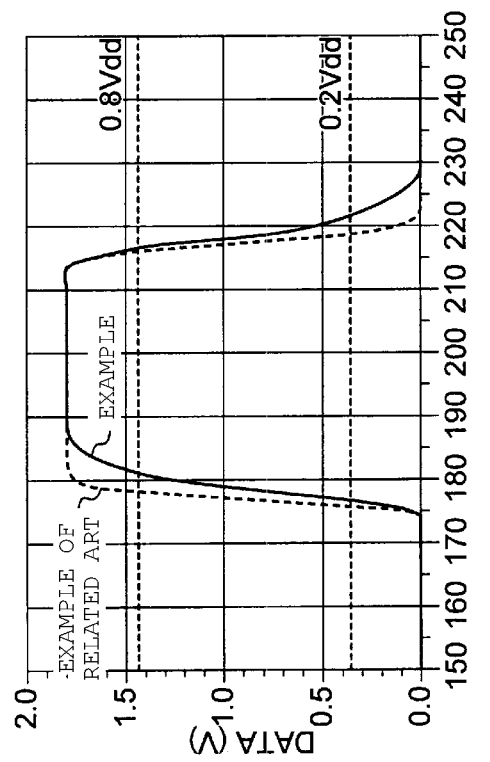

FIG. 22A and FIG. 22B are diagrams illustrating a rise and a fall of the output signal in the example of the related art and in the present modification example in a case where the enable signal EN is at the high level. Broken lines illustrate the output signal of the tristate buffer in the example of the related art, and solid lines illustrate the output waveform of the data output buffer circuit 26 according to the present modification example.

FIG. 22A illustrates output waveforms at load capacitance CL=5 pF. As illustrated in FIG. 22A, the signal output by the data output buffer circuit 26 according to the present modification example has the rise time Tr and the fall time Tf larger than the rise time Tr and the fall time Tf of the output signal in the example of the related art. The reason is that the second additional circuit 42 has the effect of retaining output data, much like the operation of a type of flip-flop circuit. This effect has relatively significant influence because the rise time Tr and the fall time Tf are smaller. Thus, an excessive decrease in the rise time Tr and the fall time Tf is suppressed.

FIG. 22B illustrates output waveforms at a comparatively large load capacitance, load capacitance CL=55 pF. As illustrated in FIG. 22B, the signal output by the data output buffer circuit 26 according to the present modification example has the rise time Tr and the fall time Tf smaller than the rise time Tr and the fall time Tf of the output signal in the example of the related art. This difference is due to the effect of the first additional circuit 40. That is, the p-type MOSFET 408 is rapidly turned ON at the timing of a rise of a signal, and the n-type MOSFET 418 is rapidly turned ON at the timing of a fall of a signal. The time in which the p-type MOSFET 408 and the n-type MOSFET 418 are turned ON is increased as the rise time Tr and the fall time Tf are increased. Thus, the effect of suppressing an increase in the rise time Tr and the fall time Tf is achieved.

Figure 23A:
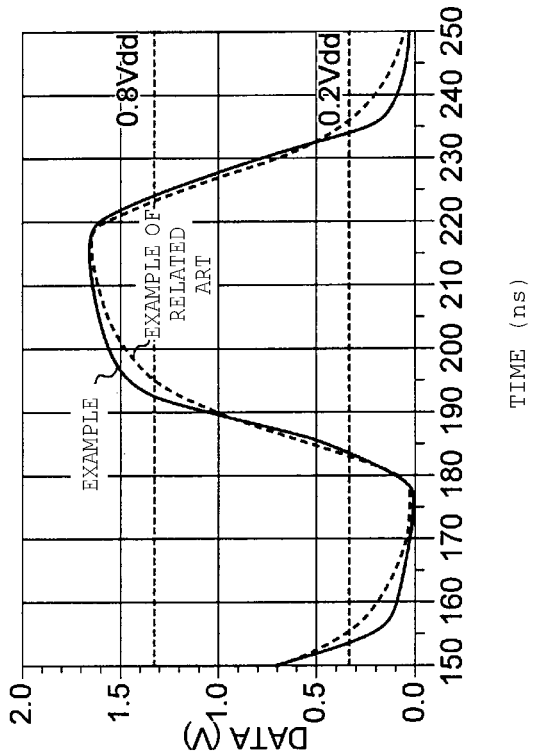
FIGS. 23A and 23B are graphs illustrating a waveform of an output signal in the second modification example of the second embodiment.
Figure 23B:
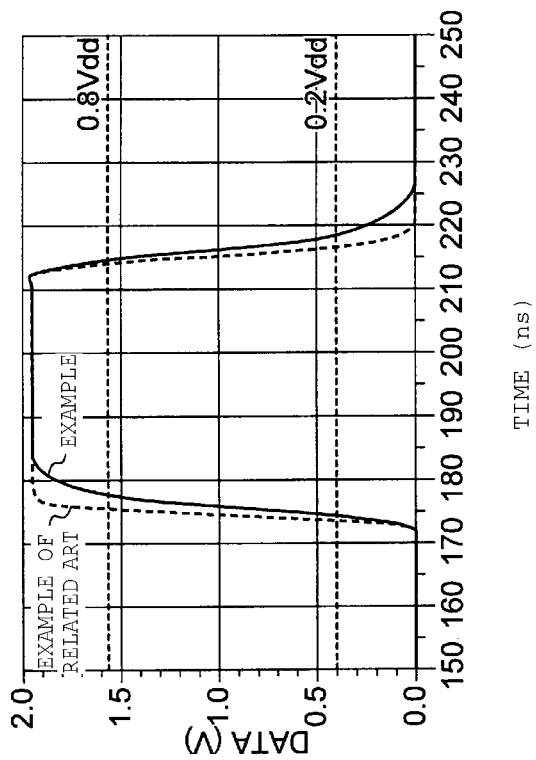

FIG. 23A and FIG. 23B are diagrams illustrating output waveforms with small lengths of the rise time Tr and the fall time Tf and with large lengths of the rise time Tr and the fall time Tf in a case where influence of variations in temperature dependency, power supply voltage dependency, and device characteristics of the output of the data output buffer circuit 26 is taken into account. FIG. 23A and FIG. 23B respectively illustrate output waveforms in a case of the smallest rise time Tr and the fall time Tf and in a case of the largest rise time Tr and the fall time Tf, assuming that the range of the load capacitance CL is 0 pF to 55 pF, the temperature of the circuit is −10° C. to 85° C., the power supply voltage is 1.65 V to 1.95 V, the range of a change in the resistivity of MOSFETs is −15% to +15%, the range of a change in the threshold of an n-type MOSFET is −100 mV to +100 mV, and the range of a change in the threshold of a p-type MOSFET is −150 mV to 150 mV.

FIG. 23A illustrates output waveforms when the rise time Tr and the fall time Tf are the smallest within the above ranges, that is, at the time of load capacitance CL+C0=5 pF, Vdd=1.95 V, temperature=−10° C., change in threshold of n-type MOSFET=−100 mV, change in threshold of p-type MOSFET=−150 mV, and resistivity of MOSFET=−15%. As illustrated in FIG. 23A, while the rise time Tr and the fall time Tf are below 3.5 ns in the example of the related art, the rise time Tr is 3.65 ns, and the fall time Tf is 3.52 ns in the present modification example.

FIG. 23B illustrates output waveforms when the rise time Tr and the fall time Tf are the largest within the above ranges, that is, at the time of load capacitance CL+C0=55 pF, Vdd=1.65 V, temperature=+85° C., change in threshold of n-type MOSFET=+100 mV, change in threshold of p-type MOSFET=+150 mV, and resistivity of MOSFET=+15%. As illustrated in FIG. 23B, while the rise time Tr and the fall time Tf are above 10 ns in the example of the related art, the rise time Tr is 8.99 ns, and the fall time Tf is 9.51 ns in the present modification example.

According to the present modification example heretofore described, adding the first additional circuit 40 to the tristate buffer of the related art allows an increase in the stability of the rise time Tr and the fall time Tf of the output signal of the data output buffer circuit 26. Furthermore, according to the present modification example, the second additional circuit 42 suppresses an excessive decrease in the rise time Tr and the fall time Tf, and more stabilized times can be secured. For example, in a case of desiring to set the ranges of the rise time Tr and the fall time Tf to the range of 3.5 ns to 10 ns, according to the present modification example, a stabilized output signal can be secured regardless of variations in temperature, power supply voltage, and each circuit element.

Third Embodiment

While the stabilized rise time Tr and the fall time Tf of the output signal can be secured in a wide range of the load capacitance CL in the second embodiment above described, a semiconductor integrated circuit according to the third embodiment is intended to secure the stabilized rise time Tr and the fall time Tf in a wider range of the load capacitance CL with a simpler circuit than in the second embodiment.

Figure 24:
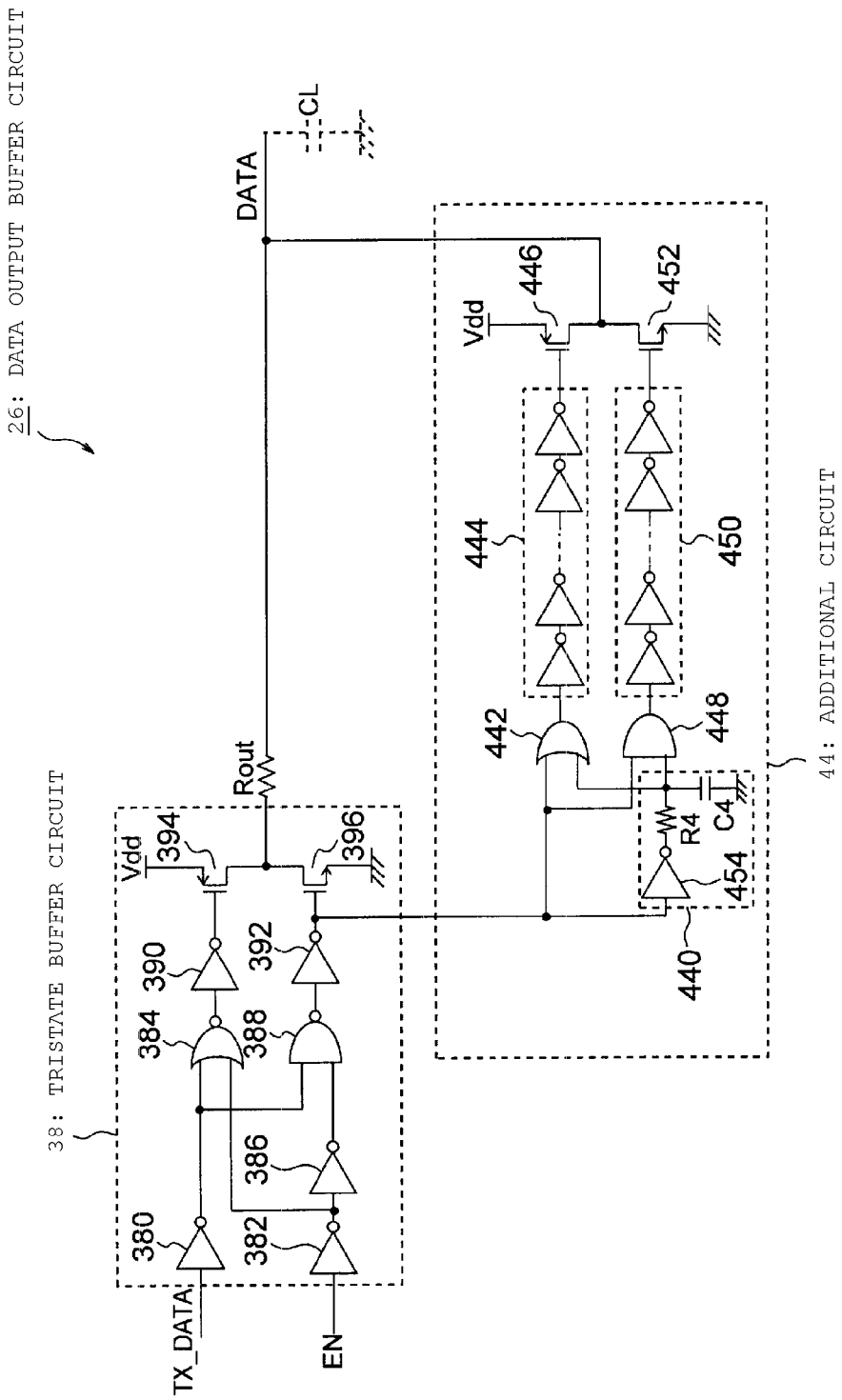
FIG. 24 is a circuit diagram of a semiconductor integrated circuit according to a third embodiment.

FIG. 24 is a circuit diagram illustrating the data output buffer circuit 26 that corresponds to the semiconductor integrated circuit according to the third embodiment. As illustrated in FIG. 24, the data output buffer circuit 26 according to the third embodiment includes the tristate buffer circuit 38, an additional circuit (supplemental circuit) 44, and the output resistor Rout. The tristate buffer circuit 38 has the same configuration as the tristate buffer circuit 38 according to the second embodiment.

The additional circuit 44 assists a rise and a fall of the transmission serial data signal TX_DATA in a case of a rise and a fall of the signal. The additional circuit 44 includes a logic inverter delay circuit 440, an OR circuit 442, a first delay circuit 444, a p-type MOSFET 446, an AND circuit 448, a second delay circuit 450, and an n-type MOSFET 452.

The logic inverter delay circuit 440 has an input connected to the output of the inverter circuit 392 of the tristate buffer circuit 38. The logic inverter delay circuit 440 delays an additional circuit input signal, which is input, by a predetermined time, logically inverts the delayed signal, and outputs the logically inverted delayed signal. The logic inverter delay circuit 440 includes an inverter circuit 454, a resistor R4, and a capacitor C4. The inverter circuit 454 logically inverts an input signal and outputs the inverted signal and has an input connected to the inverter circuit 392. The resistor R4 is connected to the inverter circuit 454. The capacitor C4 has one electrode connected to the resistor R4 and another electrode grounded. The resistor R4 and the capacitor C4 constitute a low-pass filter that is switched ON and OFF at an arbitrary threshold to delay an input signal by a predetermined time.

The OR circuit 442 receives input of the additional circuit input signal and the logically inverted delayed signal and calculates a logical sum thereof. The OR circuit has inputs connected to the inverter circuit 392 and the logic inverter delay circuit 440. The first delay circuit 444 delays an input signal by a predetermined time and has an input connected to the output of the OR circuit 442. The p-type MOSFET 446 has a source connected to the power supply Vdd, a gate connected to the output of the delay circuit 444, and a drain connected to the n-type MOSFET 452.

The AND circuit 448 receives input of the additional circuit input signal and the logically inverted delayed signal and calculates a logical product thereof. The AND circuit 448 has inputs thereof connected to the inverter circuit 392 and the logic inverter delay circuit 440. The second delay circuit 450 delays an input signal by a predetermined time and has an input thereof connected to the output of the AND circuit 448. The n-type MOSFET 452 has a grounded source, a gate connected to the output of the delay circuit 450, and a drain connected to the p-type MOSFET 446. The additional circuit 44 assists a rise and a fall of the output signal from the commonly connected drains of the p-type MOSFET 446 and the n-type MOSFET 452.

Next, the operation of the data output buffer circuit 26 according to the third embodiment will be described. The additional circuit input signal that is input into the additional circuit 44 corresponds to a logical product of the logically negated transmission serial data signal TX_DATA and the enable signal EN if logical calculations are performed in accordance with the circuit diagram illustrated in FIG. 24. That is, if the enable signal EN is at the low level, a low level signal is output. If the enable signal EN is at the high level and the transmission serial data signal TX_DATA is at the low level, a high level signal is output. If the enable signal EN is at the high level and the transmission serial data signal TX_DATA is at the high level, a low level signal is output.

At first, a case where the enable signal EN is at the low level will be described. In this case, the additional circuit input signal is a low level signal, and the logically inverted delayed signal is a high level signal. These signals do not change even when the transmission serial data signal TX_DATA transitions from the low level to the high level or from the high level to the low level. The OR circuit 442 that receives input of the low level additional circuit input signal and the high level logically inverted delayed signal outputs a high level signal, and the output signal is input into the gate of the p-type MOSFET 446 through the delay circuit 444. The p-type MOSFET 446 of which the gate receives input of the high level signal is turned OFF and does not output a current from the drain thereof.

Meanwhile, the AND circuit 448 that receives input of the low level additional circuit input signal and the high level logically inverted delayed signal outputs a low level signal, and the output signal is input into the gate of the n-type MOSFET 452 through the delay circuit 450. The n-type MOSFET 452 of which the gate receives input of the low level signal is turned OFF and does not output a current from the drain thereof. That is, in this case, the additional circuit 44 does not output a signal.

Next, a case where the enable signal EN is at the high level will be described. In this case, the value of the additional circuit input signal changes according to the value of the transmission serial data signal TX_DATA. At first, if the transmission serial data signal TX_DATA is at the low level, the additional circuit input signal is a high level signal, and the logically inverted delayed signal is a low level signal. The effects of the OR circuit 442 and the AND circuit 448, each having two inputs respectively at the low level and the high level, are the same as above described, and the additional circuit 44 does not output a signal.

In this state, if the transmission serial data signal TX_DATA transitions from the low level to the high level, the additional circuit input signal changes to the low level, while the logically inverted delayed signal is continuously maintained at the low level until the delay time of the logic inverter delay circuit 440 elapses. In this case, the output of the AND circuit 448 does not change from the low level. However, both of the two input signals of the OR circuit 442 are at the low level during the elapsing of the delay time of the logic inverter delay circuit 440, and thus, the OR circuit 442 outputs a low level signal.

As a consequence, a high level signal is input into the gate of the p-type MOSFET 446 until the elapsing of the delay time of the delay circuit 444, and if the delay time of the delay circuit 444 elapses, a low level signal is input into the gate of the p-type MOSFET 446, and the p-type MOSFET 446 is turned ON. If the p-type MOSFET 446 is turned ON, a current flows from the source of the p-type MOSFET 446 to the drain thereof. In this case, the current output by the additional circuit 44 flows into the output of the tristate buffer circuit 38. That is, if a rise of the signal of the tristate buffer circuit 38 is delayed by a time longer than the delay time of the delay circuit 444, a current is output to assist the rise of the signal of the tristate buffer circuit 38.

This state continues from the elapsing of the delay time of the delay circuit 444 until the elapsing of the delay time of the logic inverter delay circuit 440. After the delay time of the logic inverter delay circuit 440 elapses, the logically inverted delayed signal transitions from a low level signal to a high level signal. As a consequence, the signal output by the OR circuit 442 transitions to the high level, the high level signal is input into the gate of the p-type MOSFET 446 after the elapsing of the delay time of the delay circuit 444, and the p-type MOSFET 446 is turned OFF and prevents flow of a drain current.

That is, the additional circuit 44 outputs a signal that assists the output of the tristate buffer circuit 38 after the delay time of the delay circuit 444 elapses from transition of the transmission serial data signal TX_DATA from the low level to the high level. Then, the additional circuit 44 stops outputting the assisting signal after the delay time of the logic inverter delay circuit 440 elapses from the timing at which the assisting signal is output.

Next, a case where the transmission serial data signal TX_DATA is at the high level will be described. In this case, a low level signal and a high level signal are input into the OR circuit 442 and the AND circuit 448. Thus, the same effect as the above case where the transmission serial data signal TX_DATA is at the low level is achieved. That is, both of the p-type MOSFET 446 and the n-type MOSFET 452 are turned OFF, and the additional circuit 44 does not output a signal.

In this state, if the transmission serial data signal TX_DATA transitions from the high level to the low level, the additional circuit input signal changes to the high level, while the logically inverted delayed signal is continuously maintained at the high level until the delay time of the logic inverter delay circuit 440 elapses. In this case, the output of the OR circuit 444 does not change from the high level. However, both of the two input signals of the AND circuit 448 are at the high level during the elapsing of the delay time of the logic inverter delay circuit 440, and thus, the AND circuit 448 outputs a high level signal.

As a consequence, a low level signal is input into the gate of the n-type MOSFET 452 until elapsing of the delay time of the delay circuit 450, and if the delay time of the delay circuit 450 elapses, a high level signal is input into the gate of the n-type MOSFET 452, and the n-type MOSFET 452 is turned ON. If the n-type MOSFET 452 is turned ON, a current flows from the drain of the n-type MOSFET 452 to the source thereof. In this case, if a fall of the signal of the tristate buffer circuit 38 is delayed by a time longer than the delay time of the delay circuit 450, a current that assists the fall of the signal of the tristate buffer circuit 38 flows into the ground through the n-type MOSFET 452.

This state continues from the elapsing of the delay time of the delay circuit 450 until the elapsing of the delay time of the logic inverter delay circuit 440. After the delay time of the logic inverter delay circuit 440 elapses, the logically inverted delayed signal transitions from a high level signal to a low level signal. As a consequence, the signal output by the AND circuit 448 transitions to the low level, the low level signal is input into the gate of the n-type MOSFET 452 after the elapsing of the delay time of the delay circuit 450, and the n-type MOSFET 452 is turned OFF and prevents flow of the drain current.

That is, the additional circuit 44 allows the drain current that assists the output of the tristate buffer circuit 38 to flow into the ground after the delay time of the delay circuit 450 elapses from transition of the transmission serial data signal TX_DATA from the high level to the low level. Then, the additional circuit 44 stops the flow of the assisting drain current after the delay time of the logic inverter delay circuit 440 elapses from the timing at which the assisting drain current starts to flow into the ground.

Hereinafter, an example of the output waveform and the like of the data output buffer circuit 26 in the present embodiment will be described with reference to FIG. 24 and each of FIGS. 25A to 25F below illustrated. Each of FIGS. 25A to 25F is a graph illustrating an output signal and the like. In FIGS. 25A to 25F, the threshold voltages of the p-type MOSFETs 394 and 446 are set to −0.5 V, the threshold voltages of the n-type MOSFETs 396 and 452 are set to 0.5 V, the gate widths of the p-type MOSFET 394 and 446 are set to 200 um to 400 um, and the gate widths of the n-type MOSFETs 396 and 452 are set to 100 um to 200 um, with power supply voltage Vdd=1.8 V. FIGS. 25A to 25F are graphs when the transmission serial data signal TX_DATA is a rectangular wave having a pulse width of 80 ns that rises at the timing of 120 ns and falls at the timing of 200 ns. Broken lines illustrate the waveform of the output signal in a circuit configured with the tristate buffer circuit 38 and the output resistor Rout in the example of the related art, and solid lines illustrate the waveform of the output signal from a circuit obtained by adding the additional circuit 44 to the circuit in the example of the related art.

FIGS. 25A to 25C are graphs respectively illustrating the waveform of the output signal of the data output buffer circuit 26, the waveform of the output signal V1 of the delay circuit 444, and the waveform of the output signal V2 of the delay circuit 450 in a case where the load capacitance CL is small (CL=50 pF). As illustrated in FIG. 25A, if the load capacitance CL is small, the rise time Tr and the fall time Tf of the output signal are sufficiently small in the example of the related art. Thus, there is approximately no difference between the graphs of the third embodiment and the example of the related art.

The delay circuit 444 outputs a negative direction pulse signal of a certain width at a time delayed by a predetermined time (5 ns to 6 ns) from the timing at which the transmission serial data signal TX_DATA rises (120 ns) as illustrated in FIG. 25B. As above described, this predetermined time is equal to the delay time of the logic inverter delay circuit 440, and the pulse width corresponds to the delay time of the delay circuit 444. The delay circuit 450 outputs a positive direction pulse signal of a certain width at a time delayed by a predetermined time from the timing at which the transmission serial data signal TX_DATA falls (200 ns) as illustrated in FIG. 25C. As in the case of FIG. 25B, the delay time from 200 ns until the rise of V2 is equal to the delay time of the logic inverter delay circuit 440, and the pulse width corresponds to the delay time of the delay circuit 450.

FIGS. 25D to 25F are graphs respectively illustrating the waveform of the output signal of the data output buffer circuit 26, the waveform of the output signal V1 of the delay circuit 444, and the waveform of the output signal V2 of the delay circuit 450 in a case where the load capacitance CL is large (CL=350 pF). If the load capacitance CL is large, the rise time Tr and the fall time Tf of the signal output by the data output buffer circuit 26 are increased as illustrated in FIG. 25D, and sufficiently small lengths, for example, 10 ns, of the rise time Tr and the fall time Tf cannot be secured. Therefore, the additional circuit 44 assists the rise and the fall of the output signal, and sufficiently small lengths of the rise time Tr and the fall time Tf can be secured as illustrated by the solid line in FIG. 25D.

The rise of the signal is assisted by the output signal V1 of the delay circuit 444 as illustrated in FIG. 25E. That is, the p-type MOSFET 446 is turned ON at the timing delayed by a predetermined time (delay time of the logic inverter delay circuit 440) from the timing of the rise of the transmission serial data signal TX_DATA and allows a drain current to flow into the signal output by the tristate buffer circuit 38, thereby assisting the rise of the signal. The solid line in FIG. 25D rapidly changes at the time of the rise of the negative direction pulse signal in FIG. 25E and gradually changes at the time of the fall of the pulse signal.

The fall of the signal is assisted by the output signal V2 of the delay circuit 450 as illustrated in FIG. 25F. That is, the n-type MOSFET 452 is turned ON at the timing delayed by a predetermined time (delay time of the logic inverter delay circuit 440) from the timing of the fall of the transmission serial data signal TX_DATA and allows a drain current to flow from the signal output by the tristate buffer circuit 38 into the ground, thereby assisting the fall of the signal. The solid line in FIG. 25D rapidly changes at the time of the rise of the pulse signal in FIG. 25F and gradually changes at the time of the fall of the pulse signal.

Figure 26A:
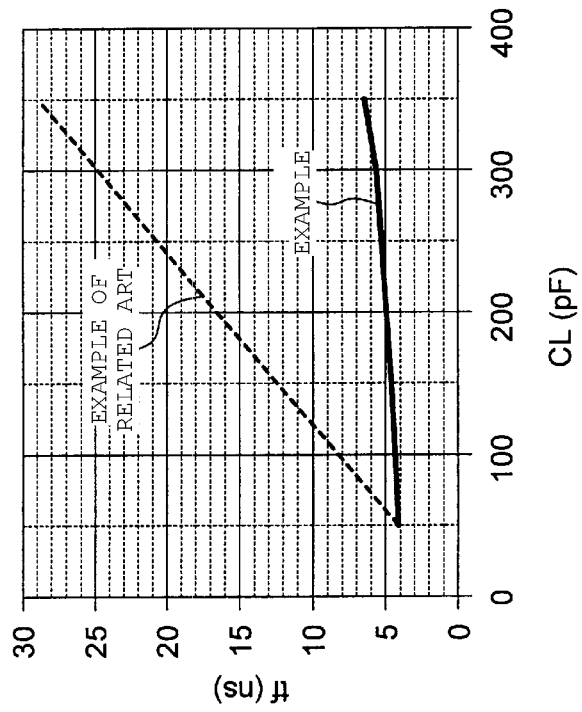
FIGS. 26A and 26B are graphs illustrating a relationship between a rise time and the like of an output signal and a load capacitance in the third embodiment.
Figure 26B:
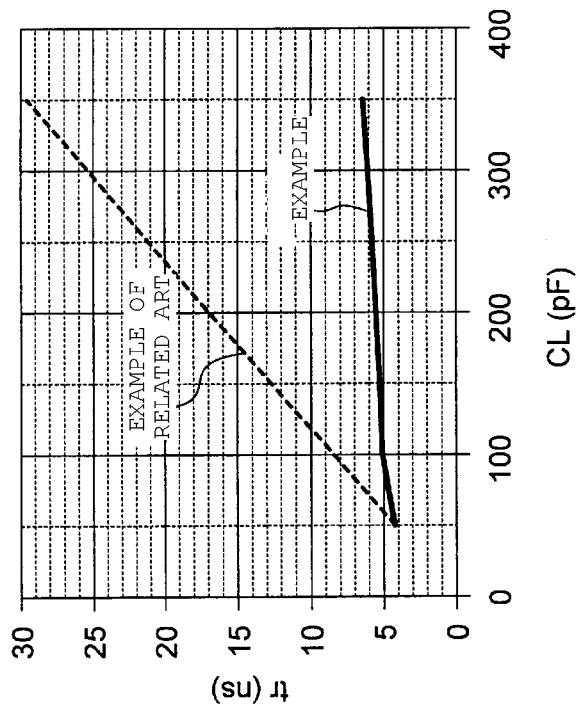

FIG. 26A is a graph illustrating a relationship between the rise time Tr and the load capacitance CL. As above described, a broken line illustrates the relationship in the example of the related art, and a solid line illustrates the relationship in the third embodiment. As illustrated in FIG. 26A, if the load capacitance CL is increased, the rise time Tr is approximately linearly increased at a steep inclination in the example of the related art, while the rise time Tr is gradually increased in the third embodiment. FIG. 26B is a graph illustrating a relationship between the fall time Tf and the load capacitance CL. Also in FIG. 26B, the fall time Tf is increased at a steep inclination in the example of the related art, while the fall time Tf is gradually increased in the third embodiment.

According to the third embodiment, adding the additional circuit 44 to the tristate buffer of the related art allows an increase in the stability of the rise time Tr and the fall time Tf of the output signal of the data output buffer circuit 26. As illustrated in FIG. 26A and FIG. 26B, while the rise time Tr and the fall time Tf of the output signal in the circuit of the related art are rapidly increased as the load capacitance CL is increased, the rise time Tr and the fall time Tf are gradually increased according to the data output buffer circuit 26 of the third embodiment. For example, if the allowable ranges of the rise time Tr and the fall time Tf of the output signal are from 3.5 ns to 10 ns, the rise time Tr and the fall time Tf exceed these allowable ranges thereof at the time of load capacitance CL=150 pF in the circuit of the related art. Meanwhile, according to the data output buffer circuit 26 of the third embodiment, the rise time Tr and the fall time Tf can be set within the allowable ranges thereof in a large range of the load capacitance CL from 50 pF to 350 pF.

Figure 27:
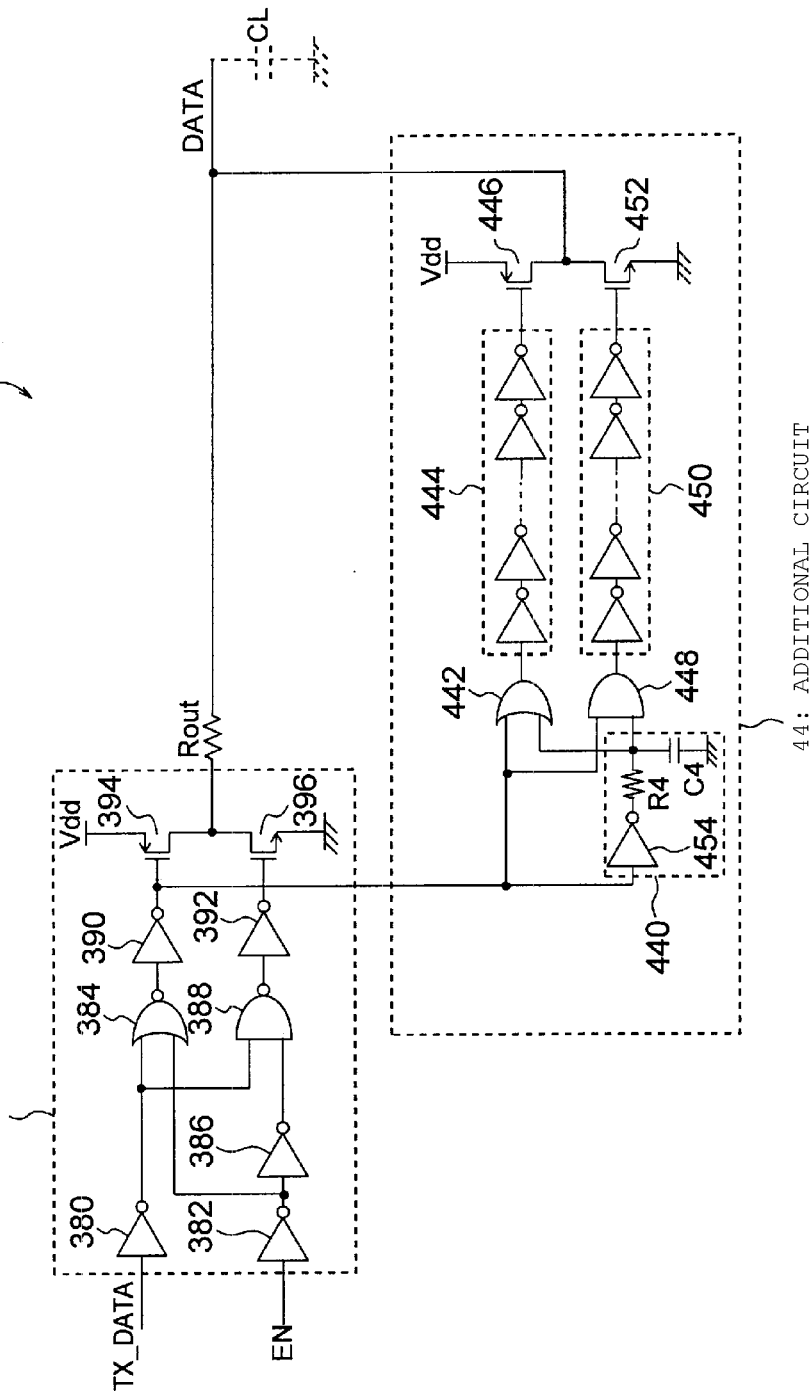
FIG. 27 is a circuit diagram of a semiconductor integrated circuit according to another example of the third embodiment.

While the additional circuit input signal is input into the output of the inverter circuit 392, that is, the gate of the n-type MOSFET 396, in the third embodiment, the additional circuit input signal may be input into the output of the inverter circuit 390, that is, the gate of the p-type MOSFET 394, as illustrated in FIG. 27. In this case, while the additional circuit input signal is at the high level when the enable signal EN is at the low level, the value of the additional circuit input signal when the enable signal EN is at the high level is equal to the value of the additional circuit input signal in the case illustrated in FIG. 24. Thus, the effect of the additional circuit 44 is the same as the effect of the additional circuit 44 in the case illustrated in FIG. 24.

Fourth Embodiment

While the drive circuit that drives MOSFETs, which is the output circuit, is provided and the stabilized rise time Tr and the fall time Tf of the output can be secured in a wide range of the load capacitance CL in the third embodiment above described, the stabilized rise time Tr and the fall time Tf will be secured in a case where a signal output by the internal logic circuit has sufficient strength and the output circuit can output a signal independently of the drive circuit, in the fourth embodiment below described. Hereinafter, differences from the above embodiments will be described.

Figure 28:
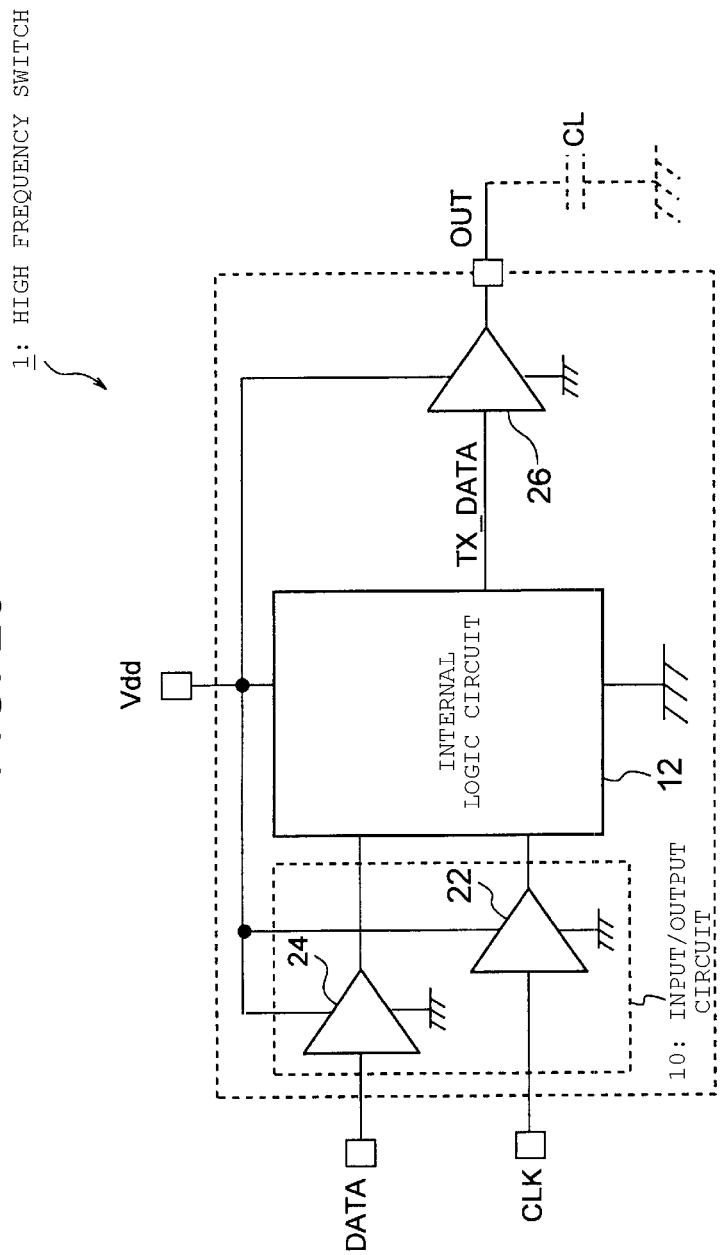
FIG. 28 is a schematic diagram of a high frequency switch circuit in which a semiconductor integrated circuit according to a fourth embodiment is used.

FIG. 28 is a diagram schematically illustrating the high frequency switch 1 into which the data output buffer circuit 26 according to the fourth embodiment is incorporated. The input data DATA and the clock signal CLK are input into the internal logic circuit 12 through the data input buffer circuit 24 and the clock input buffer circuit 22 of the input/output circuit 10. The internal logic circuit 12 outputs the transmission serial data signal TX_DATA to the data output buffer circuit 26. While the other elements illustrated in FIG. 1, for example, the power-on reset circuit 14 and the like, are not illustrated in FIG. 28 for simplification in description, the same circuits as the circuits illustrated in FIG. 1 are actually provided in the fourth embodiment. The difference from the above embodiments is that while a bidirectional communication buffer is assumed in the above embodiments, the fourth embodiment does not use bidirectional communication and instead uses unidirectional communication. While the term unidirectional is used for the purpose of description, the fourth embodiment can also be applied to a bidirectional communication buffer as illustrated in FIG. 1.

Figure 29:
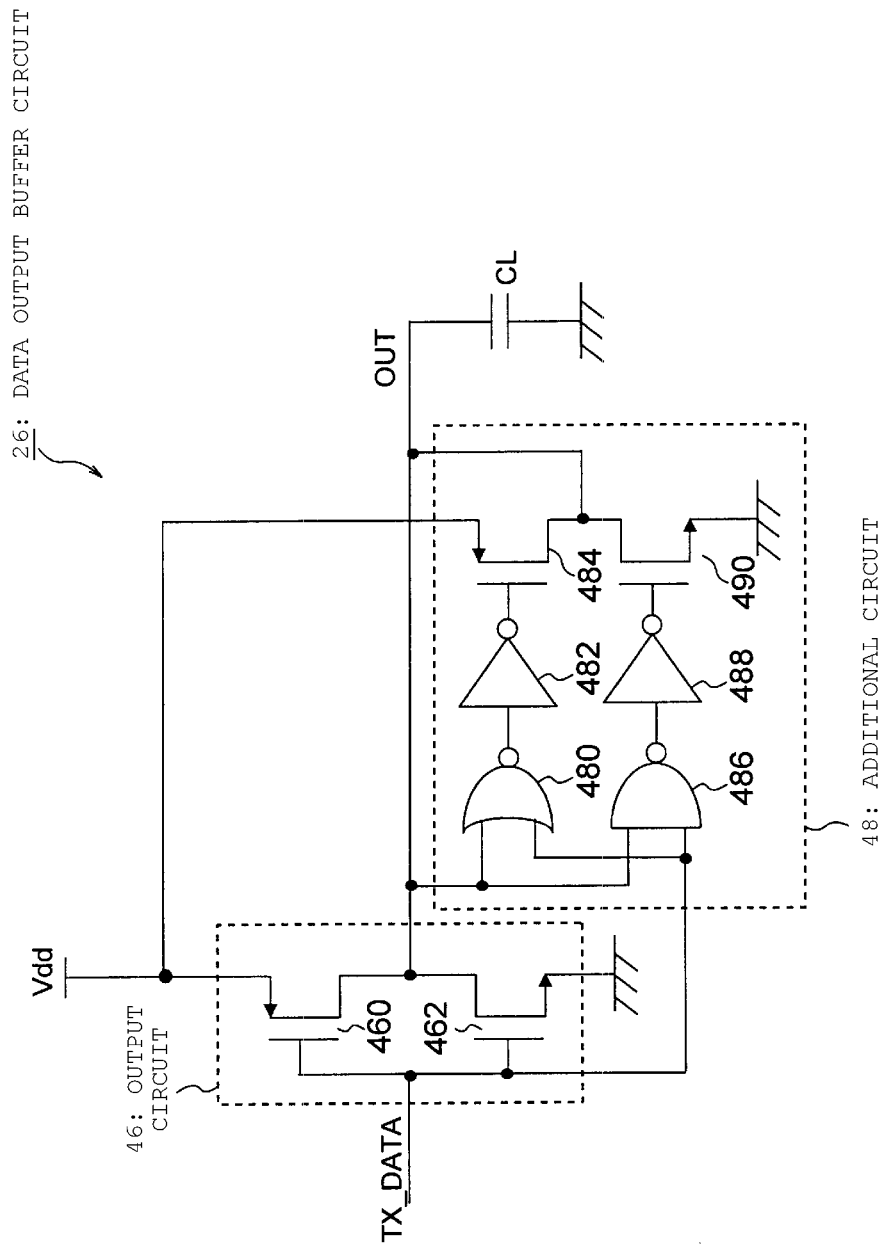
FIG. 29 is a circuit diagram of the semiconductor integrated circuit according to the fourth embodiment.

FIG. 29 is a diagram illustrating the data output buffer circuit 26 that corresponds to a semiconductor integrated circuit according to the fourth embodiment. As illustrated in FIG. 29, the data output buffer circuit 26 according to the fourth embodiment includes an output circuit 46 and an additional circuit (supplemental circuit) 48. The output circuit 46 includes a first inverter circuit that is configured with a so-called CMOS (complementary metal oxide semiconductor) circuit, including a first p-type MOSFET 460 and a first n-type MOSFET 462. Since the output of the internal logic circuit 12 is sufficiently large in the fourth embodiment, a circuit that drives the output circuit 46 is not required.

The first p-type MOSFET 460 has a source connected to the power supply Vdd and a gate into which the transmission serial data signal TX_DATA is input. The first n-type MOSFET 462 has a grounded source and a gate and a drain which are commonly connected to the first p-type MOSFET 460. The first n-type MOSFET 462 outputs from the drain a signal that is logically inverted from the input signal, that is, a signal that is logically inverted from the transmission serial data signal TX_DATA.

The additional circuit 48 includes a NOR circuit 480, a second inverter circuit 482, a second p-type MOSFET 484, a NAND circuit 486, a third inverter circuit 488, and a second n-type MOSFET 490. The additional circuit 48 assists a rise and a fall of a signal output by the output circuit 46.

The NOR circuit 480 has two inputs one of which is connected to the input of the first inverter circuit 46 and the other of which is connected to the output of the output circuit 46. The second inverter circuit 482 has an input connected to the output of the NOR circuit 480 and logically inverts a signal output by the NOR circuit 480. The second p-type MOSFET 484 has a source connected to the power supply Vdd, a gate connected to the output of the second inverter circuit 482, and a drain connected to the second n-type MOSFET 490.

The NAND circuit 486 has two inputs one of which is connected to the input of the first inverter circuit 46 and the other of which is connected to the output of the output circuit 46. The third inverter circuit 488 has an input connected to the output of the NAND circuit 486 and logically inverts a signal output by the NAND circuit 486. The second n-type MOSFET 490 has a grounded source, a gate connected to the output of the third inverter circuit 488, and a drain connected to the second p-type MOSFET 484 and outputs a signal that assists the signal output by the output circuit 46 from the drain thereof.

Next, the operation of the data output buffer circuit 26 according to the fourth embodiment will be described. At first, a case where the rise time Tr and the fall time Tf of the signal of the output circuit 46 are equal to zero will be described. In this case, since a high level signal and a low level signal are input into the NOR circuit 480 at all times, the NOR circuit 480 outputs a low level signal. The low level signal output from the NOR circuit 480 is converted into a high level signal through the second inverter circuit 482, and the high level signal is input into the gate of the second p-type MOSFET 484. The second p-type MOSFET 484 of which the gate receives input of the high level signal is turned OFF and prevents flow of a drain current.

The NAND circuit 486 also receives input of a low level signal and a high level signal. As a consequence, the NAND circuit 486 outputs a high level signal. The high level signal output by the NAND circuit 486 is converted into a low level signal through the third inverter circuit 488, and the low level signal is input into the gate of the second n-type MOSFET 490. The second n-type MOSFET 490 of which the gate receives input of the low level signal is turned OFF and prevents flow of a drain current. That is, in this case, since both of the second p-type MOSFET 484 and the second n-type MOSFET 490 are turned OFF, the additional circuit 48 does not output a signal.

Next, a case where the rise time Tr and the fall time Tf of the output signal of the output circuit 46 are not equal to zero will be described. In this case, two low level signals are input into the NOR circuit 480 until the rise time Tr of the output signal of the output circuit 46 elapses from the timing at which the transmission serial data signal TX_DATA transitions from the high level to the low level, and thus, the NOR circuit 480 outputs a high level signal. The high level signal output by the NOR circuit 480 is converted into a low level signal through the second inverter circuit 482, and the low level signal is input into the gate of the second p-type MOSFET 484. The second p-type MOSFET 484 of which the gate receives input of the low level signal is turned ON and allows a current to flow from the source thereof into the drain thereof.

In this state, since a low level signal is input into one of the inputs of the NAND circuit 486, a low level signal is input into the gate of the second n-type MOSFET 490, and the second n-type MOSFET 490 is not turned ON. As a consequence, the additional circuit 48 outputs the drain current of the second p-type MOSFET 484, and this output signal assists the rise of the output signal of the output circuit 46.

If the fall time Tf of the output circuit 46 is not equal to zero, two high level signals are input into the NAND circuit 486 until the fall time Tf of the output signal of the output circuit 46 elapses from transition of the transmission serial data signal TX_DATA from the low level to the high level, and thus, the NAND circuit 486 outputs a low level signal. The low level signal output by the NAND circuit 486 is converted into a high level signal through the third inverter circuit 488, and the high level signal is input into the gate of the second n-type MOSFET 490. The second n-type MOSFET 490 of which the gate receives input of the high level signal is turned ON and allows a current to flow from the drain thereof into the source thereof.

In this state, since a high level signal is input into one of the inputs of the NOR circuit 480, a high level signal is input into the gate of the second p-type MOSFET 484, and the second p-type MOSFET 484 is not turned ON. As a consequence, the additional circuit 48 allows the drain current of the second n-type MOSFET 490 to flow from the output signal of the output circuit 46 into the ground and assists the fall of the output signal.

The above behaviors in this case also affect the rise times of the NOR circuit 480, the NAND circuit 486, the second inverter circuit 482, and the third inverter circuit 488. This effect will be described by using FIGS. 30A to 30D.

FIGS. 30A to 30D are graphs illustrating the waveforms of the output signal and the like of the output circuit 46, in which solid lines illustrate the waveform of the output signal of the data output buffer circuit 26 and broken lines illustrate the waveform of the transmission serial data signal TX_DATA. In FIGS. 30A to 30D, the gate width of each MOSFET constituting the second inverter circuit and the third inverter circuit is set to 1 um to 10 um, and the gate widths of the first p-type MOSFET 460, the first n-type MOSFET 462, the second p-type MOSFET 484, and the second n-type MOSFET 490 are set to 200 um to 300 um. Such setting of the gate widths controls the rise time and the fall time in each circuit.

Figure 30A:
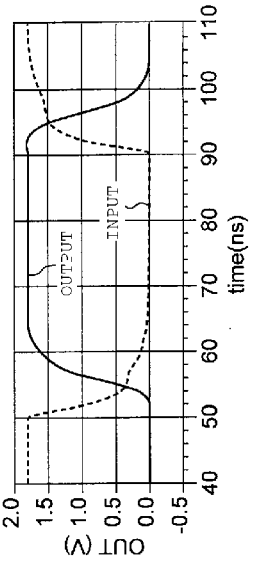
FIGS. 30A to 30D are graphs illustrating a waveform of an output signal and the like in the fourth embodiment.
Figure 30B:
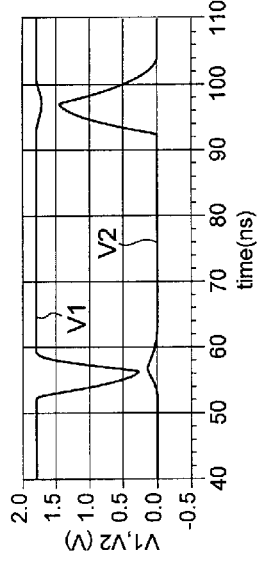

FIG. 30A and FIG. 30B are graphs illustrating the output waveform, the voltage V1 that is input into the gate of the second p-type MOSFET 484, and the voltage V2 that is input into the gate of the second n-type MOSFET 490 in a case of power supply voltage Vdd=1.8 V and load capacitance CL=10 pF. In this case, the rise time of the output signal of the output circuit 46 is sufficiently smaller than the rise times of the output signals of the second inverter circuit 482 and the third inverter circuit 488.

As illustrated in FIG. 30A, the output signal starts to transition from the low level to the high level at a timing when the input signal of the data output buffer circuit 26 has a voltage below 0.9 V (Vdd/2=1.8 V/2) and transitions to a high level signal in an approximately linear manner. The same applies to the fall of the output signal from the high level to a low level signal. Since the output circuit 46 is configured with the first inverter circuit, the input waveform and the output waveform show signals that are the logical inverse of each other as illustrated in FIG. 30A.

In this case, the voltage V1 that is input into the gate of the second p-type MOSFET 484 temporarily falls from the high level to the low level according to the signal input into the additional circuit 48, as illustrated in FIG. 30B. However, since the time in which both of the signals input into the NOR circuit 480 are at the low level is shorter than the fall time of the signal of the second inverter circuit 482, the voltage again transitions to the high level before falling below the threshold voltage of the second p-type MOSFET 484, and the second p-type MOSFET 484 is not turned ON.

The same applies to the voltage V2 that is input into the gate of the second n-type MOSFET 490, and the voltage V2 does not rise until the second n-type MOSFET 490 is turned ON. That is, in this case, the additional circuit 48 does not affect the output signal of the output circuit 46.

Figure 30C:
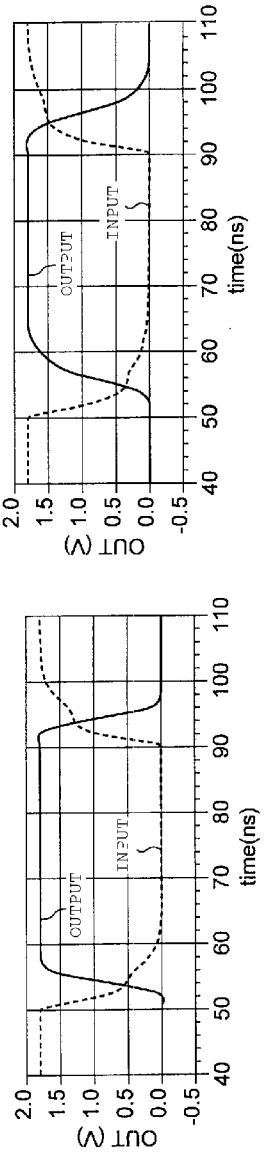
Figure 30D:
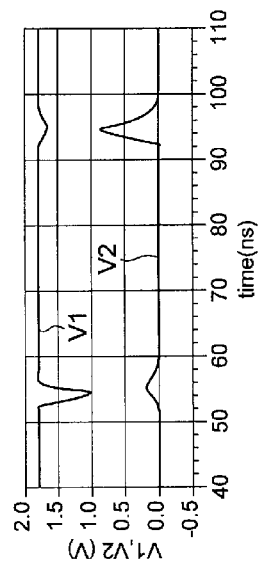

FIG. 30C and FIG. 30D are graphs illustrating the waveforms for a load capacitance CL=50 pF. In this case, due to influence of the load capacitance CL, the rise time Tr and the fall time Tf of the output signal of the output circuit 46 are increased compared with the rise time and the fall time of the output signal of the second inverter circuit 482 and the third inverter circuit 488.

As illustrated in FIG. 30C, the output signal starts to transition from the low level to the high level at a time when the input signal of the data output buffer circuit 26 has a voltage below 0.9 V, in the same manner as in the above case. However, in this case, the rise of the output signal is smoother than the fall of the input signal.

As a consequence, the fall time of the second inverter circuit 482 elapses during the period from the transition of the input signal to the low level to the transition of the output signal to the high level, and the voltage V1 stays below the threshold voltage of the second p-type MOSFET 484 as illustrated in FIG. 30D. Then, the second p-type MOSFET 484 is turned ON, and the second p-type MOSFET 484 allows a drain current to flow into the output signal of the output circuit 46, thereby assisting the output of the output circuit 46. If the voltage of the output signal exceeds 0.9 V, the output signal of the second inverter circuit 482 starts to transition to the high level again, and as a consequence, the second p-type MOSFET 484 is again turned OFF.

The same applies to the case where the input signal rises. When the voltage of the input signal is above 0.9 V and the voltage of the output signal is not below 0.9 V, the second n-type MOSFET 490 is turned ON and allows a drain current to flow from the output signal of the output circuit 46 into the ground. The drain current flowing from the output signal assists the fall of the output signal. Then, if the voltage of the output signal falls below 0.9 V, the output signal of the third inverter circuit 488 transitions to the low level and causes the second n-type MOSFET 490 to transition to the OFF state again.

Figure 31A:
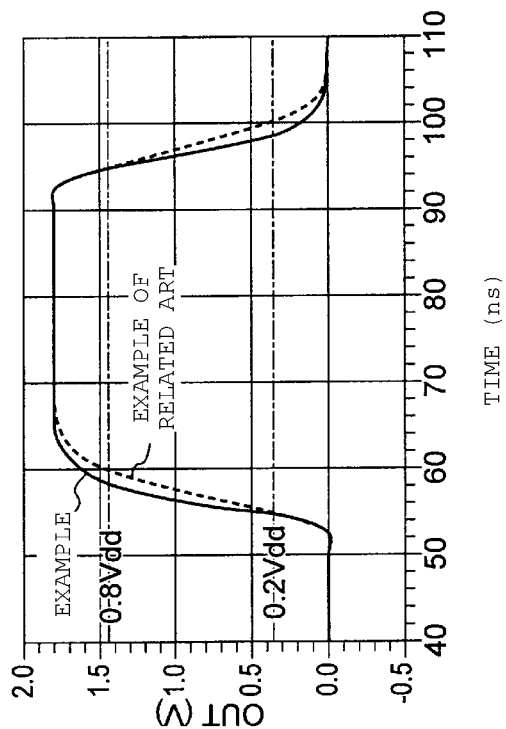
FIGS. 31A and 31B are graphs illustrating a waveform of an output signal in the fourth embodiment.
Figure 31B:
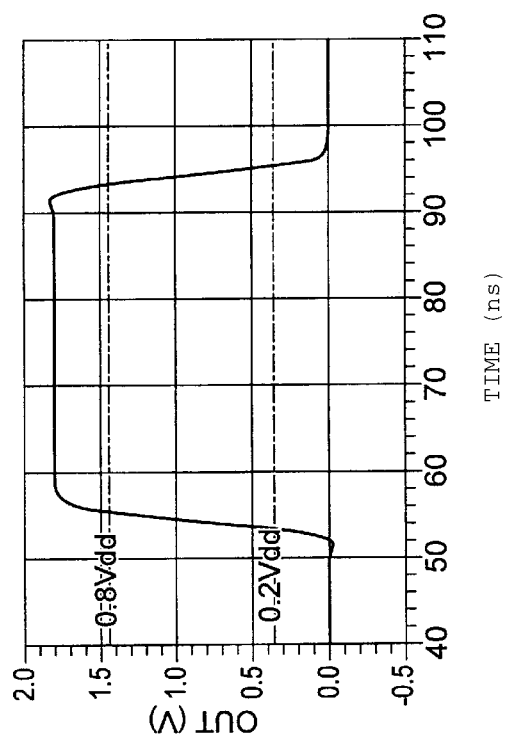

FIG. 31A and FIG. 31B are graphs comparing the waveform of the output signal of the data output buffer circuit 26 of the fourth embodiment and the example of the related art. FIG. 31A is a graph for a load capacitance CL=10 pF. In this case, as above described, since the rise time Tr and the fall time Tf of the output circuit 46 are smaller than the rise time and the fall time of the second inverter circuit 482 and the third inverter circuit 488, the additional circuit 48 does not assist the output of the output circuit 46. Thus, the same output waveform appears in the example of the related art and in the fourth embodiment.

FIG. 31B is a graph for a load capacitance CL=50 pF. As illustrated in FIG. 31B, the rise time Tr and the fall time Tf of the signal of the output waveform in the fourth embodiment are smaller than the rise time and the fall time of the signal of the output waveform in the example of the related art. That is, in a case where the rise time Tr and the fall time Tf of the output circuit 46 are larger than the rise time and the fall time of the second inverter circuit 482 and the third inverter circuit 488, the additional circuit 48 has the effect of assisting the output of the output circuit 46.

Figure 32A:
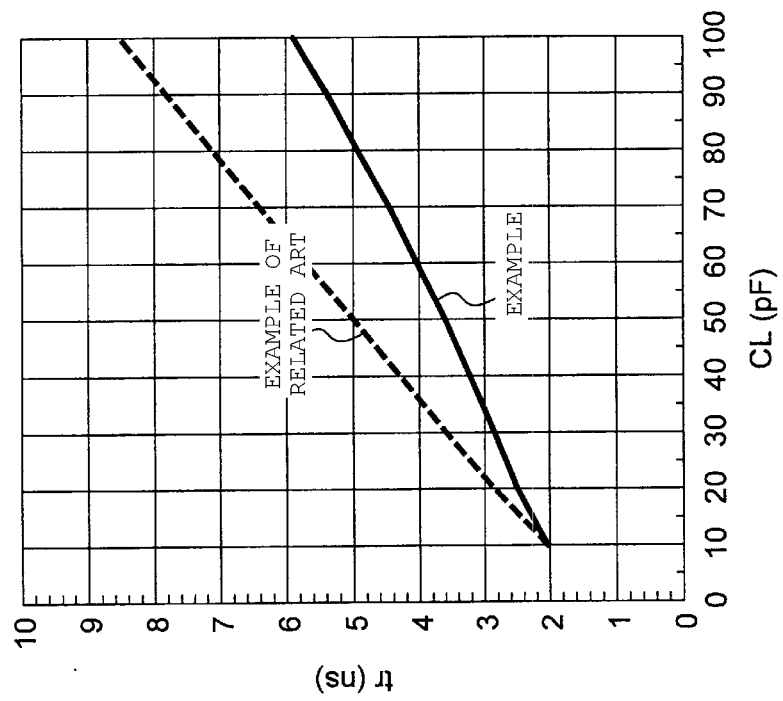
FIGS. 32A and 32B are graphs illustrating a relationship between a rise time and the like of an output signal and a load capacitance in the fourth embodiment.
Figure 32B:
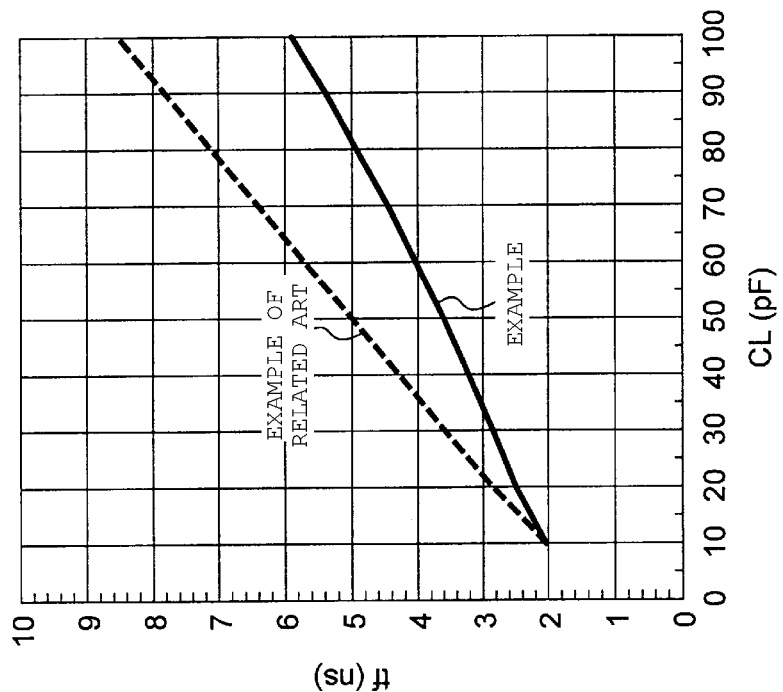

FIG. 32A and FIG. 32B are graphs illustrating a relationship between the load capacitance CL and the rise time Tr and the fall time Tf of the output signal of the data output buffer circuit 26. The rise time Tr and the fall time Tf in the fourth embodiment are illustrated by solid lines, and the rise time Tr and the fall time Tf in the example of the related art are illustrated by broken lines.

As illustrated in FIG. 32A and FIG. 32B, the rise time Tr and the fall time Tf in the fourth embodiment change at a more gradual inclination (less steep slope) as compared with the rise time and the fall time in the example of the related art. The reason is that the additional circuit 48 assists the output of the output circuit 46.

According to the fourth embodiment heretofore described, the additional circuit 48 of the data output buffer circuit 26 assisting the signal output by the output circuit 46 allows control of the rise time Tr and the fall time Tf of the signal output by the data output buffer circuit 26 within the allowable ranges thereof in a certain range of the load capacitance CL, if the rise time Tr and the fall time Tf are significantly increased. Adjusting the rise time and the fall time of the signal of the second inverter circuit 482 and the third inverter circuit 488 by adjusting the gate widths of the MOSFETs constituting the second inverter circuit 482 and the third inverter circuit 488 in the additional circuit 48 allows control of the rise time Tr and the fall time Tf of the output signal even in a wider range of the load capacitance CL. Furthermore, the data output buffer circuit 26 may be changed to a tristate output buffer as in the above other embodiments by inputting signals individually into each of the gate of the first p-type MOSFET 460 and the gate of the first n-type MOSFET 462.

Fifth Embodiment

While addition of the additional circuit 48 allows a decrease in the rise time Tr and the fall time Tf of the output signal of the output circuit 46 in the absence of the drive circuit in the fourth embodiment, an additional circuit that suppresses an excessive decrease in the rise time Tr and the fall time Tf will be described in the fifth embodiment. Hereinafter, differences from the above embodiments will be described.

Figure 33:
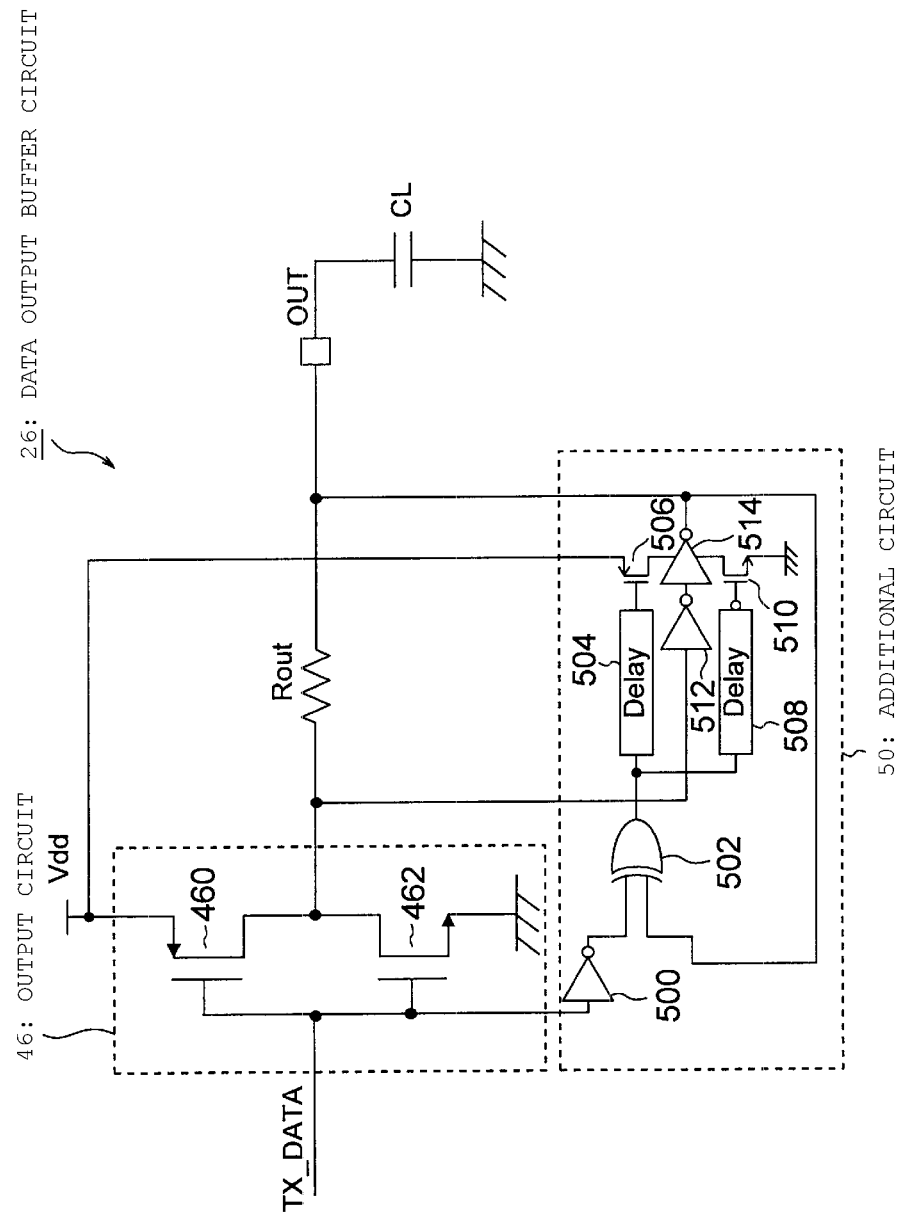
FIG. 33 is a circuit diagram of a semiconductor integrated circuit according to a fifth embodiment.

FIG. 33 is a circuit diagram illustrating the data output buffer circuit 26 according to the fifth embodiment.

Similarly to the fourth embodiment, the data output buffer circuit 26 illustrated in FIG. 33 indicates the internal configuration of the data output buffer circuit 26 in FIG. 1 and FIG. 28.

As illustrated in FIG. 33, the data output buffer circuit 26 that corresponds to a semiconductor integrated circuit according to the present embodiment includes the output circuit 46, an additional circuit (supplemental circuit) 50, and the output resistor Rout. The output circuit 46 has the same configuration as the output circuit 46 in the fourth embodiment.

The additional circuit 50 outputs a signal that assists the signal output by the output circuit 46. The additional circuit 50 includes a second inverter circuit 500, an exclusive logical sum (hereinafter, EXOR) circuit 502, a delay circuit 504, a second p-type MOSFET 506, a logic inverter delay circuit 508, a second n-type MOSFET 510, a third inverter circuit 512, and a fourth inverter circuit 514.

The second inverter circuit 500 has an input connected to the input of the output circuit 46, that is, the first inverter circuit. The second inverter circuit 500 logically inverts the input transmission serial data signal TX_DATA and outputs the inverted signal. The EXOR circuit 502 has two inputs connected to the output of the second inverter circuit 500 and the output of the output resistor Rout and outputs an exclusive logical sum of the signals from the second inverter circuit 500 and the output resistor Rout.

The delay circuit 504 has an input connected to the output of the EXOR circuit 502. The delay circuit 504 delays the input signal by a predetermined time and outputs the delayed signal. For example, the delay circuit 504 is configured with a circuit in which two inverter circuits are connected in series. The second p-type MOSFET 506 has a source connected to the power supply Vdd, a gate connected to the output of the delay circuit 504, and a drain connected to the fourth inverter circuit 514. That is, the second p-type MOSFET 506 is switched ON and OFF according to the signal output by the delay circuit 504 and allows a current to flow from the source thereof into the drain thereof.

The logic inverter delay circuit 508 has an input connected to the output of the EXOR circuit 502. The logic inverter delay circuit 508 delays the input signal by a predetermined time, logically inverts the delayed signal, and outputs the inverted signal. For example, the logic inverter delay circuit 508 is configured with a circuit in which three inverter circuits are connected in series. The second n-type MOSFET 510 has a grounded source, a gate connected to the logic inverter delay circuit 508, and a drain connected to the fourth inverter circuit 514. That is, the second n-type MOSFET 510 is switched ON and OFF according to the signal output by the logic inverter delay circuit 508 and allows a current to flow from the drain thereof into the source thereof.

The third inverter circuit 512 has an input connected to the output of the output circuit 46, that is, the first inverter circuit. The third inverter circuit 512 logically inverts the input signal and outputs the inverted signal. The fourth inverter circuit 514 has an input connected to the output of the third inverter circuit 512. The fourth inverter circuit 514 logically inverts the input signal and outputs the inverted signal. The fourth inverter circuit 514 is connected to the drains of the second p-type MOSFET 506 and the second n-type MOSFET 510 and is configured as an inverter circuit corresponding to a so-called tristate buffer that constitutes a logic inverter circuit if the drain currents of the second p-type MOSFET 506 and the second n-type MOSFET 510 flow and is in a high impedance state if the drain currents do not flow.

The third inverter circuit 512 and the fourth inverter circuit 514 are set in such a manner that the input signals thereof rise and fall in a predetermined time. Furthermore, the resistance value of the output resistor Rout and a combined resistance value, the rise times, and the fall times of the third inverter circuit 512 and the fourth inverter circuit 514 are set to an extent in which the rise and the fall of the signal output by the data output buffer circuit 26 are dependent on the signal output by the fourth inverter circuit 514.

The output resistor Rout is configured with a resistor element that has negative temperature characteristics. The output resistor Rout is provided in order to compensate for temperature dependency of the first p-type MOSFET 460 and the first n-type MOSFET 462 having positive temperature characteristics.

Next, the operation of the data output buffer circuit 26 according to the fifth embodiment will be described. First, a case where the rise time and the fall time of a signal of a circuit in which the first inverter circuit (constituting the output circuit 46), the third inverter circuit 512, and the fourth inverter circuit 514 are connected in series and the rise time and the fall time of the signal of the circuit are equal to the rise time and the fall time of the signal output by the second inverter circuit 500 will be described. In this case, since the two signals input into the EXOR circuit 502 are at the same level, the signal output by the EXOR circuit 502 is a low level signal. If the EXOR circuit 502 outputs a low level signal, a low level signal is input into the gate of the second p-type MOSFET 506, a high level signal is input into the gate of the second n-type MOSFET 510, and both of these two MOSFETs (506 and 510) are turned ON.

That is, the signal output by the data output buffer circuit 26 corresponds to the output signal of the output circuit 46 that is output through a circuit including the third inverter circuit 512 connected in series with the fourth inverter circuit 514 that is connected in parallel with the output resistor Rout. Since the rise time Tr and the fall time Tf of the output signal of the data output buffer circuit 26 are dependent on the rise and the fall of the signal of the fourth inverter circuit 514, the rise time Tr and the fall time Tr are increased by an amount of dependence thereof on the rise time and the fall time of the third inverter circuit 512 and the fourth inverter circuit 514.

Next, a case of a circuit in which the first inverter circuit (output circuit 46), the third inverter circuit 512, and the fourth inverter circuit 514 are connected in series and the rise time and the fall time of the signal of the circuit are larger than the rise time and the fall time of the signal output by the second inverter circuit 500 will be described. In this case, since the two signals input into the EXOR circuit 502 are the logical inverse of each other, the signal output by the EXOR circuit 502 is a high level signal. If the EXOR circuit 502 outputs a high level signal, a high level signal is input into the gate of the second p-type MOSFET 506 at a timing delayed by a predetermined time, and the second p-type MOSFET is turned OFF. Similarly, a low level signal is input into the gate of the second n-type MOSFET at a timing delayed by a predetermined time, and the second n-type MOSFET 510 is turned OFF.

If the second p-type MOSFET 502 and the second n-type MOSFET 510 are turned OFF, the fourth inverter circuit 514 is in a high impedance state and does not allow passage of a signal. Then, the output signal of the data output buffer circuit 26 has the same phase as the output of the output circuit 46. That is, the rise time Tr and the fall time Tf of the output signal of the data output buffer circuit 26 are equal to the rise time and the fall time of the output signal of the output circuit 46 independent of the rise time and the fall time of the third inverter circuit 512 and the fourth inverter circuit 514.

A case where the delay circuit 504 is configured with two inverter circuits and the logic inverter delay circuit 508 is configured with three inverter circuits will be described. In this situation, the rise time and the fall time of signals output by the two inverter circuits constituting the delay circuit 504 and the three inverter circuits constituting the logic inverter delay circuit 508 are adjusted. For example, if the difference between the rise time of the second inverter circuit 500 and the rise time of the output circuit 46 is equal to 1 ns and the fall time of the two inverter circuits constituting the delay circuit 504 is equal to 2 ns, the signal output by the EXOR circuit 502 stays at the high level for 1 ns when the transmission serial data signal TX_DATA falls. However, the delay circuit 504 cannot follow the rise of the signal, and a low level signal is continuously input into the gate of the second p-type MOSFET 506.

As such, appropriately choosing the rise time or the fall time of each MOSFET allows control of how the third inverter circuit 512 and the fourth inverter circuit 514 depend on the rise time and the fall time even if there is a difference between the rise time and the fall time of the output signal of the output circuit 46 and the rise time and the fall time of the output signal of the second inverter circuit 500 after the transmission serial data signal TX_DATA is input. These can be adjusted by appropriately setting parameters such as the gate widths of the MOSFETs constituting each circuit.

Figure 34A:
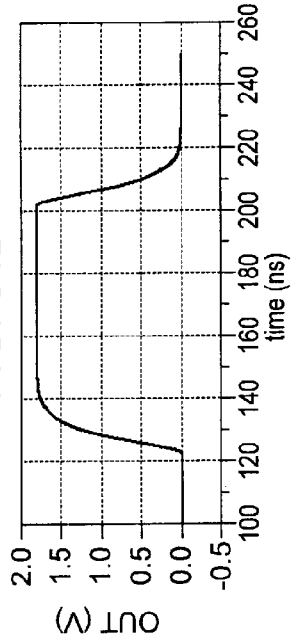
FIGS. 34A to 34F are graphs illustrating a waveform of an output signal and the like in the fifth embodiment.
Figure 34B:
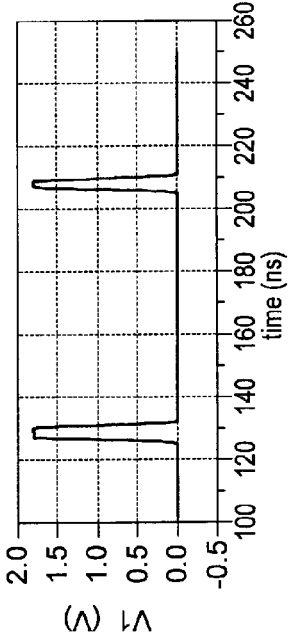
Figure 34C:
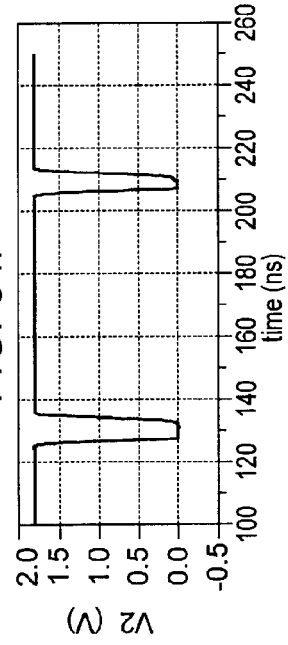
Figure 34D:
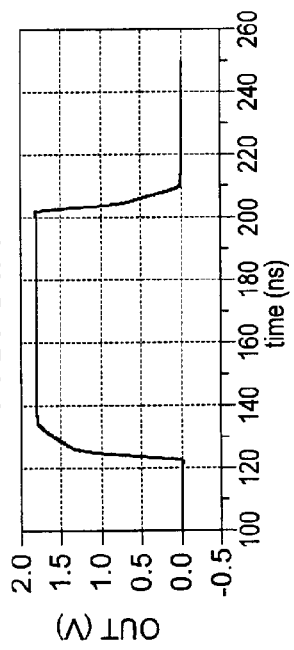
Figure 34E:
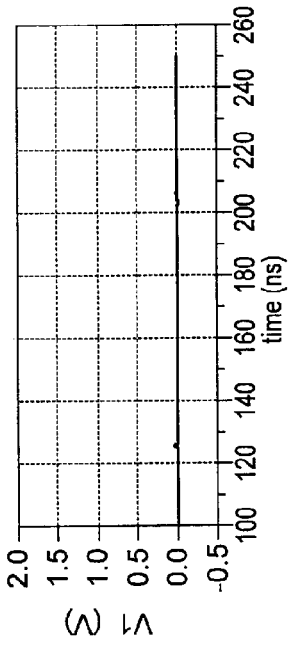
Figure 34F:
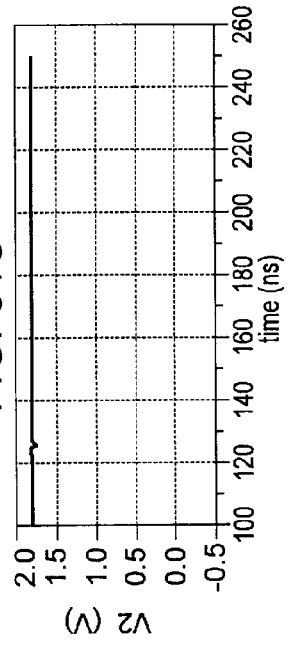

FIGS. 34A to 34F are graphs illustrating the output waveform of the output signal and the like of the data output buffer circuit 26. FIGS. 34A to 34C are diagrams illustrating the output waveform and the like in a case of power supply voltage Vdd=1.8 V and load capacitance CL=5 pF, and FIGS. 34D to 34F are diagrams illustrating the output waveform and the like in a case of power supply voltage Vdd=1.8 V and load capacitance CL=50 pF.

FIG. 34A is a graph illustrating the waveform of the output signal of the data output buffer circuit 26. As illustrated in FIG. 34A, the output signal of the data output buffer circuit 26 gradually rises after elapsing of a predetermined time from the rapid rise thereof, and the rise time Tr is controlled. The reason is that since a current flows into the third inverter circuit 512 and the fourth inverter circuit 514 at the timing when the inclination of the output signal changes on the graph, the signals of the third inverter circuit 512 and the fourth inverter circuit 514 are combined, and the rise time Tr lasts long.

More specifically, the resistance value of a combined circuit of the third inverter circuit 512 and the fourth inverter circuit 514 is large until a current normally flows into these inverter circuits. Thus, a current flows from the output resistor Rout, and the rise is rendered rapid at an early stage thereof. However, if a current normally flows into the third inverter circuit 512 and the fourth inverter circuit 514, the resistance value is decreased, and since a current flows into the combined circuit of the third inverter circuit 512 and the fourth inverter circuit 514 that is connected in parallel with the output resistor Rout, the rise is rendered gradual. The same behavior is shown at the fall of the output signal.

FIG. 34B is a graph illustrating the voltage V1 of the signal that is input into the gate of the second p-type MOSFET 506 in this state. As illustrated in FIG. 34B, in this case, a pulse signal that is output by the EXOR circuit 502 due to the fall of the transmission serial data signal TX_DATA has a small pulse width. Thus, the pulse signal output by the EXOR circuit 502 is extinguished when passing the delay circuit 504. The same applies to a case where the transmission serial data signal TX_DATA rises.

FIG. 34C is a graph illustrating the voltage V2 that is input into the gate of the second n-type MOSFET in the same case. As illustrated in FIG. 34C, regarding the voltage V2, the pulse signal is extinguished when passing the logic inverter delay circuit 508 as in the case of the voltage V1. The voltage V1 maintained at the low level and the voltage V2 maintained at the high level allow the ON states of the second p-type MOSFET 506 and the second n-type MOS- FET 510 to be maintained. Thus, in this case, the fourth inverter circuit 514 is not in a high impedance state and continuously outputs a signal.

FIG. 34D is a graph illustrating the output waveform of the data output buffer circuit 26 in a case where the load capacitance CL is larger than the load capacitance CL in FIG. 34A. As understood from comparison with FIG. 34A, in this case, the waveform of the output signal draws a smooth curve of a rise without a point of a rapid change. The reason is that the rise time of the output signal of the output circuit 46 is larger than the delay time of the delay circuit 504 and the delay time of the logic inverter delay circuit 508.

FIG. 34E is a graph illustrating the voltage V1 of the signal that is input into the gate of the second p-type MOSFET 506 in this state. As illustrated in FIG. 34E, in this case, the pulse signal that is output by the EXOR circuit 502 due to the fall of the transmission serial data signal TX_DATA has a large pulse width to an extent exceeding the rise times of the signals of the delay circuit 504 and the logic inverter delay circuit 508. Thus, the voltage V1 changes to the high level in the form of a pulse at a timing at which a predetermined time elapses from the timing at which the transmission serial data signal TX_DATA falls.

FIG. 34F is a graph illustrating the voltage V2 that is input into the gate of the second n-type MOSFET in the same case. As illustrated in FIG. 34F, regarding the voltage V2, the voltage V2 of the signal output by the logic inverter delay circuit 508 changes to the low level in the form of a pulse as in the case of the voltage V1. If these pulse-shaped signals of the voltages V1 and V2 are generated, the second p-type MOSFET 506 and the second n-type MOSFET 510 are turned OFF while these signals are generated, and the fourth inverter circuit 514 is in a high impedance state.

In other words, the combined circuit of the third inverter circuit 512 and the fourth inverter circuit 514 that is connected in parallel with the output resistor Rout does not exist while the pulse signals are generated. Then, the output signal of the data output buffer circuit 26 corresponds to the output signal of the output circuit 46 that is output through the output resistor Rout. That is, in this case, the effect of increasing the rise time of the output signal of the third inverter circuit 512 and the fourth inverter circuit 514 is not achieved.

FIG. 35A is a graph illustrating a relationship between the load capacitance CL and the rise time Tr of the output signal of the data output buffer circuit 26, and FIG. 35B is a graph illustrating a relationship between the load capacitance CL and the fall time Tf of the output signal of the data output buffer circuit 26. In FIGS. 35A and 35B, solid lines illustrate the relationships in the fifth embodiment, and broken lines illustrate the relationships in the example of the related art.

As illustrated in FIG. 35A, if the load capacitance CL is comparatively small, that is, if the rise time Tr is small, the rise time Tr is larger in the fifth embodiment than in the example of the related art. As the load capacitance CL is increased, the difference between the rise time Tr in the fifth embodiment and the rise time Tr in the example of the related art is decreased. The same applies to the fall time Tf as illustrated in FIG. 35B. The effect of increasing the rise time Tr and the fall time Tf can be adjusted by appropriately choosing the gate widths and the like of the MOSFETs in each constituent constituting the data output buffer circuit 26.

According to the fifth embodiment heretofore described, the third inverter circuit 512 and the fourth inverter circuit 514 allow an increase in the rise time Tr and the fall time Tf thereof in a case where the rise time Tr and the fall time Tf of the output signal are otherwise too small. Accordingly, even if lower limit values are placed on the allowable values of the rise time Tr and the fall time Tf of the output signal, an excessive decrease in the rise time Tr and the fall time Tf is suppressed by appropriately setting a delay time and the like, and the same circuit can be used in a certain range of the load capacitance CL.

Sixth Embodiment

While a circuit that suppresses an excessive decrease in the rise time and the fall time of the output signal by switching the high impedance state of the inverter circuit using the delay circuit 504 and the logic inverter delay circuit 508 is described in the fifth embodiment, a semiconductor integrated circuit according to the sixth embodiment is intended to deal with a case where the load capacitance CL is small, using a simplified circuit.

Figure 36:
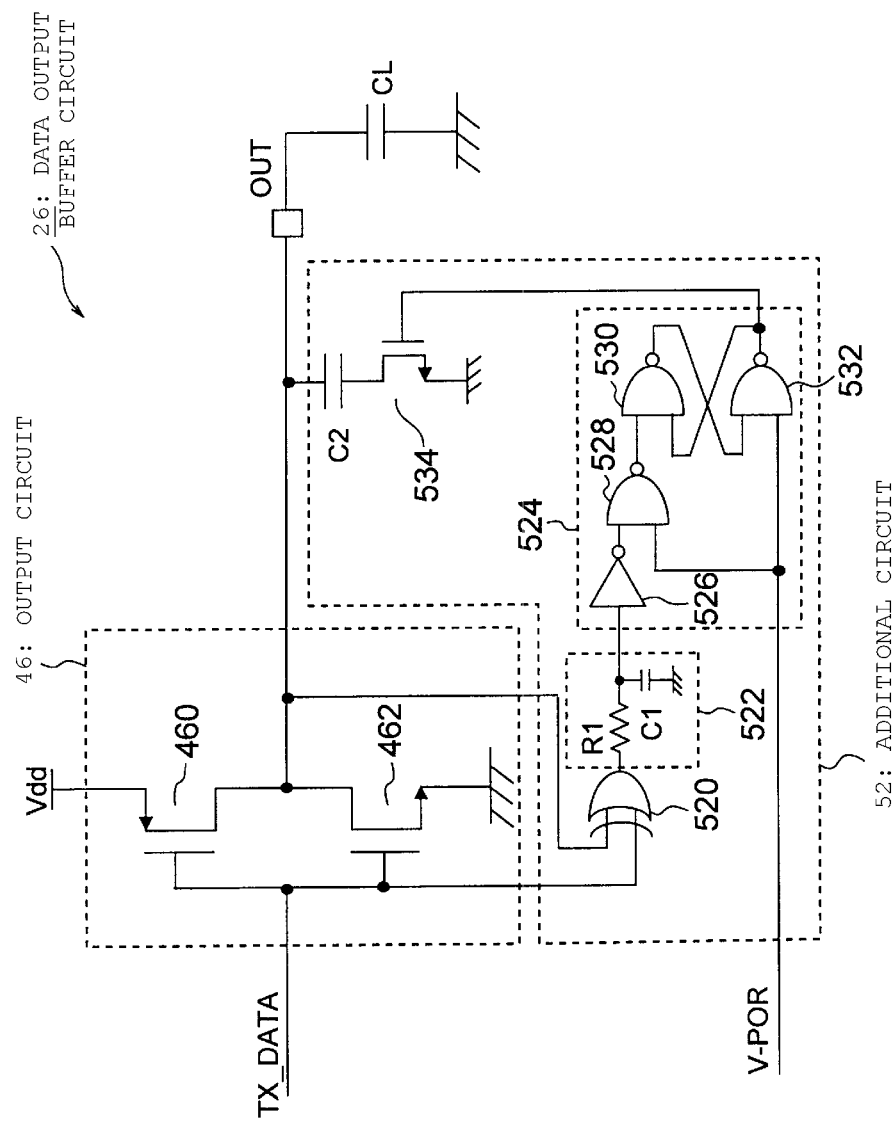
FIG. 36 is a circuit diagram of a semiconductor integrated circuit according to a sixth embodiment.

FIG. 36 is a circuit diagram illustrating the data output buffer circuit 26 according to the sixth embodiment. As illustrated in FIG. 36, the data output buffer circuit 26 according to the sixth embodiment includes the output circuit 46 and an additional circuit (supplemental circuit) 52. The output circuit 46 has the same configuration as the output circuit 46 in the fourth embodiment.

The additional circuit 52 includes an EXOR circuit 520, a low-pass filter 522, a reset priority RS flip-flop circuit 524, an n-type MOSFET 534, and the capacitor C2. The additional circuit 52 receives input of the input signal and the output signal of the output circuit 46 and the output voltage V_POR of a power-on reset circuit and outputs a signal that assists the output signal of the output circuit 46. While the power-on reset circuit is not illustrated in FIG. 28, the power-on reset circuit is the same as the power-on reset circuit 14 illustrated in FIG. 1. That is, the power-on reset circuit outputs a signal that is changed to the high level after elapsing of a predetermined time from a rise of the power supply voltage Vdd as described in the first embodiment.

The EXOR circuit 520 has two inputs connected to the input and the output of the output circuit 46. The EXOR circuit calculates and outputs an exclusive logical sum of the input signal and the output signal of the output circuit 46. That is, the EXOR circuit 520 outputs a high level signal during a period from the rise (fall) of the input signal of the output circuit 46 to the rise (fall) of the output signal or outputs a low level signal otherwise.

The low-pass filter 522 includes the resistor R1 and the capacitor C1. The resistor R1 and the capacitor C1are circuit elements constituting the low-pass filter 522 as a combination of the resistor R1 and the capacitor C1 as described in the above embodiments.

The reset priority RS flip-flop circuit 524 includes an inverter circuit 526 and NAND circuits 528, 530, and 532. The reset priority RS flip-flop circuit 524 is connected to two inputs, a signal output by the low-pass filter 522 as a set signal and the signal V_POR output by the power-on reset circuit as a reset signal. A reset priority RS flip-flop is a type of RS flip-flop that behaves in the same manner as a typical RS flip-flop when both of the set signal and the reset signal are not at the high level or outputs the reset signal when both of the set signal and the reset signal are at the high level.

The inverter circuit 526 has an input connected to the output of the low-pass filter 522. The inverter circuit 526 inverts an input signal and outputs the inverted signal. The NAND circuit 528 has two inputs connected to the output of the inverter circuit 526 and the output signal V_POR of the power-on reset circuit. The NAND circuit 528 calculates and outputs a negative logical product of the output signal of the inverter circuit 526 and the output signal V_POR of the power-on reset circuit. The NAND circuit 530 has two inputs connected to the outputs of the NAND circuits 528 and 532. The NAND circuit 530 calculates and outputs a negative logical product of the output signals of the NAND circuits 528 and 532. The NAND circuit 532 has two inputs thereof connected to the output of the NAND circuit 530 and the output signal V_POR of the power-on reset circuit. The NAND circuit 532 calculates and outputs a negative logical product of the output signal of the NAND circuit 530 and the output signal V_POR of the power-on reset circuit. The signal output by the NAND circuit 532 is the signal output by the reset priority flip-flop 524.

The n-type MOSFET 534 has a source connected to a power supply that has a smaller potential than Vdd, for example, grounded, and a gate connected to the output of the reset priority flip-flop 524. The n-type MOSFET 534 allows a current to flow from the drain thereof into the source thereof if the voltage of a signal input into the gate thereof exceeds a threshold voltage thereof. The capacitor C2 has two electrodes, one of which is connected to the output of the output circuit 46 and the other of which is connected to the drain of the n-type MOSFET 534.

Next, the operation of the data output buffer circuit 26 according to the sixth embodiment will be described. At first, in the circuit illustrated in FIG. 36, the EXOR circuit 520 receives input of the input and the output of the output circuit 46. Since the output circuit 46 is configured with an inverter circuit, the EXOR circuit 520 typically outputs a high level signal. However, if the output of the output circuit 46 does not follow a change in the input thereof when the input signal of the output circuit 46 transitions from the low level to the high level or from the high level to the low level, both of the inputs of the EXOR circuit 520 receive high level signals or low level signals, and in this case, the EXOR circuit 520 outputs a low level signal. Then, the signal output by the EXOR circuit 520 transitions to the high level when the signal output by the output circuit 46 becomes the inverse of the signal input into the output circuit 46.

Next, the signal output by the EXOR circuit 520 is input into the low-pass filter 522. As above described, the EXOR circuit 520 may temporarily output a low level signal, that is, a low level pulse signal. If the pulse width of this low level pulse signal is small, the pulse signal is a high frequency signal and thus cannot pass the low-pass filter 522. Meanwhile, if the pulse width of the pulse signal output by the EXOR circuit 520 is sufficiently large, the pulse signal includes low frequency components and thus passes the low-pass filter 522 and is output to the inverter circuit 526.

Figure 37A:
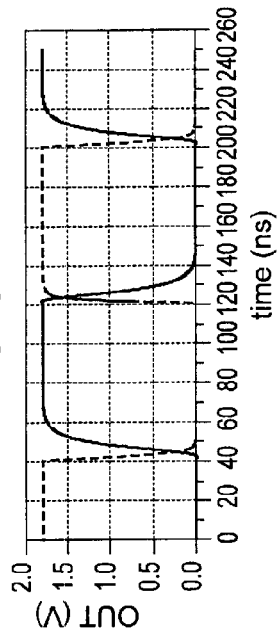
FIGS. 37A to 37F are graphs illustrating a waveform of an output signal and the like in the sixth embodiment.
Figure 37B:
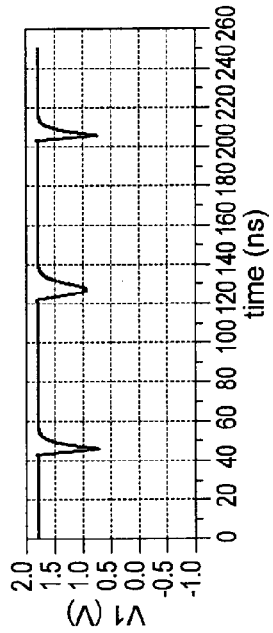
Figure 37C:
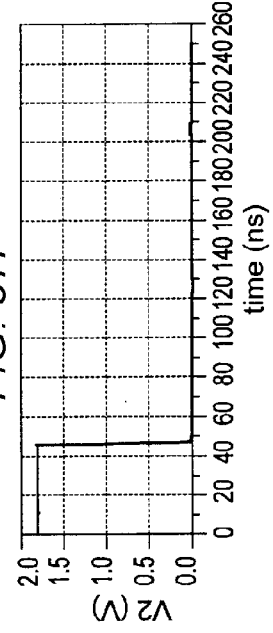
Figure 37D:
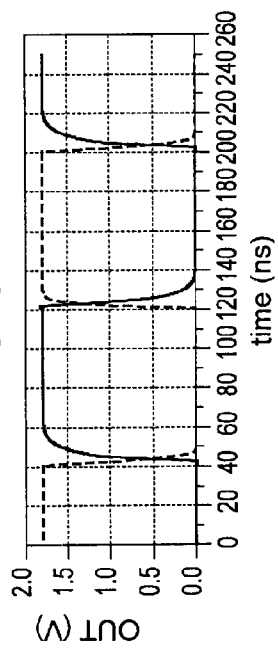
Figure 37E:
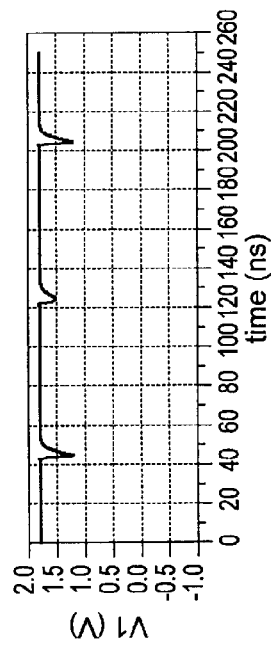
Figure 37F:
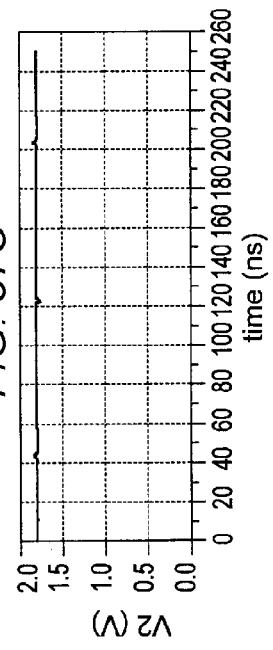

FIGS. 37A to 37C are diagrams illustrating the output waveform and the like of the data output buffer circuit 26 in a case of power supply voltage Vdd=1.8 V and load capacitance CL=0 pF, and FIGS. 37D to 37F are diagrams illustrating the output waveform of the data output buffer circuit 26 in a case of power supply voltage Vdd=1.8 V and load capacitance CL=50 pF. FIG. 37B is a graph illustrating the voltage of the output signal of the low-pass filter 522 in a case where the pulse signal has a small pulse width. As illustrated in FIG. 37B, in this case, the low-pass filter 522 is in a state that barely allows passage of the voltage V1. Meanwhile, FIG. 37E is a diagram illustrating the voltage V1 of the output signal of the low-pass filter 522 in a case where the pulse signal includes a signal of a pulse width within a passband of the low-pass filter 522. As illustrated in FIG. 37E, in this case, the low-pass filter 522 is in a state that allows passage of the input pulse signal to a certain level.

Next, the effect of the reset priority flip-flop 524 will be described. First, V_POR is a low level signal at the point in time when the power supply Vdd of the high frequency switch 1 is turned ON. Thus, in the initial state, the reset priority flip-flop 524 outputs a high level signal. If V_POR is changed to a high level signal, the input signal and the output signal of the output circuit 46 are the logical inverse of each other at the timing of the change. Thus, a high level signal and a low level signal are input into the EXOR circuit 520.

The EXOR circuit 520 that receives input of a high level signal and a low level signal outputs a high level signal to the inverter circuit 526 through the low-pass filter 522. This output signal turns into a low level signal through the inverter circuit 526, and the low level signal is output to the NAND circuit 528. The NAND circuit 528 receives input of this low level output signal and the high level signal V_POR and thus outputs a high level signal. At this timing, the signal output by the NAND circuit 532 is a high level signal. Thus, both of the inputs of the NAND circuit 530 receive high level signals.

The NAND circuit 530 of which the inputs receive high level signals outputs a low level signal. As a consequence, the low level signal and the high level signal V_POR are input into the NAND circuit 532, the NAND circuit 532 outputs a high level signal, and the high level signal is input into the gate of the n-type MOSFET 534.

The n-type MOSFET 534 of which the gate receives input of the high level signal is turned ON and allows a current to flow from the drain thereof into the source thereof. In this case, as illustrated in FIG. 36, the capacitor C2 is connected in parallel with the load capacitance CL and together constitutes a grounded circuit. That is, in this case, the circuit is configured as equivalent to a circuit in which the load capacitance CL is increased by an amount corresponding to the capacitance of the capacitor C2, and the data output buffer circuit 26 in which the apparent load capacitance CL is increased by an amount corresponding to the electrostatic capacitance of the capacitor C2 is configured.

In this state, a case where the transmission serial data signal TX_DATA falls will be described. Since the same behavior is shown in a case where the transmission serial data signal TX_DATA rises, this case will not be described. In a case where the load capacitance CL is small and the output signal of the EXOR circuit 520 is extinguished by the low-pass filter 522, the signal input into the inverter circuit 526 is maintained at the high level. Thus, no change occurs from the situation above described. FIG. 37C is a graph illustrating the voltage V2 of the signal that is input into the gate of the n-type MOSFET 534 in this case. As illustrated in FIG. 37C, in this case, no significant change is seen in the voltage V2, and the ON state of the n-type MOSFET 534 is continuously maintained.

The rise time of the signal output by the output circuit 46 is increased if the apparent load capacitance CL is increased by an amount corresponding to the electrostatic capacitance of the capacitor C2. As a consequence, the rise time Tr of the signal output by the data output buffer circuit 26 is also increased. FIG. 37A is a graph illustrating the states of the input signal and the output signal of the data output buffer circuit 26 in this case. A broken line illustrates the input signal, and a solid line illustrates the output signal. As illustrated in FIG. 37A, the rise time Tr and the fall time Tf of the output signal are increased compared with the rise time and the fall time of the input signal.

A case where the load capacitance CL is large and the output signal of the EXOR circuit 520 is not extinguished by the low-pass filter 522 will be described. Non-extinction of the output signal of the EXOR circuit 520 is determined by whether the output signal exceeds a threshold of the inverter circuit 526 for identification of the low level and the high level. In this case, the low level and the high level are identified by whether the output signal exceeds the half value of Vdd (=0.9 V).

In this case, the signal output by the low-pass filter 522 temporarily transitions to a low level signal as in the graph illustrated in FIG. 37E. The inverter circuit 526 into which a low level signal is input logically inverts this signal and outputs the inverted signal. The NAND circuit 528 receives input of this high level output signal and the high level signal V_POR and thus outputs a low level signal. Since the signal output by the NAND circuit 532 is a high level signal, a low level signal and a high level signal are input into the NAND circuit 530, and the NAND circuit 530 outputs a high level signal. Then, both of the inputs of the NAND circuit 532 receive high level signals, and the NAND circuit 532 outputs a low level signal.

One of the inputs of the NAND circuit 530 transitions to the low level after the signal of the NAND circuit 532 changes from the high level to the low level. Thus, the NAND circuit 530 continues outputting a high level signal. Since both of the inputs of the NAND circuit 532 receive high level signals as long as V_POR is at the high level, the NAND circuit 532 outputs a low level signal. That is, once the output of the NAND circuit 532 changes to the low level, the reset priority flip-flop 524 continues outputting a low level signal while V_POR is at the high level. FIG. 37F is a diagram illustrating this state.

As a consequence, if the output of the reset priority flip-flop 524 transitions to the low level, a low level signal is input into the gate of the n-type MOSFET 534, and the n-type MOSFET 534 is turned OFF. That is, the capacitor C2 is in an opened state and does not contribute to the load capacitance CL. FIG. 37D is a graph illustrating the waveforms of the input signal and the output signal in this state. As in FIG. 37A, a broken line illustrates the input signal, and a solid line illustrates the output signal. As illustrated in FIG. 37D, in this case, a significant different is not seen between the rise time and the fall time of the input signal and the rise time and the fall time of the output signal.

Figure 38A:
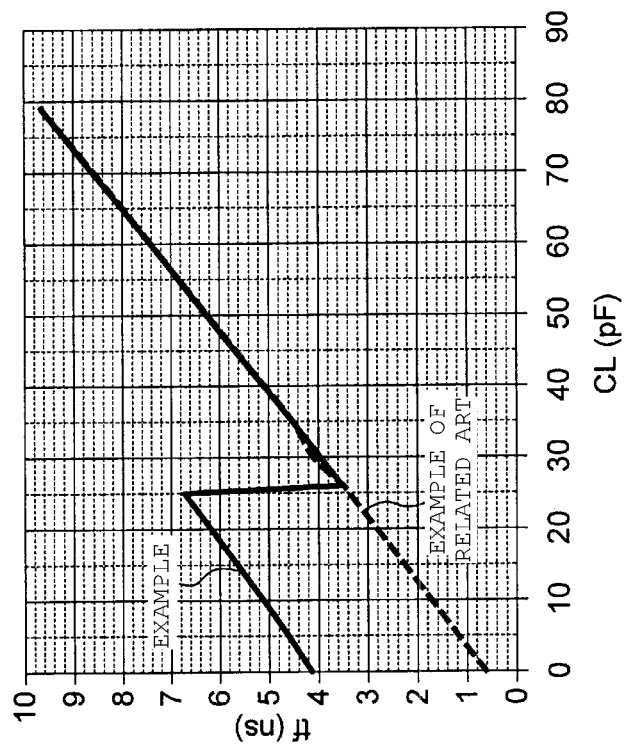
FIGS. 38A and 38B are graphs illustrating a relationship between a rise time and the like of an output signal and a load capacitance in the sixth embodiment.
Figure 38B:
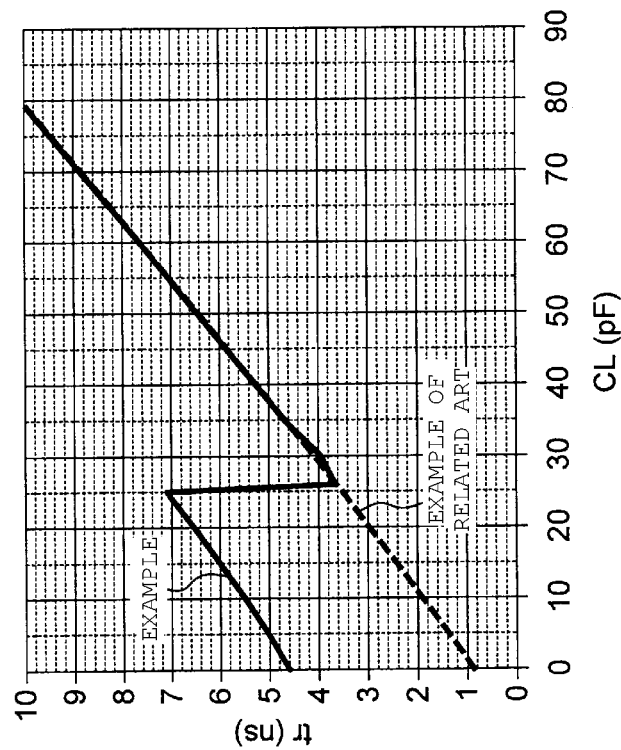

FIG. 38A and FIG. 38B are diagrams illustrating a relationship between the load capacitance CL and the rise time Tr and the fall time Tf of the data output buffer circuit 26 in the sixth embodiment. As illustrated in FIG. 38A, the rise time Tr is approximately linearly increased following a change of the load capacitance CL from a small value to a large value in the example of the related art. Meanwhile, in the data output buffer circuit 26 according to the sixth embodiment, while the rise time Tr is linearly increased between 0 pF and 25 pF of the load capacitance CL, the rise time Tr is decreased to approximately the same value as the rise time Tr in the example of the related art at 26 pF of the load capacitance CL and then has approximately the same relationship as the rise time Tr in the example of the related art. The same applies to the fall time Tf as illustrated in FIG. 38B.

According to the sixth embodiment heretofore described, adding the additional circuit 52 into the output circuit 46 allows an increase in the rise time Tr and the fall time Tf thereof in a case where the rise time Tr and the fall time Tf of the output signal are too small (short). Accordingly, even if lower limit values are placed on the allowable values of the rise time Tr and the fall time Tf of the output circuit, an excessive decrease in the rise time Tr and the fall time Tf is suppressed by appropriately setting a delay time and the like, and the same circuit can be used in a certain range of the load capacitance CL.

In a case where, for example, the lower limit values of the allowable values of the rise time Tr and the fall time Tf are 3.5 ns, the allowable range of the load capacitance CL is from 26 pF to 79 pF in the example of the related art, while the allowable range of the load capacitance CL is increased to the range from 0 pF to 79 pF if the data output buffer circuit 26 according to the sixth embodiment is used.

The data output buffer circuit 26 that corresponds to the semiconductor integrated circuits in all of the above embodiments can be used as a high frequency semiconductor switch, furthermore, as an output buffer that is incorporated into a high frequency signal switch (high frequency signal antenna switch) such as a semiconductor integrated circuit incorporated into a device represented by a mobile phone.

While various examples are illustrated above, appropriate examples can be selected from the above embodiments according to the allowable range of the rise time Tr and the like and the assumed range of the load capacitance CL, and the parameters of the circuit elements constituting each semiconductor integrated circuit can also be appropriately set according to the purpose thereof. Furthermore, a person who mounts a circuit can select which embodiment is to be used to a possible extent, considering the size of the area in which the circuit can be installed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An integrated circuit, comprising:
   a drive circuit including a first inverter circuit having a first MOSFET of a first conductivity type and a second MOSFET of a second conductivity type, drains of the first and second MOSFETS being connected to each other; and
   an output circuit including a third MOSFET of the second conductivity type having a gate connected to the drains of the first and second MOSFETs, and a capacitor connected between the gate of the third MOSFET and a drain of the third MOSFET and having a capacitance greater than 0.5 pF and less than or equal to 3.0 pF, wherein
   a gate width of the first MOSFET divided by a gate width of the third MOSFET is less than 1/100, and
   the output circuit is configured to output a transmission signal from the drain of the third MOSFET.

2. The integrated circuit according to claim 1, wherein
   the drive circuit further includes a second inverter circuit, and
   the output circuit further includes a fourth MOSFET of the first conductivity type having a gate connected to an output of the second inverter circuit and a drain connected to the drain of the third MOSFET.

3. The integrated circuit according to claim 2, further comprising:
an output control circuit connected to the drive circuit and configured to cause the output circuit to operate as a tristate buffer.

4. The integrated circuit according to claim 1, further comprising:
a supplemental circuit connected between an input node and an output node of the first inverter circuit and configured to output a supplemental signal to the gate of the third MOSFET according to a predetermined processing on an input signal input to the input node of the first inverter circuit.

5. The integrated circuit according to claim 4, wherein the supplemental circuit is configured to apply a voltage to the gate of the third MOSFET after a predetermined time elapses from an initial application of a voltage to the gate of the third MOSFET from the output node of the first inverter circuit according to the input signal.

6. The integrated circuit according to claim 5, wherein the supplemental circuit includes a fifth MOSFET of the first conductivity type having a terminal connected to the gate of the third MOSFET.

7. The integrated circuit according to claim 6, wherein the supplemental circuit is configured to output a high level signal during a second predetermined time period after a first predetermined time period elapses after the input signal supplied to the input node of the first inverter circuit transitions from a high level to a low level.

8. The integrated circuit according to claim 7, wherein the supplemental circuit further includes:
a first delay circuit configured to delay the input signal received at the input node of the first inverter circuit by the second predetermined time and logically invert the input signal to output a first delayed signal,
a negative logical sum circuit configured to calculate a negative logical sum of the input signal received at the input node of the first inverter circuit and the first delayed signal output from the first delay circuit and output a negative logical sum signal, and
a second delay circuit configured to delay the negative logical sum signal output from the negative logical sum circuit by the first predetermined time and logically invert the negative logical sum signal to output a second delayed signal that is input to a gate of the fifth MOSFET.

9. The integrated circuit according to claim 6, wherein the supplemental circuit is configured to output a low level signal during a second predetermined time after a first predetermined time elapses from transition of the input signal supplied to the input node of the first inverter circuit from a low level to a high level.

10. The integrated circuit according to claim 9, wherein the supplemental circuit further includes:
a first delay circuit configured to delay the input signal received at the input node of the first inverter circuit by the second predetermined time and logically inverts the input signal to output a first delayed signal,
a logical product circuit configured to calculate a logical product of the input signal received at the input node of the first inverter circuit and the first delayed signal from the first delay circuit to output a logical product signal, and
a second delay circuit configured to delay the logical product signal output from the logical product circuit by the first predetermined time and output a second delayed signal to a gate of the fifth MOSFET.

11. A high frequency antenna switch, comprising:
a switch core circuit configured to switch connections between an antenna and a plurality of input/output terminals; and
a control circuit configured to control the switch core circuit to switch connections between the antenna and the plurality of input/output terminals, the control circuit including:
a drive circuit including a first inverter circuit having a first MOSFET of a first conductivity type and a second MOSFET of a second conductivity type, drains of the first and second MOSFETS being connected to each other; and
an output circuit including a third MOSFET of the second conductivity type having a gate connected to the drains of the first and second MOSFETs, and a capacitor connected between the gate of the third MOSFET and a drain of the third MOSFET and having a capacitance greater than 0.5 pF and less than or equal to 3.0 pF, wherein
a gate width of the first MOSFET divided by a gate width of the third MOSFET is less than 1/100, and
the output circuit is configured to output a transmission signal from the drain of the third MOSFET.

12. The high frequency antenna switch according to claim 11, wherein
the drive circuit further includes a second inverter circuit, and
the output circuit further includes a fourth MOSFET of the first conductivity type having a gate connected to an output of the second inverter circuit and a drain connected to the drain of the third MOSFET.

13. The high frequency antenna switch according to claim 11, further comprising:
a supplemental circuit connected between an input node and an output node of the first inverter circuit and configured to output a supplemental signal to the gate of the third MOSFET according to a predetermined processing on an input signal input to the input node of the first inverter circuit.

14. The high frequency antenna switch according to claim 13, wherein the supplemental circuit is configured to apply a voltage to the gate of the third MOSFET after a predetermined time elapses from an initial application of a voltage to the gate of the third MOSFET from the output node of the first inverter circuit according to the input signal.

15. The high frequency antenna switch according to claim 13, wherein the supplemental circuit is configured to output a low level signal during a second predetermined time after a first predetermined time elapses from transition of the input signal supplied to the input node of the first inverter circuit from a low level to a high level.

16. An RF switching device, comprising:
an antenna;
a plurality on input/output terminals connectable to the antenna;
a switch core circuit configured to switch connections between the antenna and the plurality of input/output terminals; and
a control circuit configured to control the switch core circuit to switch connections between the antenna and the plurality of input/output terminals, the control circuit having a data output buffer circuit that includes:
a drive circuit including a first inverter circuit having a first MOSFET of a first conductivity type and a second MOSFET of a second conductivity type, drains of the first and second MOSFETS being connected to each other; and an output circuit including a third MOSFET of the second conductivity type having a gate connected to the drains of the first and second MOSFETs, and a capacitor connected between the gate of the third MOSFET and a drain of the third MOSFET and having a capacitance greater than 0.5 pF and less than or equal to 3.0 pF, wherein a gate width of the first MOSFET divided by a gate width of the third MOSFET is less than 1/100, and the output circuit is configured to output a transmission signal from the drain of the third MOSFET.

17. The RF switching device according to claim 16, wherein the switching core circuit is a single pole n throw type, where n is greater than 3.

18. The RF switching device according to claim 16, wherein the data output buffer circuit is configured to operate as a tristate buffer and use bidirectional communication to output a serial data signal.

19. The RF switching device according to claim 16, the control circuit further including:

a clock input buffer configured to buffer a clock signal received at a clock signal input terminal;

a data input buffer configured to buffer a data signal;

an internal logic circuit configured to convert a serial data signal into a parallel data signal in synchronization with the clock signal and store components of the serial data signal in a register and output an enable signal and the serial data signal to the data output buffer in response to an external request signal.

20. The RF switching device according to claim 16, further comprising:

a supplemental circuit connected between an input node and an output node of the first inverter circuit and configured to output a supplemental signal to the gate of the third MOSFET according to a predetermined processing on an input signal input to the input node of the first inverter circuit.

\* \* \* \* \*